`US009607996B2`

(12) United States Patent
Katoh et al.

(10) Patent No.: US 9,607,996 B2
(45) Date of Patent: Mar. 28, 2017

(54) SEMICONDUCTOR DEVICE

(71) Applicant: Sharp Kabushiki Kaisha, Osaka-shi, Osaka (JP)

(72) Inventors: Sumio Katoh, Osaka (JP); Naoki Ueda, Osaka (JP)

(73) Assignee: Sharp Kabushiki Kaisha, Sakai (JP)

( * ) Notice: Subject to any disclaimer, the term of this patent is extended or adjusted under 35 U.S.C. 154(b) by 0 days.

(21) Appl. No.: 15/037,077

(22) PCT Filed: Aug. 15, 2014

(86) PCT No.: PCT/JP2014/071476
§ 371 (c)(1),
(2) Date: May 17, 2016

(87) PCT Pub. No.: WO2015/072196
PCT Pub. Date: May 21, 2015

(65) Prior Publication Data
US 2016/0293613 A1     Oct. 6, 2016

(30) Foreign Application Priority Data

Nov. 18, 2013   (JP) ................................ 2013-237885

(51) Int. Cl.
*H01L 29/10*     (2006.01)
*H01L 27/112*    (2006.01)
(Continued)

(52) U.S. Cl.
CPC ...... *H01L 27/11206* (2013.01); *G02F 1/1368* (2013.01); *G09G 3/3655* (2013.01);
(Continued)

(58) Field of Classification Search
CPC .......... H01L 29/7869; H01L 29/78678; H01L 27/1251
(Continued)

(56) References Cited

U.S. PATENT DOCUMENTS

| 6,775,171 B2 | 8/2004 | Novosel et al. |
| 2008/0211024 A1 | 9/2008 | Kato et al. |

(Continued)

FOREIGN PATENT DOCUMENTS

| JP | 11-97556 A | 4/1999 |
| JP | 2010-123748 A | 6/2010 |

(Continued)

*Primary Examiner* — David Vu
*Assistant Examiner* — Brandon Fox
(74) *Attorney, Agent, or Firm* — Keating & Bennett, LLP

(57) ABSTRACT

A semiconductor device includes a memory transistor (10A) which is capable of being irreversibly changed from a semiconductor state where drain current Ids depends on gate voltage Vg to a resistor state where drain current Ids does not depend on gate voltage Vg. The memory transistor (10A) includes a gate electrode (3), a metal oxide layer (7), a gate insulating film (5), and source and drain electrodes. The drain electrode (9d) has a multilayer structure which includes a first drain metal layer (9d1) and a second drain metal layer (9d2), the first drain metal layer (9d1) being made of a first metal whose melting point is not less than 1200° C., the second drain metal layer (9d2) being made of a second metal whose melting point is lower than that of the first metal. Part P of the drain electrode 9d extends over both the metal oxide layer (7) and the gate electrode (3) when viewed in a direction normal to a surface of the substrate. The part (P) of the drain electrode (9d) includes the first drain metal layer (9d1) and does not include the second drain metal layer (9d2).

16 Claims, 33 Drawing Sheets

(51) Int. Cl.
*H01L 27/12* (2006.01)
*H01L 29/786* (2006.01)
*G02F 1/1368* (2006.01)
*H01L 27/10* (2006.01)
*G09G 3/36* (2006.01)
*H01L 29/417* (2006.01)

(52) U.S. Cl.
CPC ........ *H01L 27/101* (2013.01); *H01L 27/1225* (2013.01); *H01L 27/1251* (2013.01); *H01L 29/41733* (2013.01); *H01L 29/7869* (2013.01); *H01L 29/78678* (2013.01); *G09G 2300/0426* (2013.01); *G09G 2300/08* (2013.01); *G09G 2300/0842* (2013.01)

(58) Field of Classification Search
USPC .......................................................... 257/43
See application file for complete search history.

(56) References Cited

U.S. PATENT DOCUMENTS

| | | |
|---|---|---|
| 2010/0099216 A1 | 4/2010 | Suzawa et al. |
| 2010/0127266 A1* | 5/2010 | Saito .................. H01L 27/1225 257/59 |
| 2012/0138922 A1 | 6/2012 | Yamazaki et al. |
| 2012/0175610 A1* | 7/2012 | Yamazaki .......... H01L 29/7869 257/43 |
| 2014/0334227 A1 | 11/2014 | Ueda |
| 2015/0206977 A1 | 7/2015 | Katoh et al. |
| 2015/0243668 A1 | 8/2015 | Ueda et al. |

FOREIGN PATENT DOCUMENTS

| | | |
|---|---|---|
| JP | 2010-123923 A | 6/2010 |
| JP | 2011-49593 A | 3/2011 |
| JP | 2012-134475 A | 7/2012 |
| WO | 2013/080784 A1 | 6/2013 |

* cited by examiner (a)

(b)

(c)

(a)

(b)

(c)

(a)

(b)

(a)

(b)

(a)

(b)

(c)

(a)

(b)

(c)

(a)

(b)

(c)

SEMICONDUCTOR DEVICE

TECHNICAL FIELD

The present invention relates to a semiconductor device which includes a memory transistor.

BACKGROUND ART

Using an element which has a transistor structure (hereinafter, referred to as "memory transistor") as a memory element which can be used as a ROM (read only memory) has been conventionally proposed.

For example, Patent Document 1 discloses a nonvolatile memory transistor which has a MOS transistor structure. In this memory transistor, a high electric field is applied to a gate insulating film so as to cause a dielectric breakdown, whereby writing is realized. Patent Document 2 discloses a memory transistor which utilizes a variation in threshold voltage which can be caused by application of a predetermined writing voltage to a gate.

On the other hand, Patent Document 3 of the present applicant proposes a novel nonvolatile memory transistor which is capable of reducing the power consumption as compared with conventional nonvolatile memory transistors. This memory transistor uses a metal oxide semiconductor in the active layer (channel) and can irreversibly change to a resistor state which exhibits an ohmic resistance characteristic due to Joule heat produced by the drain current, irrespective of the gate voltage. Using such a memory transistor enables to make a voltage for writing lower than the voltages in Patent Documents 1 and 2. Note that, in this specification, the operation of changing an oxide semiconductor of this memory transistor to a resistor state is referred to as "writing". In this memory transistor, the metal oxide semiconductor is a resistor after writing, and therefore, the memory transistor does not work as a transistor. However, in this specification, it is referred to as "memory transistor" even after transition to the resistor. Likewise, even after transition to the resistor, terms such as gate electrode, source electrode, drain electrode, active layer, channel electrode, etc., which are constituents of a transistor structure are used. Patent Document 3 discloses forming a memory transistor in an active matrix substrate of a liquid crystal display device, for example.

CITATION LIST

Patent Literature

Patent Document 1: Specification of U.S. Pat. No. 6,775,171
Patent Document 2: Japanese Laid-Open Patent Publication No. 11-97556
Patent Document 3: WO 2013/080784

SUMMARY OF INVENTION

Technical Problem

The present inventors conducted research on the configuration of a memory transistor which has an active layer including a metal oxide from various viewpoints. As a result, the present inventors found that, when the writing duration of the memory transistor is further shortened in a conventional electrode configuration, there is a probability that high reliability is not achieved. This problem will be described in detail later.

An object of an embodiment of the present invention is to improve the reliability of a semiconductor device which includes a memory transistor as compared with conventional devices.

Solution to Problem

A semiconductor device of an embodiment of the present invention includes a substrate and at least one memory transistor supported on the substrate, wherein the at least one memory transistor is a memory transistor which is capable of being irreversibly changed from a semiconductor state where a drain current Ids depends on a gate voltage Vg to a resistor state where the drain current Ids does not depend on the gate voltage Vg, the at least one memory transistor includes a gate electrode, a metal oxide layer, a gate insulating film provided between the gate electrode and the metal oxide layer, and a source electrode and a drain electrode which are electrically connected with the metal oxide layer, the drain electrode has a multilayer structure which includes a first drain metal layer and a second drain metal layer, the first drain metal layer being made of a first metal whose melting point is not less than 1200° C., the second drain metal layer being made of a second metal whose melting point is lower than that of the first metal, part of the drain electrode extends over both the metal oxide layer and the gate electrode when viewed in a direction normal to a surface of the substrate, and the part of the drain electrode includes the first drain metal layer and does not include the second drain metal layer.

In one embodiment, the source electrode has a multilayer structure which includes a first source metal layer and a second source metal layer, the first source metal layer including the first metal, the second source metal layer including the second metal, and a part of the source electrode extends over both the metal oxide layer and the gate electrode when viewed in a direction normal to a surface of the substrate, and the part of the source electrode includes the first source metal layer and the second source metal layer.

In one embodiment, the source electrode has a multilayer structure which includes a first source metal layer and a second source metal layer, the first source metal layer including the first metal, the second source metal layer including the second metal, and a part of the source electrode extends over both the metal oxide layer and the gate electrode when viewed in a direction normal to a surface of the substrate, and the part of the source electrode includes the first source metal layer and does not include the second source metal layer.

In one embodiment, the first drain metal layer is in direct contact with an upper surface of the metal oxide layer.

In one embodiment, the first drain metal layer is in direct contact with a lower surface of the metal oxide layer.

In one embodiment, the gate electrode is located on the substrate side of the metal oxide layer.

In one embodiment, the first drain metal layer and the second drain metal layer are stacked in this order from the substrate side.

In one embodiment, when viewed in a direction normal to the substrate, a part of the metal oxide layer which extends over the gate electrode with the gate insulating film interposed therebetween and which is present between the source electrode and the drain electrode has a U-shape.

In one embodiment, the first metal is a metal selected from the group consisting of W, Ta, Ti, Mo and Cr or an alloy thereof.

In one embodiment, the melting point of the second metal is less than 1200° C.

In one embodiment, the second metal is a metal selected from the group consisting of Al and Cu.

In one embodiment, the metal oxide layer includes In, Ga and Zn.

In one embodiment, the metal oxide layer includes a crystalline portion.

In one embodiment, the at least one memory transistor is a plurality of memory transistors, the plurality of memory transistors including a memory transistor ST which is in the semiconductor state and a memory transistor RT which is in the resistor state.

In one embodiment, the semiconductor device further includes another transistor supported on the substrate, the another transistor including a semiconductor layer which includes a metal oxide, wherein the semiconductor layer of the another transistor and the metal oxide layer of the memory transistor are formed by a same oxide semiconductor film, a source electrode and a drain electrode of the another transistor has a multilayer structure which includes a first metal layer and a second metal layer, the first metal layer including the first metal, the second metal layer including the second metal, and a part of the drain electrode of the another transistor extends over both a gate electrode of the another transistor and the metal oxide layer when viewed in a direction normal to a surface of the substrate, and the part of the drain electrode of the another transistor includes the first metal layer and the second metal layer.

In one embodiment, the semiconductor device is an active matrix substrate, the active matrix substrate including a display region including a plurality of pixel electrodes and pixel transistors electrically connected with corresponding ones of the plurality of pixel electrodes, and a peripheral region provided in a region which is exclusive of the display region, the peripheral region including a plurality of circuits, the plurality of circuits includes a memory circuit which includes the at least one memory transistor, and the pixel transistor and at least one of a plurality of transistors which are constituents of the plurality of circuits in the peripheral region include a semiconductor layer formed using a same oxide semiconductor film as that of the metal oxide layer of the at least one memory transistor.

Advantageous Effects of Invention

According to one embodiment of the present invention, in a semiconductor device including a memory transistor which includes a metal oxide layer as the active layer and which utilizes transition from a semiconductor state to a resistor state, melting of the drain electrode due to heat produced during writing in the memory transistor can be suppressed. Therefore, damage to and destruction of the memory transistor due to heat produced during writing can be suppressed, and thus, the reliability of the semiconductor device can be improved.

DESCRIPTION OF EMBODIMENTS

Figure 1:
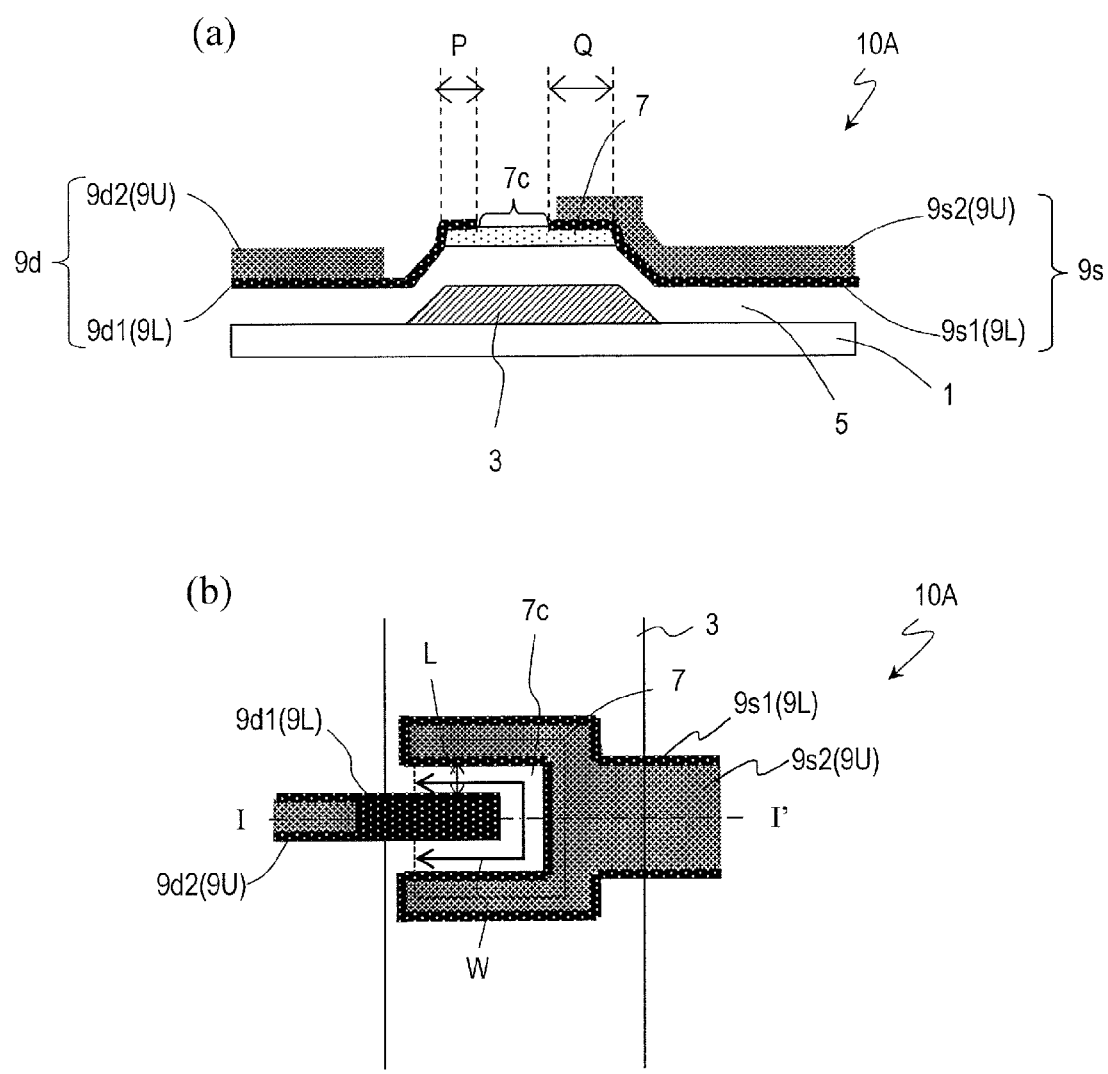
FIGS. 1(a) and (b) are a cross-sectional view and plan view of a memory transistor 10A in a semiconductor device of the first embodiment.

Firstly, knowledge about the configuration of a memory transistor which utilizes transition from a semiconductor state to a resistor state (Patent Document 3), which was found by the present inventors through research, is described.

Writing in the above-described memory transistor is realized by decreasing the resistance of the metal oxide layer, which is the active layer of the memory transistor, by utilization of Joule heat produced by the drain current (writing current). During writing, heat is produced in the metal oxide layer of the memory transistor.

When the amount of heat produced in the metal oxide layer during writing (the amount of produced heat) is further increased, the writing duration can be further shortened. The amount of produced heat can be increased by supplying greater electric power to the memory transistor. However, if the amount of produced heat is increased, the following problems will arise.

In an n-channel type memory transistor, the amount of heat produced during writing is large particularly in part of the metal oxide layer (channel region) which is near the drain electrode. Part of the metal oxide layer on the drain side locally reaches a high temperature of, for example, not less than 1000° C. in some cases. Therefore, in the case where the memory transistor has a bottom gate configuration, if a metal layer which is made of a metal whose melting point is relatively low, such as aluminum and copper, is provided as the drain electrode on the upper surface of the metal oxide layer, there is a probability that the metal melts due to heat produced during writing. As a result, the conduction between the drain electrode and the metal oxide layer fails, so that damage such as disconnection of the current path running between the source and the drain via the metal oxide layer (failure of the electric current between the source and the drain) occurs, and the memory transistor can be destroyed in some cases. Therefore, there is a probability that it is difficult to normally perform a reading operation from the memory transistor after writing.

On the other hand, it is conventionally known that, in a thin film transistor in which the active layer is realized by a metal oxide layer (oxide semiconductor TFT), if the metal oxide layer and an aluminum (Al) layer or copper (Cu) layer are in direct contact with each other, the contact resistance between these layers increases, or Al or Cu diffuses in the metal oxide layer so that the TFT characteristics deteriorate. To solve such problems, forming a Ti layer as the barrier metal layer between the source and drain electrodes which are made of Al or Cu and the metal oxide layer is proposed (for example, Japanese Laid-Open Patent Publication No. 2010-123923). Also, using a multilayer film in which a Ti film and an Al alloy film are stacked in this order form the metal oxide layer side as a metal wire film which includes the source and the drain is proposed (for example, Japanese Laid-Open Patent Publication No. 2010-123748). When using the electrodes or wires proposed in these patent documents, a metal whose melting point is relatively low, such as Al and Cu, and the metal oxide layer are not in direct contact with each other. However, the present inventors conducted research and verified that, so long as a metal whose melting point is relatively low is present above the metal oxide layer, there is a probability that the metal melts during writing even when the metal is not in direct contact with the metal oxide layer. It was also verified that, on the contrary, even when a metal whose melting point is relatively high, such as Ti, is present above the metal oxide layer, melting of the metal due to heat produced during writing would not occur.

The present inventors found based on the above-described knowledge that the above-described problems which are attributed to heat produced during writing can be solved by forming part of the drain electrode of the memory transistor which is present above the metal oxide layer of a metal whose melting point is relatively high such that a metal whose melting point is low is not included in that part, and arrived at the present invention. Such a configuration enables to shorten the writing duration as compared with conventional devices while suppressing decrease of the reliability of the memory transistor which is attributed to heat produced during writing.

Hereinafter, embodiments of the semiconductor device of the present invention are specifically described with reference to the drawings.

First Embodiment

FIG. 1(a) is a cross-sectional view showing a memory transistor 10A in a semiconductor device of the present embodiment. FIG. 1(b) is a plan view of the memory transistor 10A. FIG. 1(a) shows a cross-sectional structure taken along line I-I' of FIG. 1(b).

The semiconductor device of the present embodiment includes a substrate 1 and a memory transistor 10A supported on the substrate 1. The memory transistor 10A is, for example, an n-channel type memory transistor.

The memory transistor 10A includes a gate electrode 3, an active layer 7 including a metal oxide (hereinafter, "metal oxide layer"), a gate insulating film 5 interposed between the gate electrode 3 and the metal oxide layer 7, and a source electrode 9s and a drain electrode 9d electrically connected with the metal oxide layer 7. When viewed in a direction normal to the substrate 1, at least part of the metal oxide layer 7 is arranged so as to extend over the gate electrode 3 with the gate insulating film 5 interposed therebetween. In the example shown in FIG. 1, the gate electrode 3 is provided on the substrate 1 side of the metal oxide layer 7 (bottom gate configuration). The source electrode 9s may be in contact with part of the metal oxide layer 7. The drain electrode 9d may be in contact with another part of the metal oxide layer 7.

Part of the metal oxide layer 7 which is in contact with (or electrically connected with) the source electrode 9s is referred to as "source contact region". Part of the metal oxide layer 7 which is in contact with (or electrically connected with) the drain electrode 9d is referred to as "drain contact region". Part of the metal oxide layer 7 which extends over the gate electrode 3 with the gate insulating film 5 interposed therebetween and which is present between the source contact region and the drain contact region when viewed in a direction normal to the substrate 1 forms a channel region 7c. In the case where the source electrode 9s and the drain electrode 9d are in contact with the upper surface of the metal oxide layer 7, part of the metal oxide layer 7 which is present between the source electrode 9s and the drain electrode 9d when viewed in a direction normal to the substrate 1 forms a channel region 7c.

The drain electrode 9d has a multilayer structure that includes a first drain metal layer 9d1 which is made of a first metal and a second drain metal layer 9d2 which is made of a second metal whose melting point is lower than that of the first metal. Being "made of the first metal (or second metal)" means including the first metal (or second metal) as a major constituent. Note that the first or second metal may be a single metal element or may be an alloy.

The first metal included in the first drain metal layer 9d1 is a metal whose melting point is not less than 1200° C., preferably not less than 1600° C. (hereinafter referred to as "first metal"). The first metal may be a single metal element or may be an alloy. The first metal used can be, for example, Ti (titanium, melting point: 1667° C.), Mo (molybdenum, melting point: 2623° C.), Cr (chromium, melting point: 1857° C.), W (tungsten, melting point: 3380° C.), Ta (tantalum, melting point: 2996° C.), or an alloy thereof. The second metal included in the second drain metal layer 9d2 is a metal whose melting point is lower than that of the first metal (hereinafter referred to as "second metal"). The melting point of the second metal is lower than 1200° C. For example, it may be not more than 700° C. The second metal used can be, for example, Al (aluminum, melting point: 660° C.) or Cu (copper, melting point: 1083° C.)

The source electrode 9s and the drain electrode 9d may be formed by a same electrically-conductive film. In the example illustrated in the drawings, the source electrode 9s and the drain electrode 9d are formed by using a multilayer film that includes a first metal film 9L which is made of the first metal and a second metal film 9U which is made of the second metal. Therefore, the source electrode 9s has a multilayer structure which includes the first metal film 9L and the second metal film 9U. Layers formed by the first metal film 9L and the second metal film 9U in the source electrode 9s are referred to as "first source metal layer 9s1" and "second source metal layer 9s2", respectively. Likewise, the drain electrode 9d has a multilayer structure that includes a first drain metal layer 9d1 which is formed by the first metal film 9L and a second drain metal layer 9d2 which is formed by the second metal film 9U.

The first metal film 9L and the second metal film 9U each only needs to be a conductor layer which mainly includes the above-described metal and can include not only a layer which is made of a single metal element but also an alloy layer, a metal nitride layer, and a metal silicide layer.

The drain electrode 9d includes a portion P which extends over both the gate electrode 3 and the metal oxide layer 7 when viewed in a direction normal to the surface of the substrate 1. The portion P of the drain electrode 9d, which extends over both the gate electrode 3 and the metal oxide layer 7, includes the first drain metal layer 9d1 (first metal film 9L) and does not include the second drain metal layer 9d2 (second metal film 9U). The above-described portion P may be formed only by the first drain metal layer 9d1 and may include a metal layer which has a high melting point other than the first drain metal layer 9d1.

The memory transistor 10A is a nonvolatile memory device which is capable of being irreversibly changed from a state where drain current Ids depends on gate voltage Vgs (referred to as "semiconductor state") to a state where drain current Ids does not depend on gate voltage Vgs (referred to as "resistor state"). Drain current Ids refers to an electric current which flows between the source electrode 9s and the drain electrode 9d (between the source and the drain) of the memory transistor 10A. Gate voltage Vgs refers to a voltage between the gate electrode 3 and the source electrode 9s (between the gate and the source) of the memory transistor 10A.

The above-described state change can be caused by, for example, applying a predetermined writing voltage Vds between the source and the drain of the memory transistor 10A which is in a semiconductor state (initial state) and applying a predetermined gate voltage between the gate and the source. Application of the writing voltage Vds causes an electric current (writing current) to flow through part of a metal oxide layer 7 in which a channel is to be formed (channel region 7c), thereby producing Joule heat. Due to this Joule heat, the resistance of the channel region 7c of the metal oxide layer 7 decreases. As a result, the memory transistor changes to a resistor state so that it does not depend on gate voltage Vgs but exhibits an ohmic resistance characteristic. Although the reasons for the decrease of the resistance of the oxide semiconductor are not yet elucidated, it is estimated that oxygen included in the oxide semiconductor diffuses out of the channel region 7c due to the Joule heat, and the number of oxygen deficiencies inside the channel region 7c increases so that carrier electrons are produced. Note that a memory transistor which is capable of such a state change is disclosed in Patent Document 3 of the present applicant and in Japanese Patent Applications Nos. 2012-137868 and 2012-231480 of the present applicant which are not yet laid open to public inspection. The entire disclosures of these are incorporated by reference in this specification.

Writing in the memory transistor 10A is realized by utilization of Joule heat produced by the writing current as described above. As previously described, the temperature of the Joule heat is particularly high at the drain side edge of the channel region 7c formed in the metal oxide layer 7. Thus, in the present embodiment, the second drain metal layer 9d2 is not provided near the drain side edge at which the temperature of the Joule heat is high. More specifically, the first drain metal layer 9d1 of the drain electrode 9d, which includes a metal whose melting point is relatively high, is arranged so as to overlap both the gate electrode 3 and the metal oxide layer 7 when viewed in a direction normal to the surface of the substrate 1, and demarcates the channel region 7c. Meanwhile, the second drain metal layer 9d2, which includes a metal whose melting point is relatively low, is not provided on the metal oxide layer 7, and therefore, melting of a metal included in the second drain metal layer 9d2 due to heat produced during writing can be suppressed. Thus, destruction and deformation of the memory transistor 10A due to melting of a metal can be suppressed.

Although in the present embodiment the entire metal oxide layer 7 extends over the gate electrode 3 when viewed in a direction normal to the surface of the substrate 1, the metal oxide layer 7 may be arranges such that at least part of the metal oxide layer 7 extends over the gate electrode 3. In such a case, the same effects as those described above can be achieved so long as the second drain metal layer 9d2 is not present on part of the metal oxide layer 7 extending over the gate electrode 3. For example, the second drain metal layer 9d2 only needs not to overlap both the metal oxide layer 7 and the gate electrode 3, and may overlap either one of the metal oxide layer 7 or the gate electrode 3, when viewed in a direction normal to the surface of the substrate 1.

Although here the drain electrode 9d has a two-layer structure which consists of the first and second drain metal layers 9d1, 9d2, the drain electrode 9d may include three or more layers including another electrically-conductive layer. The first drain metal layer 9d1 may be in contact with the upper surface of the metal oxide layer 7. In the case where, for example, a Ti or Mo layer is used as the first drain metal layer 9d1, arranging the first drain metal layer 9d1 and the metal oxide layer 7 so as to be in contact with each other enables reduction of the contact resistance. Note that another electrically-conductive layer, such as a contact layer, may be provided between the metal oxide layer 7 and the first drain metal layer 9d1.

In the case of an n-channel type memory transistor, the upstream side and the downstream side of the flow direction of drain current Ids are the drain and the source, respectively. In this specification, the "source electrode" refers to an electrode electrically connected with the source side of the active layer (herein, the metal oxide layer 7) and may be part of a wire (source wire). Typically, the "source electrode" includes not only a contact portion which is in direct contact with the source side of the active layer but also a portion which is in the vicinity of the contact portion. For example, when part of the source wire is electrically connected with the active layer, the "source electrode" includes a portion of the source wire which is present in a memory transistor formation region. Alternatively, the "source electrode" can include a portion of the source wire stretching from the contact portion which is in contact with the active layer to a portion connected to another element or another wire. Likewise, the "drain electrode" refers to an electrode which is electrically connected with the drain side of the active layer (herein, the metal oxide layer 7) and may be part of a wire. The "drain electrode" includes not only a contact portion which is in direct contact with the drain side of the active layer but also a portion which is in the vicinity of the contact portion. When part of the wire is electrically connected with the drain side of the active layer, the "drain electrode" includes a portion of that wire which is present in the memory transistor formation region. For example, the "drain electrode" can include a portion of the wire stretching from the contact portion which is in contact with the active layer to a portion connected to another element or another wire. In the present embodiment, the portion P of the drain electrode 9d has a single layer structure (or p-layer structure (n: natural number not less than 2)) which includes the first drain metal layer 9d1 and which does not include the second drain metal layer 9d2, while the other portion of the drain electrode has a two-layer structure (or (n+1) layer structure) which includes the first drain metal layer 9d1 and the second drain metal layer 9d2.

The source electrode 9s may has a portion Q which extends over both the metal oxide layer 7 and the gate electrode 3 when viewed in a direction normal to the surface of the substrate 1. The portion Q of the source electrode 9s, which extends over both the metal oxide layer 7 and the gate electrode 3, may include not only the first source metal layer 9s1 but also the second source metal layer 9s2. On the source side of the channel region 7c of the metal oxide layer 7, the amount of heat produced by the writing current is smaller than that produced on the drain side. Therefore, even when the second source metal layer 9s2 is provided near the region 7c, the second metal included in the second source metal layer 9s2 is unlikely to melt, and the heat produced during writing is unlikely to cause damage to the memory transistor 10A. In the present embodiment, the source electrode 9s and the drain electrode 9d have different configurations at the edges on the channel region 7c side, so that damage which is caused by heat produced during writing can be reduced while the merit of using a metal layer whose electric conductivity is relatively high (such as an Al layer) is maximized.

Note that, as will be described later, the portion Q of the source electrode 9s includes the first source metal layer 9s1 and does not need to include the second source metal layer 9s2. Due to this arrangement, damage which is caused by heat produced during writing can be more surely reduced.

In the example shown in the drawings, when viewed in a direction normal to the surface of the substrate 1, either one of the drain electrode 9d or the source electrode 9s (here, the source electrode 9s) has a recessed portion over the metal oxide layer 7, and the other electrode (here, the drain electrode 9d) is provided in the recessed portion of the source electrode 9s so as to be spaced away from the source electrode 9s. Accordingly, the channel region 7c which is present between the source electrode 9s and the drain electrode 9d has a U-shape. In such a case, as shown in FIG. 1(b), the width of the space which is present between the source electrode 9s and the drain electrode 9d is the channel length (the length in the channel direction) L1. In the channel region 7c, the length of a line on which the distance from the source electrode 9s is equal to the distance from the drain electrode 9d, i.e., the length of a line extending between points which bisects the spacing distance over the metal oxide layer 7 between the source electrode 9s and the drain electrode 9d, is the channel width (the length in a direction perpendicular to the channel direction) W1. Note that the planar shape of the channel region 7c of the memory transistor 10 is not limited to a U-shape but may be, for example, a rectangular shape.

The configuration of the memory transistor 10A is not limited to the bottom gate configuration but may be a top gate configuration where the gate electrode 3 is provided above the metal oxide layer 7. No matter which of these configurations the memory transistor 10A has, the above-described effects of the invention of the present application can be achieved so long as the second drain metal layer 9d2 is arranged so as not to overlap both the gate electrode 3 and the metal oxide layer 7 when viewed in a direction normal to the substrate 1.

The first drain metal layer 9d1 may be in direct contact with the metal oxide layer 7. This arrangement enables reduction of the contact resistance between the first drain metal layer 9d1 and the metal oxide layer 7. The first drain metal layer 9d1 may be in contact with the upper surface of the metal oxide layer 7 (top contact structure) or may be in contact with the lower surface of the metal oxide layer 7 (bottom contact structure).

Figure 36:
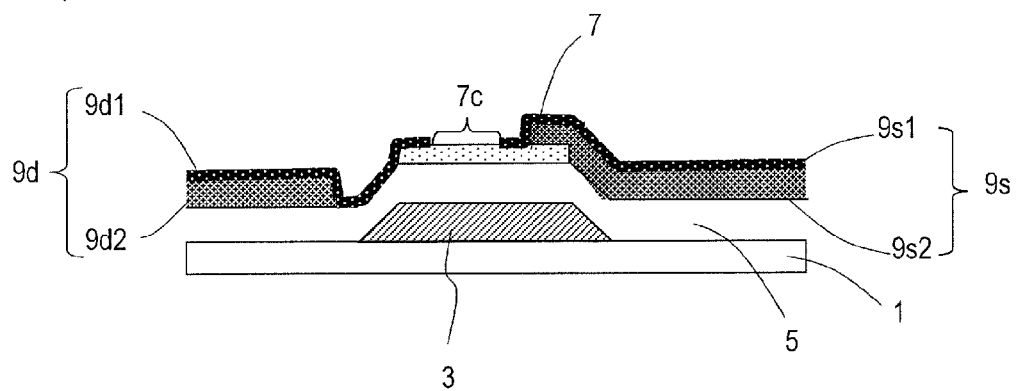
FIG. 36(*a*) to (*c*) are cross-sectional views illustrating the configuration of another semiconductor device in an embodiment of the present invention.
Figure 36:
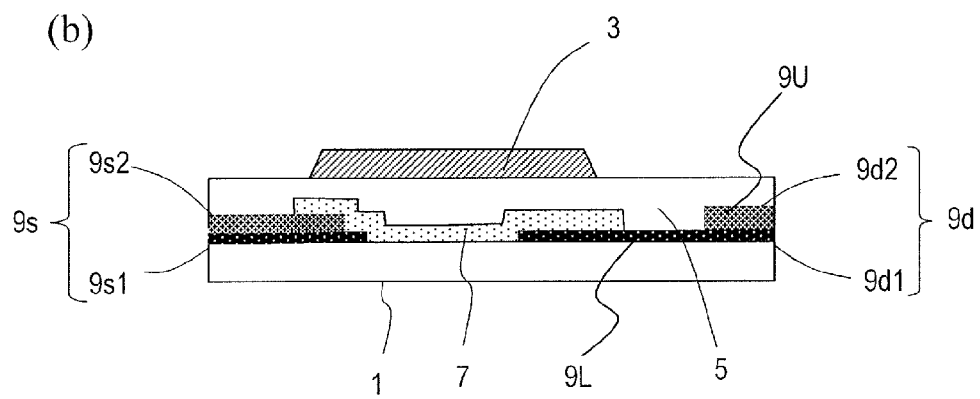
Figure 36:
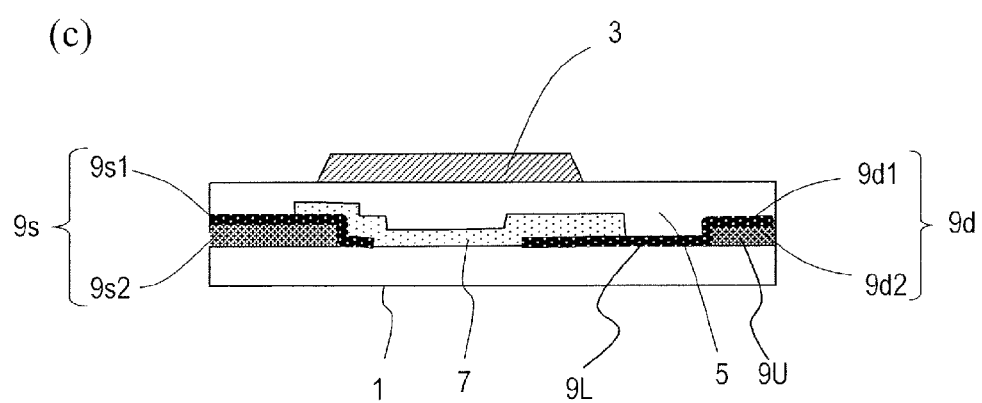

The order of stacking the first drain metal layer 9d1 (first metal film 9L) and the second drain metal layer 9d2 (second metal film 9U) is not particularly limited. In the example shown in FIG. 1, the first drain metal layer 9d1 is closer to the substrate 1 than the second drain metal layer 9d2 is. However, the first drain metal layer 9d1 may be provided on the opposite side of the substrate 1. For example, as illustrated in FIG. 36(a), the source electrode 9s and the drain electrode 9d may have a multilayer structure in which the second source metal layer 9s2 or the second drain metal layer 9d2 is the lower layer and the first source metal layer 9s1 or the first drain metal layer 9d1 (first metal film 9L) is the upper layer. Note that if the first metal film 9L is closer to the metal oxide layer 7 than the second metal film 9U is, diffusion of the second metal (particularly, Al, Cu) included in the second metal film 9U (the second drain metal layer 9d2 and the second source metal layer 9s2) into the metal oxide layer 7 can be suppressed by the first metal film 9L (the first drain metal layer 9d1 and the first source metal layer 9s1).

The semiconductor device of the present embodiment may have a plurality of memory transistors 10A. It is preferred that the plurality of memory transistors 10A each have the above-described electrode structure. In this case, a semiconductor device after a writing operation includes a memory transistor which is in a semiconductor state (memory transistor ST) and a memory transistor which is in a resistor state (memory transistor RT). In the memory transistor RT, heat produced during writing melts the metal that is a constituent of the drain electrode 9d. As a result, occurrence of damage such as disconnection of the current path running between the source and the drain via the metal oxide layer can be suppressed. Further, it is difficult to distinguish the memory transistors ST, RT only by, for example, viewing the transistors in a direction normal to the substrate 1, so that the level of security increases.

A metal oxide included in the metal oxide layer 7 is, for example, an oxide which includes In, Ga and Zn. The metal oxide layer 7 can be formed by a film which includes an In—Ga—Zn—O based semiconductor. Here, the In—Ga—Zn—O based semiconductor is a ternary oxide consisting of In (indium), Ga (gallium) and Zn (zinc). The proportion (composition ratio) of In, Ga and Zn is not particularly limited but includes, for example, In:Ga:Zn=2:2:1, In:Ga:Zn=1:1:1, and In:Ga:Zn=1:1:2. The metal oxide layer 7 of the present embodiment may be an In—Ga—Zn—O based metal oxide layer which includes In, Ga and Zn in a proportion of In:Ga:Zn=1:1:1, for example. Note that, in a memory transistor ST after writing, at least the channel region of the metal oxide layer 7 does not exhibit semiconductor characteristics although the metal oxide layer 7 of a memory transistor ST before writing is a semiconductor layer.

When the memory transistor 10A is formed using a film which includes an In—Ga—Zn—O based semiconductor, another transistor (oxide semiconductor TFT) can advantageously be formed on the same substrate as the memory transistor 10A using a same semiconductor film. Such an oxide semiconductor TFT has high mobility (20 times or more as compared with an a-Si TFT) and low current leakage (less than $1/100$ as compared with an a-Si TFT). Therefore, the power consumption of a semiconductor device can be greatly reduced.

The In—Ga—Zn—O based semiconductor may be amorphous or may include a crystalline portion. As the crystalline In—Ga—Zn—O based semiconductor, a crystalline In—Ga—Zn—O based semiconductor in which the c-axis is oriented generally perpendicular to the layer surface may be used. The crystalline structure of such an In—Ga—Zn—O based semiconductor is disclosed in, for example, Japanese Laid-Open Patent Publication No. 2012-134475. The entire disclosure of Japanese Laid-Open Patent Publication No. 2012-134475 is incorporated by reference in this specification.

A different semiconductor film in which decrease of the resistance due to Joule heat can occur may be used instead of the In—Ga—Zn—O based semiconductor. For example, a semiconductor film which includes, for example, NiO, $SnO_2$, $TiO_2$, $VO_2$, $In_2O_3$, or $SrTiO_3$ may be used. Alternatively, a Zn—O based semiconductor (ZnO), an In—Zn—O based semiconductor (IZO (registered trademark)), a Zn—Ti—O based semiconductor (ZTO), a Cd—Ge—O based semiconductor, a Cd—Pb—O based semiconductor, a CdO (cadmium oxide), a Mg—Zn—O based semiconductor, an In—Sn—Zn—O based semiconductor (e.g., $In_2O_3$—$SnO_2$—ZnO), an In—Ga—Sn—O based semiconductor, or the like, may be used. Still alternatively, a film obtained by adding various impurities to these oxide semiconductors may be used.

<Operation of Memory Transistor 10A>

The memory transistor 10A can be used in a memory circuit which is capable of storing information in a nonvolatile fashion with the semiconductor state (initial state) assigned to logical value "0" and the resistor state assigned to logical value "1", for example. Hereinafter, a configuration and an operation example of a memory circuit in which the memory transistor 10A is used are described. The memory circuit includes one or a plurality of memory cells.

Figure 2:
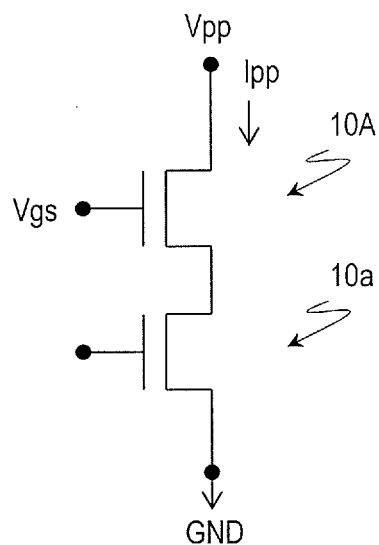
FIG. 2 A diagram illustrating a single memory cell which is a constituent of a memory circuit of the first embodiment.

FIG. 2 is a diagram illustrating a single memory cell which is a constituent of the memory circuit. The memory cell includes, for example, a memory transistor 10A and a transistor for memory cell selection ("selection transistor") 10a which is connected in series with the memory transistor 10A. The memory circuit has a configuration in which a plurality of memory cells are arranged in a matrix, for example.

The configuration of the selection transistor 10a is not particularly limited but may include an active layer which is formed by a same oxide semiconductor film as that of the metal oxide layer 7 of the memory transistor 10A. Accordingly, the memory transistor 10A and the selection transistor 10a can be manufactured simply and conveniently through a common process.

In the memory cell shown in FIG. 2, by applying a gate voltage to the selection transistor 10a such that the selection transistor 10a transitions to an ON state, a writing or reading operation in/from the memory transistor 10A is enabled.

Writing in the memory transistor 10A can be realized by applying a predetermined gate voltage Vg to the gate electrode of the memory transistor 10A while a predetermined writing voltage Vpp to the drain electrode in a period (writing duration) Tpp. During this period, the source electrode of the selection transistor 10a is kept connected to a fixed voltage (e.g., ground potential). As a result, during the period Tpp, writing current Ipp flows through the channel region of the memory transistor 10A. Joule heat produced by writing current Ipp changes the chemical composition ratio of the oxide semiconductor which forms the channel region, so that the channel region has a decreased resistance, i.e., changes into a resistor state.

Reading from the memory transistor 10A can be realized by measuring the gate voltage dependence of an electric current which flows when a predetermined voltage is applied between the source and the drain of the memory transistor 10A (reading current). Specifically, it can be readily determined from the ratio of reading current Ir during reading to current It where It is a reading current which flows through the memory transistor 10A when the memory transistor 10A is in a semiconductor state. Note that if gate voltage Vgs applied during reading is set within a predetermined voltage range (e.g., about 0.5 V or lower), the difference between reading current It and reading current Ir is large, and therefore, the state of the memory transistor 10A can be determined more easily.

EXAMPLES

Here, memory transistors 10(1), 10(2) of an inventive example and a reference example were manufactured and compared as to damage to the memory transistors due to writing.

Figure 3:
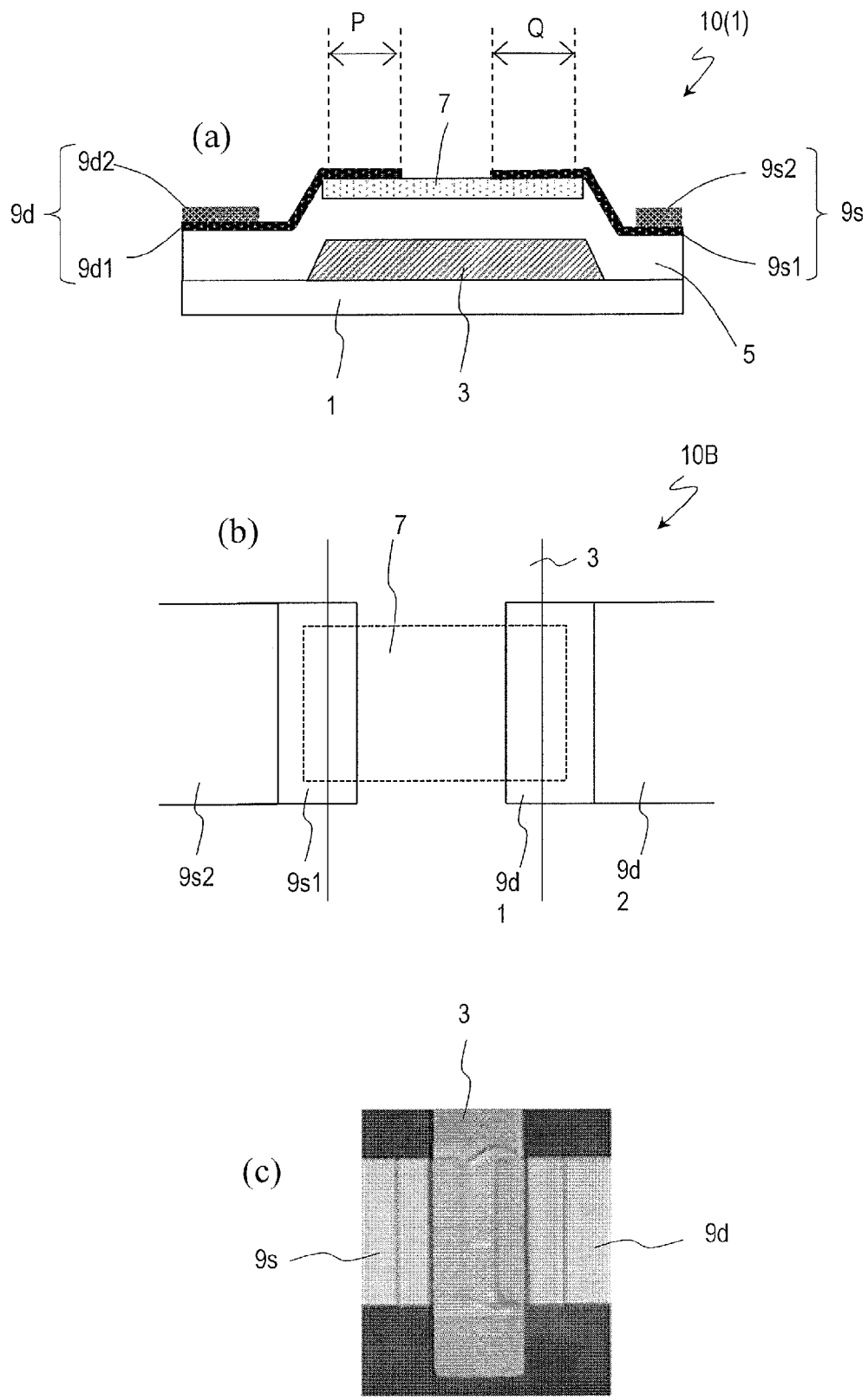
FIGS. 3(a) and (b) are a cross-sectional view and plan view of a memory transistor 10(1) of an inventive example. (c) is a top view of the memory transistor 10(1) after writing.

FIGS. 3(a) and 3(b) are a cross-sectional view and plan view of the memory transistor 10(1) of the inventive example. The memory transistor 10(1) is different from the memory transistor 10A shown in FIG. 1 in that the portion Q of the source electrode 9s which is present on the metal oxide layer 7 is formed only by the first source metal layer 9s1, and the second source metal layer 9s2 is not provided on the metal oxide layer 7. The other components are the same as those of the memory transistor 10A. In the memory transistor 10(1), a Ti layer was formed as the first drain metal layer 9d1 and the first source metal layer 9s1, an Al layer was formed as the second drain metal layer 9d2 and the second source metal layer 9s2, and an In—Ga—Zn—O based semiconductor layer was formed as the metal oxide layer 7. Channel length L of the memory transistor 10(1) was, for example, not less than 1 μm and not more than 20 μm. Channel width was not less than 2 μm and not more than 1 mm. The thickness of the metal oxide layer 7 was not less than 5 nm and not more than 500 nm.

As a reference example, a memory transistor 10(2) was manufactured which had a transistor configuration where source and drain electrodes which have a multilayer structure were applied to a conventional bottom gate-top contact type TFT.

Figure 4:
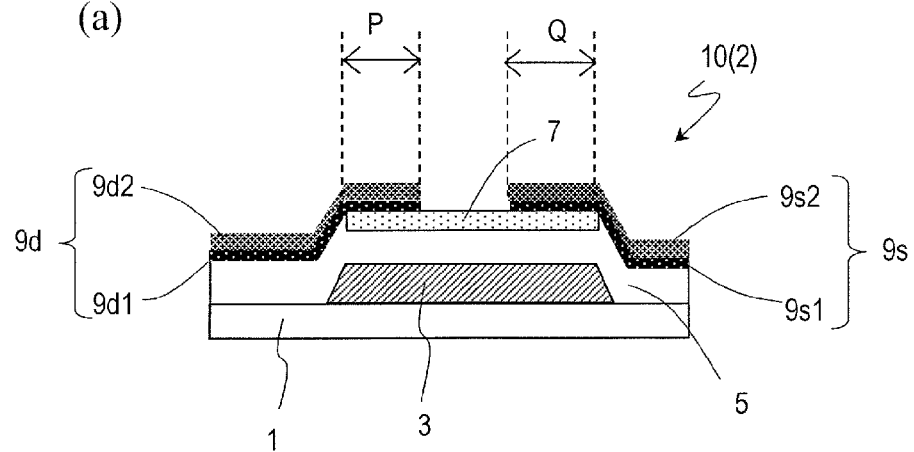
FIGS. 4(a) and (b) are a cross-sectional view and plan view of a memory transistor 10(2) of a reference example. (c) is a top view of the memory transistor 10(2) after writing.
Figure 4:
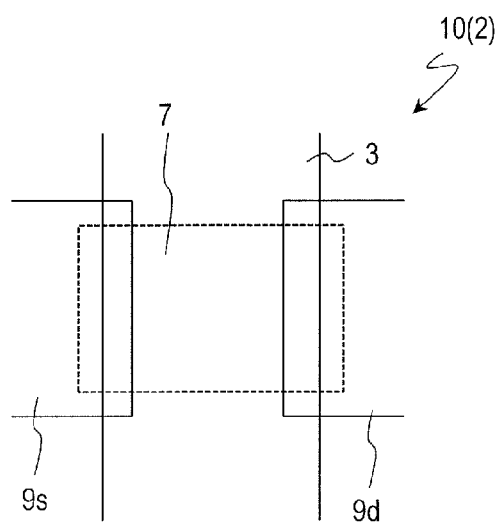
Figure 4:
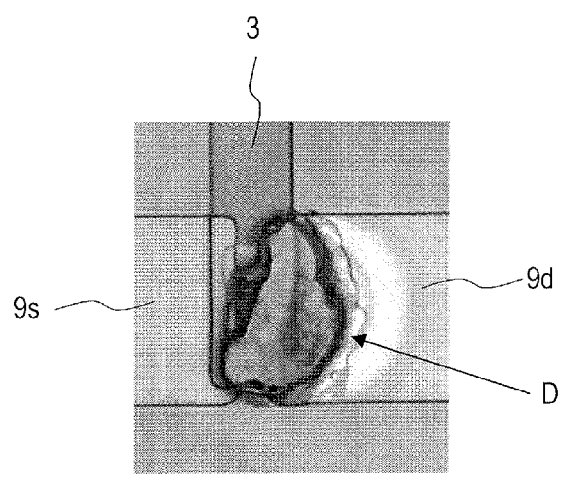

FIGS. 4(a) and 4(b) are a cross-sectional view and plan view of a memory transistor 10(2) of a reference example. The memory transistor 10(2) is different from the memory transistor 10(1) only in that the second source metal layer 9s2 and the second drain metal layer 9d2 are also provided on the metal oxide layer 7. That is, in the memory transistor 10(2), the portion P of the drain electrode 9d includes the second drain metal layer 9d2 which is made of a metal whose melting point is relatively low. The other components and the materials and thicknesses of respective layers are the same as those of the memory transistor 10(1).

A writing operation was performed on the memory transistors 10(1) and 10(2) under the same conditions, and the respective transistors after the writing were observed. Here, the writing conditions were writing voltage Vds of 50 V, gate voltage Vgs of 40 V, and the writing duration of 100 msec.

FIG. 3(c) is a top view of the memory transistor 10(1) after the writing. FIG. 4(c) is a top view of the memory transistor 10(2) after the writing. It can be confirmed from FIG. 4(c) that, in the memory transistor 10(2) of the reference example, a destruction mark D was formed on the metal oxide layer 7. The destruction mark D is estimated to be a mark of melting of the metal and destruction at the channel side edge of the drain electrode 9d. A reading operation was performed on the memory transistor 10(2) after the writing, but no electric current flowed between the source and the drain, and it was difficult to measure the reading current. On the other hand, in the inventive example, as seen from FIG. 3(c), no deformation and no destruction mark were found in the drain electrode 9d, and the reading operation was normally carried out. Thus, according to the present embodiment, it can be seen that destruction of the memory transistor due to heat produced during writing can be suppressed.

<Configuration of Semiconductor Device>

The present embodiment is applicable to a wide variety of electronic devices which include a memory circuit. A semiconductor device of the present embodiment only needs to include at least one memory transistor 10A and is not limited to particular uses or configurations. For example, it may be a nonvolatile semiconductor storage device, an integrated circuit (IC, LSI), various display devices, such as liquid crystal display devices and organic EL display devices, or an active matrix substrate for use in various display devices.

The semiconductor device may further include a thin film transistor which has an active layer formed by a same oxide semiconductor film as that of the active layer (metal oxide layer 7) of the memory transistor 10A. The thin film transistor may be a circuit element which is a constituent of a circuit.

When the present embodiment is applied to an active matrix substrate of a display device, a memory circuit including the memory transistor 10A may be provided in a region of the active matrix substrate other than the display region (peripheral region). In the peripheral region, a thin film transistor (circuit constituent transistor) may be formed as a circuit element which is a constituent of a peripheral circuit, such as a driving circuit. In the display region, a thin film transistor (pixel transistor) may be formed as a switching element which is provided in each pixel. The circuit constituent transistor and the pixel transistor may include an active layer formed by a same oxide semiconductor film as that of the active layer of the memory transistor 10A, and source and drain electrodes formed by a same multilayer conductive film as that of the source and drain electrodes of the memory transistor 10A. The circuit constituent transistor and the pixel transistor may have the same transistor configuration as that of the memory transistor 10A. In this case, these transistors can be manufactured through a common process together with the memory transistor 10A. Note that, however, since writing is not performed on the circuit constituent transistor or the pixel transistor, part of the drain electrode which extends over the active layer and the gate electrode when viewed in a direction normal to the substrate may include a metal or alloy whose melting point is relatively low.

Hereinafter, a more specific configuration of a semiconductor device of the present embodiment is described with reference to the drawings.

<Configuration of Active Matrix Substrate>

The present embodiment can be applied to, for example, an active matrix substrate for use in a liquid crystal display device.

FIG. 5(a) is a plan view showing part of an active matrix substrate 1002. The active matrix substrate 1002 includes a display region 100 including a plurality of pixels 101 and a region other than the display region (peripheral region 200).

In each of the pixels 101 of the display region 100, a thin film transistor (referred to as "pixel transistor") 10T is provided as a switching element. The pixel transistor 10T may have the same transistor structure as the memory transistor 10A (FIG. 1). Alternatively, as illustrated in FIG. 5(b), the second drain metal layer 9d2 may be formed in part of the drain electrode 9d extending over the metal oxide layer 7 and the gate electrode 3.

Although not shown, at least some of a plurality of circuits which are constituents of the display device (memory circuits and driving circuits) are monolithically formed in the peripheral region 200. The circuits formed in the peripheral region 200 are referred to as "peripheral circuits". In the present embodiment, the memory transistor 10A is used in, for example, a memory circuit provided in the peripheral region 200.

In each pixel 101, a source wire S extending in a column direction of the pixels, a gate wire G extending in a row direction of the pixels, and a pixel electrode 19 are provided. The pixel transistor 10T is provided near the intersection of the source wire S and the gate wire G. In the illustrated example, a capacitance wire CS which is formed by the same electrically-conductive film as the gate wire G is provided in the pixel 101. On the capacitance wire CS, a capacitance portion 20 is provided.

In the present embodiment, the source wire S and the source and drain electrodes of the pixel transistor 10T and the memory transistor 10A are formed in the same wire (source wire layer). The source wire layer may have, for example, a multilayer structure including a first metal film 9L (FIG. 1) which is formed of a metal whose melting point is relatively high and a second metal film 9U (FIG. 1) which is formed of a metal whose melting point is lower than that of the first metal film 9L.

In the peripheral region 200, a plurality of terminal portions 201 are provided for connecting the gate wire G or the source wire S to an external wire. The source wire S extends up to an edge of the display region 100 and is connected with a source connecting portion 9sg. The source connecting portion 9sg is electrically connected with a gate connecting portion 3sg which is formed by the same film as the gate wire G. This connecting portion is referred to as "source-gate connecting portion" 30. The gate connecting portion 3sg extends up to the peripheral region 200 and is connected with, for example, a source driver (not shown) via a terminal portion (source terminal) 201. Meanwhile, although not shown, the gate wire G also extends up to the peripheral region 200 and is connected with, for example, a gate driver (not shown) via a terminal portion (gate terminal).

In the peripheral region 200, a plurality of peripheral circuits (not shown) which include a memory circuit are monolithically formed. For example, driving circuits, such as gate drivers and source drivers, and memory circuits connected with respective driver circuits may be formed. The memory circuit includes the memory transistor 10A shown in FIG. 1.

The active matrix substrate 1002 is applicable to a display device such as a liquid crystal display device. The liquid crystal display device includes, for example, an active matrix substrate 1002, a counter substrate 41 which has a counter electrode 42 on the surface, and a liquid crystal layer 43 provided between the active matrix substrate 1002 and the counter substrate 41 as shown in FIG. 5(c). A voltage is applied to the liquid crystal layer 43 at each pixel by the pixel electrode 19 and the counter electrode 42, whereby display is performed.

Figure 6:
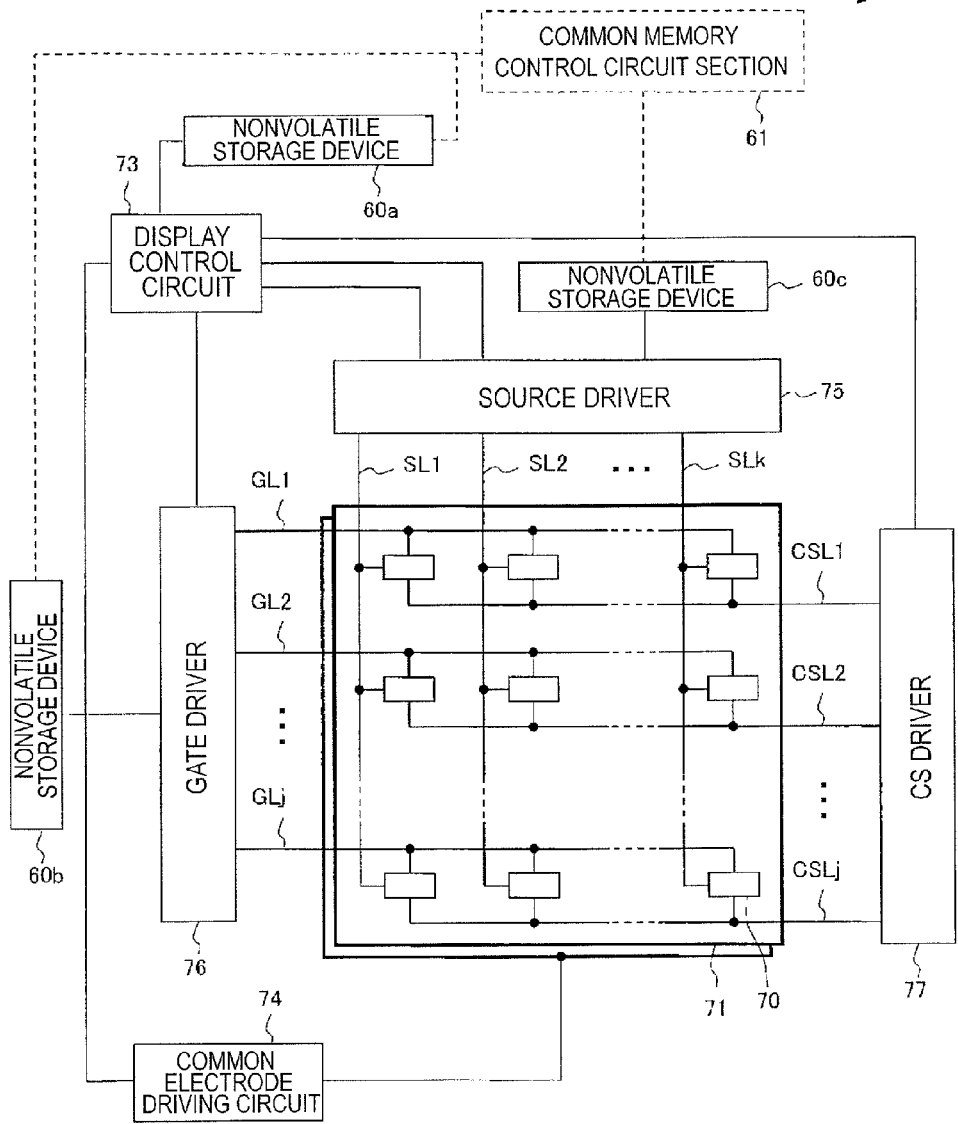
FIG. 6 A diagram illustrating a block configuration of the liquid crystal display device 2001.
Figure 7:
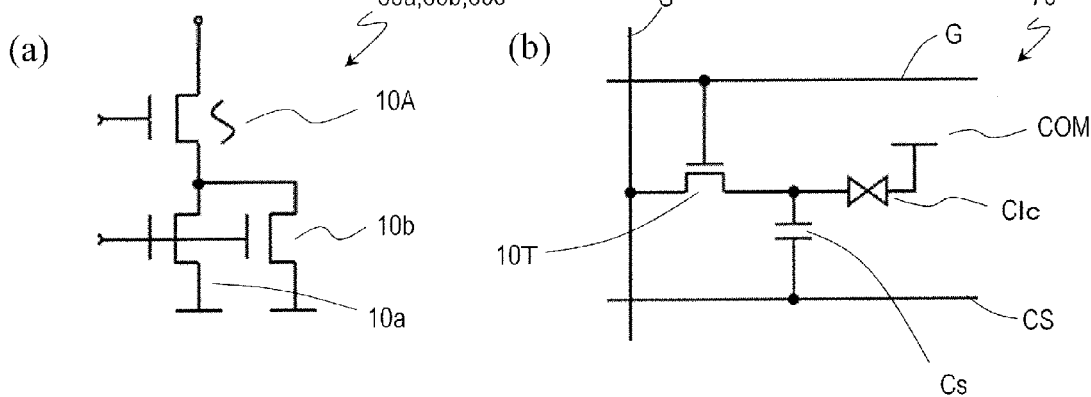
FIGS. 7(a) and (b) are general schematic diagrams showing a memory cell which is a constituent of nonvolatile storage devices 60a to 60c and a pixel circuit of the liquid crystal display device 2001, respectively.
Figure 8:
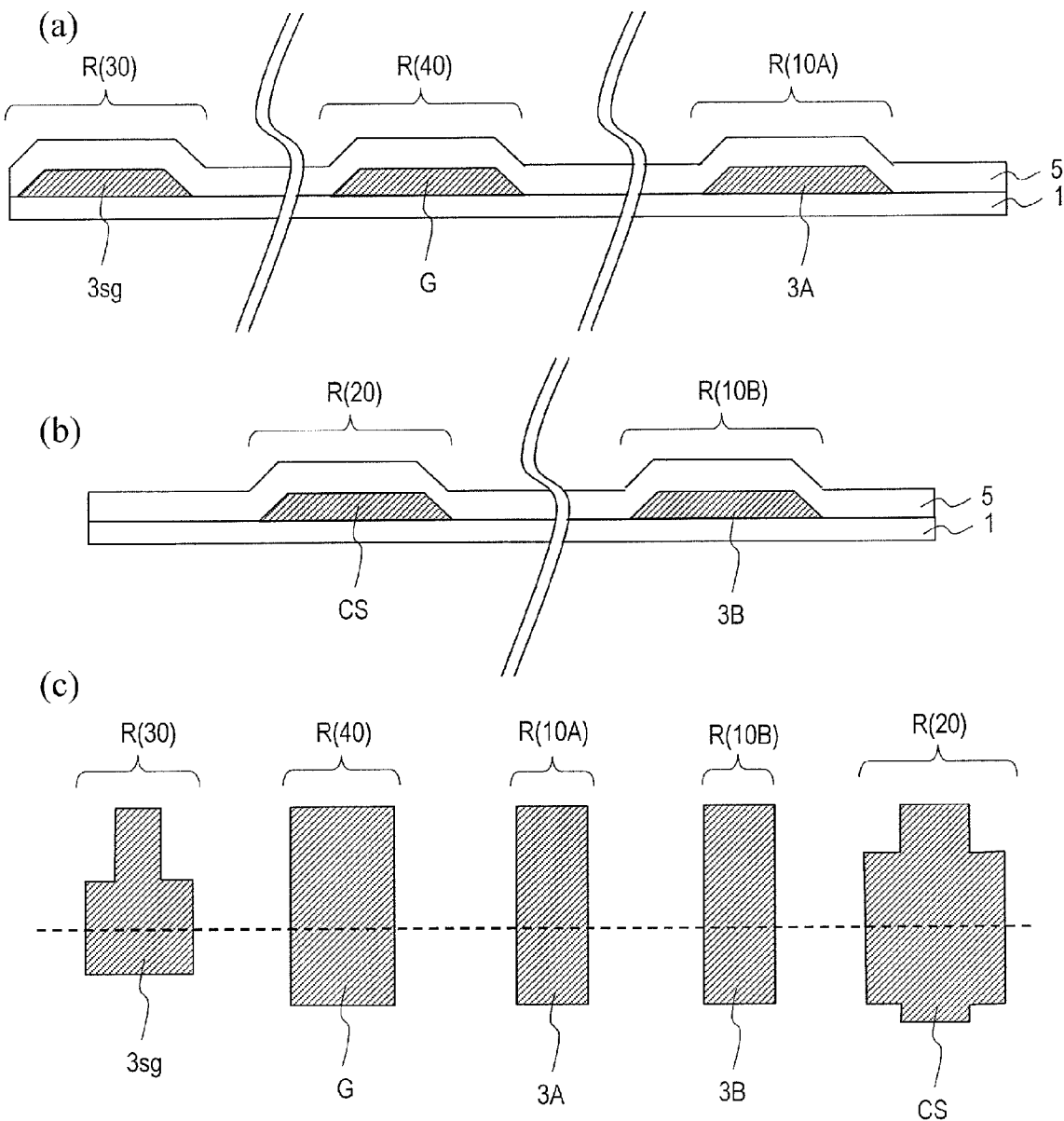
FIG. 8 Process diagrams for illustrating a manufacturing method of a semiconductor device (active matrix substrate 1002) of the first embodiment. (a) and (b) are cross-sectional views. (c) is a top view.
Figure 9:
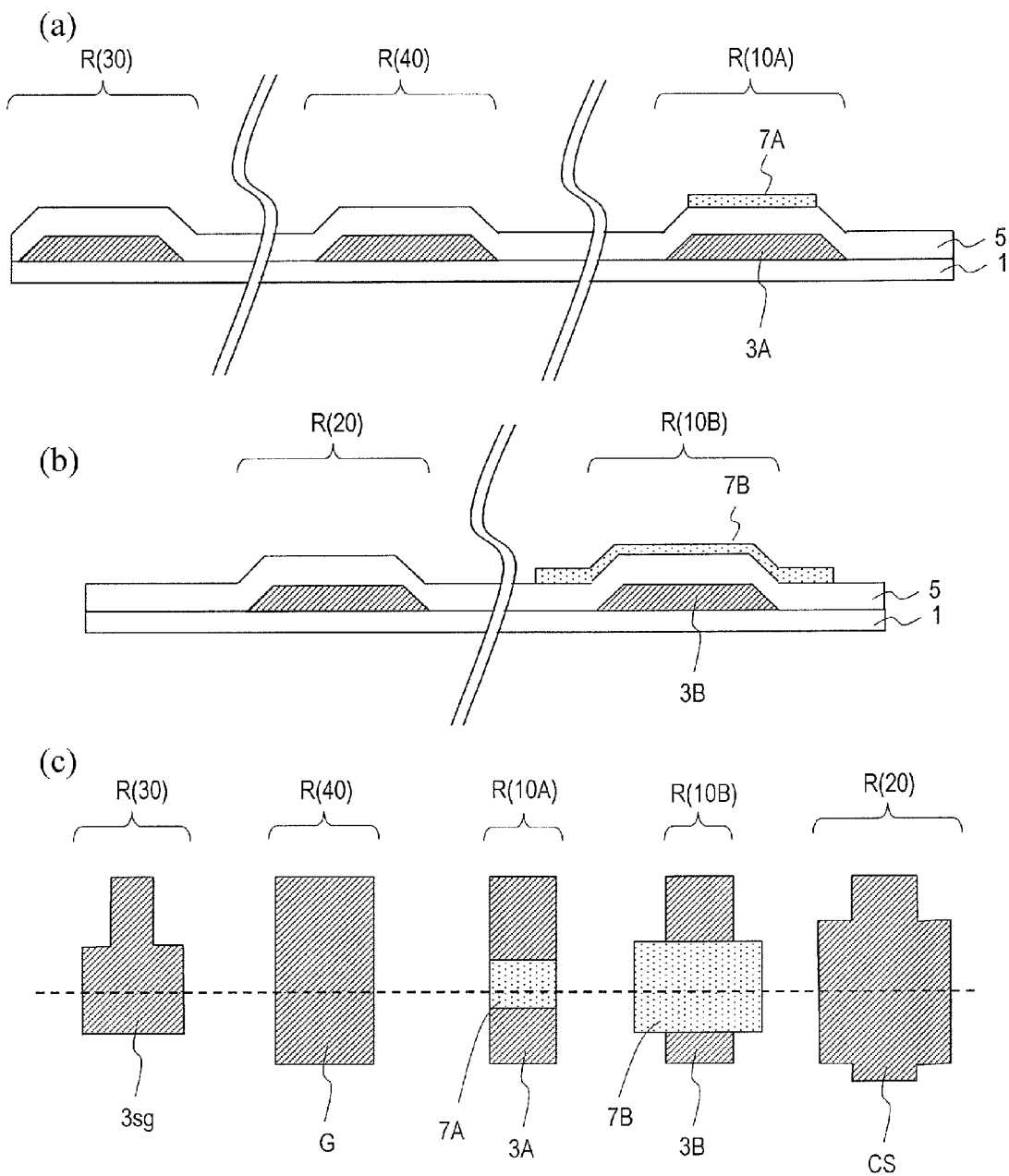
FIG. 9 Process diagrams for illustrating a manufacturing method of a semiconductor device (active matrix substrate 1002) of the first embodiment. (a) and (b) are cross-sectional views. (c) is a top view.

FIG. 6 is a diagram illustrating a block configuration of a liquid crystal display device 2001 in which the active matrix substrate 1002 is used. FIGS. 7(a) and 7(b) are general schematic diagrams showing a memory cell which is a constituent of nonvolatile storage devices 60a to 60c and a pixel circuit of the liquid crystal display device 2001, respectively.

The liquid crystal display device 2001 has a display section 71 which includes a plurality of pixels. The display section 71 corresponds to the display region 100 of the active matrix substrate 1002 (FIG. 5(a)). In the present embodiment, a plurality of pixel circuits 70 are arranged in a matrix in the display section 71. These pixel circuits 70 are connected with one another via source lines SL1 to SLk, gate lines GL1 to GLj, and storage capacitance lines CSL1 to CSLj.

Each of the pixel circuits 70 includes a pixel transistor 10T, a liquid crystal capacitance Clc, and a storage capacitance Cs as shown in FIG. 7(b). The source electrode of the pixel transistor 10T is connected with the source wire S, the gate electrode is connected with the gate wire G, and the drain electrode is connected with a pixel electrode (not shown). The pixel electrode and a common electrode COM form the liquid crystal capacitance Clc. The pixel electrode and the capacitance wire CS form the storage capacitance Cs.

The liquid crystal display device 2001 further includes a source driver 75 electrically connected with the source wire S, a gate driver 76 electrically connected with the gate wire G, a CS driver 77 electrically connected with the capacitance wire CS, and a common electrode driving circuit 74 for driving the common electrode. These driving circuits 75, 76, 77, 74 are connected with a display control circuit 73 for controlling timings and voltages applied to the source wire S, the gate wire G, the capacitance wire CS and the common electrode, and with a power supply circuit (not shown) for supplying electric power to these circuits. The source driver 75, the gate driver 76 and the display control circuit 73 are connected with nonvolatile storage devices 60a, 60b, 60c.

The nonvolatile storage devices 60a, 60b, 60c are connected with a common memory control circuit section 61.

The nonvolatile storage devices 60a, 60b, 60c have a configuration where, for example, a plurality of memory cells are arranged in an array. The memory cells include memory transistors 10A. The memory cells may have the configuration previously described with reference to FIG. 2. Alternatively, as illustrated in FIG. 7(a), the memory cells may have two or more selection transistors 10a, 10b that are connected in parallel instead of the selection transistor 10a shown in FIG. 2.

In the nonvolatile storage device 60a, the configuration information and the unique ID and relevant data of the display panel are stored. These information stored in the nonvolatile storage device 60a are retrieved by the display control circuit 73. Based on these information, the display control circuit 73 carries out switching of the specific display control mode or optimization of control parameters. The unique ID and relevant data can be inquired from the system side connected with the display panel and are utilized for identification of the display panel and selection of an optimum driving mode. The display control circuit 73 switches a circuit which is to be used for display control based on the information stored in the nonvolatile storage device 60a, thereby realizing the optimum display control for the display.

In the nonvolatile storage device 60b, information about configuration parameters which are necessary for driving of the gate driver, such as redundancy relief information for the gate driver, are stored. Likewise, in the nonvolatile storage device 60c, information about configuration parameters which are necessary for driving of the source driver, such as redundancy relief information for the source driver, are stored.

At least part of the nonvolatile storage devices 60a, 60b, 60c and at least part of circuits 73, 74, 75, 76, 77, 61 provided in the other sections than the display section 71 are monolithically formed in the peripheral region 200 of the active matrix substrate 1002 (FIG. 5(a)). In the present embodiment, for example, the gate driver 76 is monolithically formed in the active matrix substrate.

Next, an example of a manufacturing method of the active matrix substrate 1002 is described with reference to the drawings.

FIG. 8 to FIG. 13 are process diagrams for illustrating the manufacturing method of the active matrix substrate 1002. In respective drawings, (a) and (b) are cross-sectional views, and (c) is a top view. In these diagrams, a region of the active matrix substrate 1002 in which the memory transistors 10A, 10B are to be formed, R(10A) and R(10B), a region in which the capacitance portion 20 is to be formed, R(20), a region in which a gate-source contact portion 30 is to be formed, R(30), and a region in which a gate-source intersection 40 is to be formed, R(40), are shown. The gate-source intersection 40 refers to a portion where an electrically-conductive layer formed by a gate wire or an electrically-conductive film which is the same as the gate wire and an electrically-conductive layer formed by a source wire or an electrically-conductive film which is the same as the source wire intersect each other with an insulating layer interposed therebetween. Note that, in these drawings, for the sake of convenience, the regions in which the memory transistors 10A, 10B and the capacitance portion 20 are to be formed are shown side by side, although the arrangement of these formation regions are not limited to the illustrated arrangement. Further, the active matrix substrate 1002 does not need to include two types of memory transistors 10A, 10B but only needs to include either one of the memory transistors 10A, 10B.

First, an electrically-conductive film for the gate is formed on the substrate 1 by sputtering, for example, and then patterned by a known dry etching method. Thereby, a gate connecting portion 3sg is formed in the gate-source contact portion formation region R(30), a gate wire G is formed in the gate-source intersection formation region R(40), a gate electrode 3A is formed in the memory transistor formation region R(10A), a capacitance wire CS is formed in the capacitance portion formation region R(20), and a gate electrode 3B is formed in the memory transistor formation region R(10B) as shown in FIG. 8(a) to FIG. 8(c). A layer which includes these wires and electrodes formed by the electrically-conductive film for the gate is referred to as "gate wire layer".

As the substrate 1, a transparent insulative substrate, such as a glass substrate, for example, can be used. As the electrically-conductive film for the gate, for example, a single layer film of aluminum (Al), chromium (Cr), copper (Cu), tantalum (Ta), titanium (Ti), molybdenum (Mo), or tungsten (W), a multilayer film consisting of two or more layers of these elements, or an alloy film including two or more of the above-described metal elements as constituents may be used. For example, a three-layer film which includes a Ti film, an Al film, and a Ti film in this order from the substrate 1 side (Ti/Al/Ti), or a three-layer film which includes a Mo film, an Al film, and a Mo film in this order (Mo/Al/Mo), may be used. In the present embodiment, as an example, a three-layer film which includes a 10-100 nm thick Ti film, a 50-500 nm thick Al film, and a 50-300 nm thick Ti film in this order from the substrate 1 (Ti/Al/Ti) is used.

Thereafter, a gate insulating film 5 is formed so as to cover the gate wire layer. The gate insulating film 5 is formed by, for example, plasma CVD or sputtering. As the gate insulating film 5, for example, a single layer film, or a multilayer film consisting of two or more layers, selected from a silicon oxide film ($SiO_2$), a silicon nitride film (SiN), a silicon nitroxide film (SiNO), a silicon oxynitride film (SiON), aluminum oxide ($Al_2O_3$), and tantalum oxide ($Ta_2O_5$) may be used. In the present embodiment, as an example, a two-layer film is used which includes a 100-500 nm thick SiN film and a 20-100 nm thick $SiO_2$ film from the substrate 1 side.

Then, an oxide semiconductor film (thickness: for example, 5-500 nm) is formed on the gate insulating film 5 by, for example, sputtering. Thereafter, the oxide semiconductor film is patterned by a known wet etching method. Thereby, a metal oxide layer 7A is formed in the memory transistor formation region R(10A), and a metal oxide layer 7B is formed in the memory transistor formation region R(10B) as shown in FIG. 9(a) to FIG. 9(c). The metal oxide layers 7A, 7B are arranged so as to extend over the corresponding gate electrodes 3A, 3B, respectively, with the gate insulating film 5 interposed therebetween. Here, the gate electrodes 3A, 3B have generally equal widths in the channel direction, and the width in the channel direction of the metal oxide layer 7A is smaller than the width in the channel direction of the metal oxide layer 7B. For example, as illustrated, it is possible that the width in the channel direction of the metal oxide layer 7A is smaller than the width in the channel direction of the gate electrode 3A while the width in the channel direction of the metal oxide layer 7B is greater than the width in the channel direction of the gate electrode 3B. Such a configuration enables to realize transistor structures of different channel lengths without increasing the parasitic capacitance formed at a portion where the gate electrodes 3A, 3B and the source and drain electrodes overlap each other.

As the oxide semiconductor film, an oxide semiconductor film which includes, for example, In, Ga and Zn can be used. In the present embodiment, an In—Ga—Zn—O based amorphous oxide semiconductor film (thickness: for example, 5-500 nm) is used. This semiconductor film is a n-type metal oxide semiconductor and is formed at a low temperature. The composition ratio of respective metal elements in the In—Ga—Zn—O based oxide semiconductor film, In:Ga:Zn, is 1:1:1, for example. Even if the composition ratio is modified based on this composition ratio, the effects of the present invention are provided.

Then, as shown in FIGS. 10(a) to 10(c), a multilayer film including the first metal film 9L as the lower layer and the second metal film 9U as the upper layer was formed as an electrically-conductive film 9 for the source on the gate insulating film 5 and the metal oxide layers 7A, 7B and then subjected to the first patterning.

The first metal film 9L may be a metal film which is made of a metal (including an alloy) whose melting point is relatively high. Alternatively, it may be a film which is made of a metal compound, such as a metal nitride whose melting point is relatively high. The first metal film 9L can be a metal film of, for example, W, Ta, Ti, Mo, Cr, or the like. The second metal film 9U may be a metal film which is made of a metal (including an alloy) whose melting point is relatively low. Alternatively, it may be a film which is made of a metal compound, such as a metal nitride whose melting point is relatively high. The second metal film 9U can be a metal film of, for example, Cu, Al, or the like. The electrically-conductive film for the source may have a two-layer structure of Ti film-Al film, which includes for example a Ti film as the lower layer and an Al film as the upper layer, a two-layer structure of Mo film-Al film, which includes for example a Mo film as the lower layer and an Al film as the upper layer, or a multilayer structure of three or more layers which includes these two layers. Here, a Ti film (thickness: 10-100 nm) as the first metal film 9L and an Al film (thickness: 50-400 nm) as the second metal film 9U are formed in succession by, for example, sputtering.

The first patterning is performed on the electrically-conductive film 9 for the source, which includes the first and second metal films 9L, 9U, by wet etching, for example. The wet etching is performed under conditions such that only the second metal film 9U is etched while the first metal film 9L is not etched. Thereby, openings are formed in parts of the second metal film 9U which are present over the metal oxide layers 7A, 7B of the memory transistors 10A, 10B. Through these openings, the first metal film 9L is exposed. Each of the openings is provided over a portion including the entirety of a region which is to be the drain contact region in the metal oxide layers 7A, 7B and a part of a region which is to be the channel region.

Then, as shown in FIGS. 11(a) to 11(c), on the electrically-conductive film 9 for the source, a resist layer M which has openings over regions which are to be the channel regions of the memory transistors 10A, 10B is formed. Thereafter, the second patterning is performed on the electrically-conductive film for the source using the resist layer M. In the second patterning, for example, with the use of the resist layer M as the mask, the second metal film 9U is removed by wet etching, and then, the first metal film 9L is removed by dry etching. Thereby, parts of the first and second metal films 9L, 9U which are present over regions which are to be the channel regions of the metal oxide layers 7A, 7B are removed (source-drain separation).

Through the above-described process, source electrodes 9sA, 9sB and drain electrodes 9dA, 9dB are formed in the memory transistor formation regions R(10A), R(10B). Meanwhile, a source connecting portion 9sg is formed in the gate-source contact portion formation region R(30), a source wire S is formed in the gate-source intersection formation region R(40), and a capacitance electrode 9cs is formed in the capacitance portion formation region R(20). A layer which includes these wires and electrodes formed by the electrically-conductive film for the source is referred to as "source wire layer". The source electrodes 9sA, 9sB are multilayer electrodes (or multilayer wires) which include first source metal layers 9s1A, 9s1B formed by the first metal film 9L as the lower layers and second source metal layers 9s2A, 9s2B formed by the second metal film 9U as the upper layers. Likewise, the drain electrodes 9dA, 9sB are multilayer electrodes (or multilayer wires) which include first drain metal layers 9d1A, 9d1B formed by the first metal film 9L as the lower layers and second drain metal layer 9d2A, 9d2B formed by the second metal film 9U as the upper layers.

Here, the second metal film 9U is patterned by wet etching, and therefore, the edge of the second metal film 9U in the source wire layer is at an inner position relative to the edge of the resist layer M when viewed in a direction normal to the substrate 1. Meanwhile, the first metal film 9L is patterned by dry etching, and therefore, the edge of the first metal film 9L and the edge of the resist layer M are generally coincident with each other when viewed in a direction normal to the substrate 1. Therefore, when the source wire layer is viewed in a direction normal to the substrate 1, the second metal film 9U is present inside the contour of the first metal film 9L. In a cross section, the edge of the second metal film 9U is present on the first metal film 9L. In the first patterning, part of the second metal film 9U extending over a region which is to be the drain contact region is removed, and therefore, only the first metal film 9L remains over the drain contact region of the metal oxide layers 7A, 7B.

The source electrode 9sA and the drain electrode 9dA are electrically separated from each other and are arranged such that each of the source electrode 9sA and the drain electrode 9dA is in contact with part of the metal oxide layer 7A. Likewise, the source electrode 9sB and the drain electrode 9dB are electrically separated from each other and are arranged such that each of the source electrode 9sB and the drain electrode 9dB is in contact with part of the metal oxide layer 7B. Regions of the metal oxide layers 7A, 7B which overlap the corresponding gate electrodes 3A, 3B and which are present between the source electrodes 9sA, 7sB and the drain electrodes 9dA, 7dB when viewed in a direction normal to the substrate 1 are channel regions 7cA, 7cB. In the present embodiment, for example, in the memory transistor formation region R(10A), the source electrode 9sA and the drain electrode 9dA are arranged such that the channel region 7cA has a U-shape when viewed in a direction normal to the substrate 1. Meanwhile, in the memory transistor formation region R(10B), the source electrode 9sB and the drain electrode 9dB are arranged such that the channel region 7cB has a rectangular shape when viewed in a direction normal to the substrate 1.

In this way, the memory transistors 10A, 10B are formed. In each of the transistors 10A, 10B, part of the drain electrode 9dA, 9dB which extends over both the metal oxide layer 7A, 7B and the gate electrode 3A, 3B is formed only by the first metal film 9L and does not include the second metal film 9U. Meanwhile, part of the source electrode 9sA, 9sB which extends over both the metal oxide layer 7A, 7B and the gate electrode 3A, 3B includes the first metal film 9L and the second metal film 9U.

In the capacitance portion formation region R(20), a capacitance portion 20 is formed which includes the capacitance wire CS, the capacitance electrode 9cs, and a dielectric layer which is present between the capacitance wire CS and the capacitance electrode 9cs (here, gate insulating film 5). In the gate-source intersection formation region R(40), a gate-source intersection 40 is formed in which the gate wire G and the source wire S intersect each other with the gate insulating film 5 interposed therebetween. In the gate-source contact portion formation region R(30), the source connecting portion 9sg is arranged so as to extend over part of the gate connecting portion 3sg with the gate insulating film 5 interposed therebetween.

Note that, although not shown, the pixel transistor 10T (see FIGS. 5(a) and 5(b)) and the circuit constituent transistor are also manufactured through a common process together with the memory transistors 10A, 10B. In the pixel transistor 10T and the circuit constituent transistor, the second metal film 9U of the drain electrode may be provided on the metal oxide layer 7 as illustrated in FIG. 5(b).

Then, a protection film (passivation film) 11 is formed by, for example, plasma CVD or sputtering so as to cover the source wire layer as shown in FIG. 12(a) to FIG. 12(c). As the protection film 11, for example, a single layer film, or a multilayer film consisting of two or more layers, selected from a silicon oxide film ($SiO_2$), a silicon nitride film (SiN), a silicon nitroxide film (SiNO), a silicon oxynitride film (SiON), aluminum oxide ($Al_2O_3$), and tantalum oxide ($Ta_2O_5$) may be used. In the present embodiment, as an example, a $SiO_2$ film (thickness: for example, 50-500 nm) formed by CVD is used as the protection film 11.

Thereafter, annealing is performed in air at 200-400° C. for about 30 minutes to 4 hours. Thereby, a reaction layer is formed at the interface between the source electrodes 9sA, 9sB and drain electrodes 9dA, 9dB and the metal oxide layers 7A, 7B. Thus, the contact resistance between the source electrodes 9sA, 9sB and drain electrodes 9dA, 9dB and the metal oxide layers 7A, 7B can be reduced.

Thereafter, as necessary, a flattening film may be formed on the passivation film 11 as shown in FIGS. 13(a) to 13(c). In the present embodiment, an organic insulating film 13 of a photosensitive resin, for example, is formed as the flattening film. The organic insulating film 13 is patterned by a known photolithographic method (exposure, development, baking). Thereby, an opening is formed in part of the organic insulating film 13 which is present over the gate-source contact portion formation region R(30). Thereafter, etching of the gate insulating film 5 and the passivation film 11 is performed using the organic insulating film 13 as a mask. In the etching, the source connecting portion 9sg and the gate connecting portion 3sg function as the etch stop. Therefore, part of the gate insulating film 5 which is covered with the source connecting portion 9sg is not etched away. In this way, a contact hole 15 is obtained through which the surfaces of the gate connecting portion 3sg and the source connecting portion 9sg are exposed.

Then, an electrically-conductive film is formed in the contact hole 15 and on the organic insulating film 13 and patterned. Thereby, in the gate-source contact portion formation region R(30), an upper electrically-conductive layer 17 is obtained which electrically connects the gate connecting portion 3sg and the source connecting portion 9sg in the contact hole 15. In this way, the gate-source contact portion 30 is formed.

In the present embodiment, a transparent electrically-conductive film, such as an ITO film (thickness: for example, about 20 nm to 300 nm), is used as the electrically-conductive film. Note that this electrically-conductive film also forms the pixel electrode 19 (FIG. 5(a)) of each pixel. In this way, the active matrix substrate 1002 is obtained.

The semiconductor device of the present embodiment is not limited to the active matrix substrate 1002 or a display device in which the active matrix substrate 1002 is used. The present embodiment is suitably applicable to a device which includes an oxide semiconductor TFT and a nonvolatile memory. For example, the memory transistor 10A can be manufactured at a relatively low temperature (for example, 200° C. or lower) and is therefore applicable to IC tags and the like. In this case, the memory transistor 10A can be utilized for memorization of ID. Further, since a transparent metal oxide film can be used as the oxide semiconductor film, the semiconductor device of the present embodiment can also be used in mass storage devices for digital signage. The semiconductor device of the present embodiment is applicable not only to storage devices but also to programmable logic circuit devices, such as ASIC (Application Specific Integrated Circuit) and FPGA (Field-Programmable Gate Array).

<Electric Characteristics of Memory Transistor 10A>

Now, the electric characteristics of the memory transistor 10A are described with reference to FIG. 14 to FIG. 20.

As the memory transistor 10A, an n-channel type thin film transistor was manufactured in which an In—Ga—Zn—O based oxide semiconductor was used as the metal oxide layer 7. The electric characteristics of the manufactured transistor were measured before and after writing. In the memory transistor 10A used for the measurement, channel length L1 was 4 μm, channel width W1 was 20 μm, the thickness of the active layer (metal oxide layer) 7A was 20-100 nm, and the planar shape of the channel region 7cA was a rectangular shape or a U-shape.

Immediately after manufacture (initial state), the memory transistor 10A exhibits the same transistor characteristics as a normal thin film transistor. That is, drain current Ids (an electric current flowing from the drain electrode to the source electrode) varies depending on each of gate voltage Vgs (a voltage applied to the gate electrode relative to the source electrode) and drain voltage Vds (a voltage applied to the drain electrode relative to the source electrode).

FIG. 14(a) is a graph which illustrates the Ids-Vgs characteristic in the initial state of the memory transistor 10A where Vds=0.1 V and Vds=10 V. FIG. 14(b) is a graph which illustrates the Ids-Vds characteristic in the initial state of the memory transistor 10A where Vgs was changed from 0 to 7 V stepwise by 1 V. Note that, in FIGS. 14(a) and 14(b), the value of drain current Ids refers to the value of the drain current per unit gate width (1 μm) (unit drain current).

Figure 14:
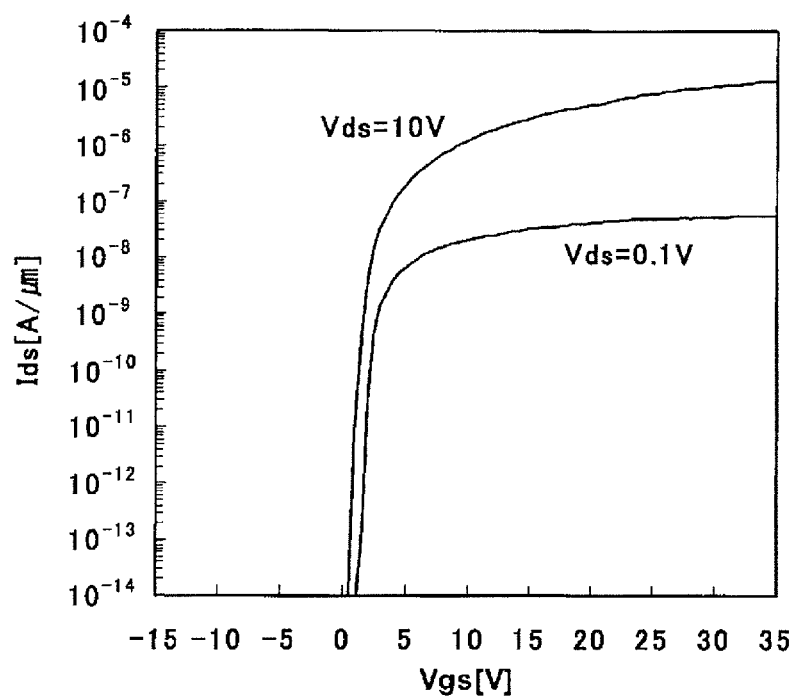
FIG. 14(a) is a graph showing the Ids-Vgs characteristic in the initial state (semiconductor state) of the memory transistor 10A. (b) is a graph showing the Ids-Vds characteristic in the initial state of the memory transistor 10A.
Figure 14:
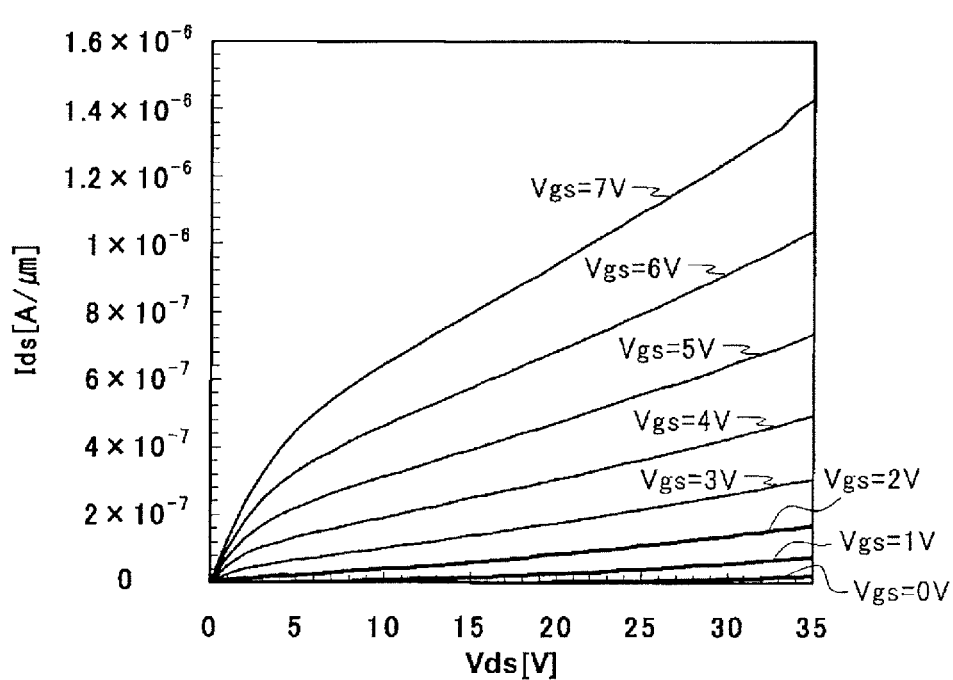

As clearly seen from FIGS. 14(a) and 14(b), in the memory transistor 10A which is in the initial state, when gate voltage Vgs is in the range of not more than about 0.5 V (specific voltage range) while drain voltage Vds is in the range of not less than 0.1 V and not more than 10 V, the unit drain current is extremely small (for example, not more than $1×10^{-14}$ A/μm). This means that the memory transistor 10A is substantially in an OFF state. When gate voltage Vgs is greater than the above-described specific voltage range, drain current Ids increases as gate voltage Vgs increases (FIG. 14(*a*)). Also, drain current Ids increases as drain voltage Vds increases (FIG. 14(*b*)).

A writing operation was performed on the memory transistor 10A which was in the initial state (or "semiconductor state"), and the electric characteristics after the writing were examined. The writing was realized by applying predetermined gate voltage Vgs and drain voltage Vds to the memory transistor 10A such that a large drain current flows through the channel region 7*c*A. Due to the drain current, Joule heat is locally produced in the metal oxide layer 7A, whereby the electric resistance of the channel region 7*c*A can be reduced. Note that gate voltage Vgs applied during writing is set to, for example, a voltage higher than the range of a gate voltage applied to a circuit constituent transistor due to a circuit operation. Here, drain voltage Vds at 24 V and gate voltage Vgs at 30 V were applied to the memory transistor 10A for writing. The writing duration (the conduction duration of drain current Ids) was 100 msec.

Figure 15:
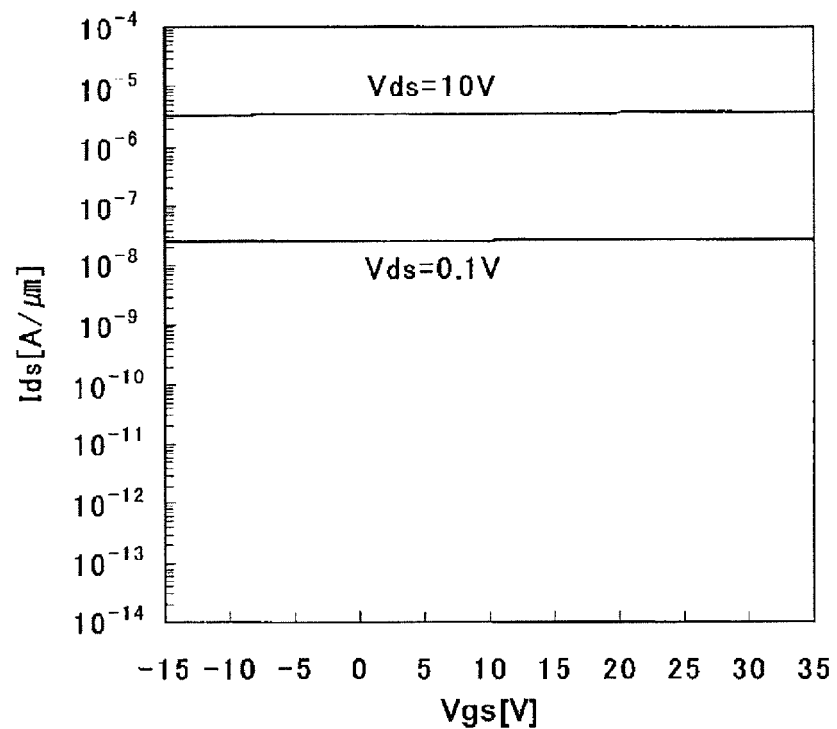
FIG. 15(a) is a graph showing the Ids-Vgs characteristic in the resistor state of the memory transistor 10A. (b) is a graph showing the Ids-Vds characteristic in the resistor state of the memory transistor 10A.
Figure 15:
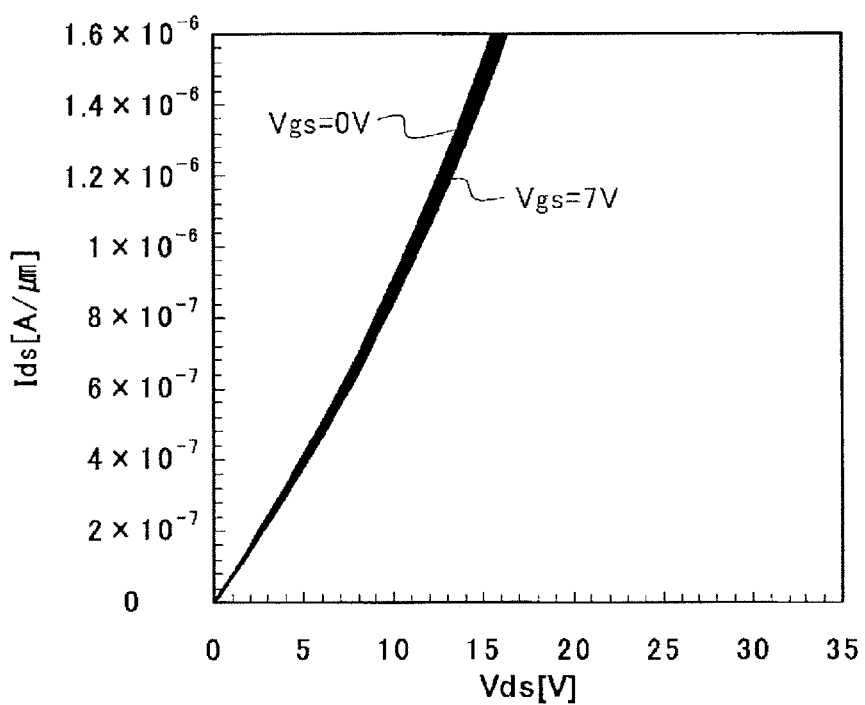

FIG. 15(*a*) is a graph showing the Ids-Vgs characteristic after a writing operation of the memory transistor 10A in the case where Vds=0.1 V and Vds=10 V. FIG. 15(*b*) is a graph showing the Ids-Vds characteristic after a writing operation of the memory transistor 10A in the case where Vgs was changed from 0 to 7 V stepwise by 1 V.

Figure 16:
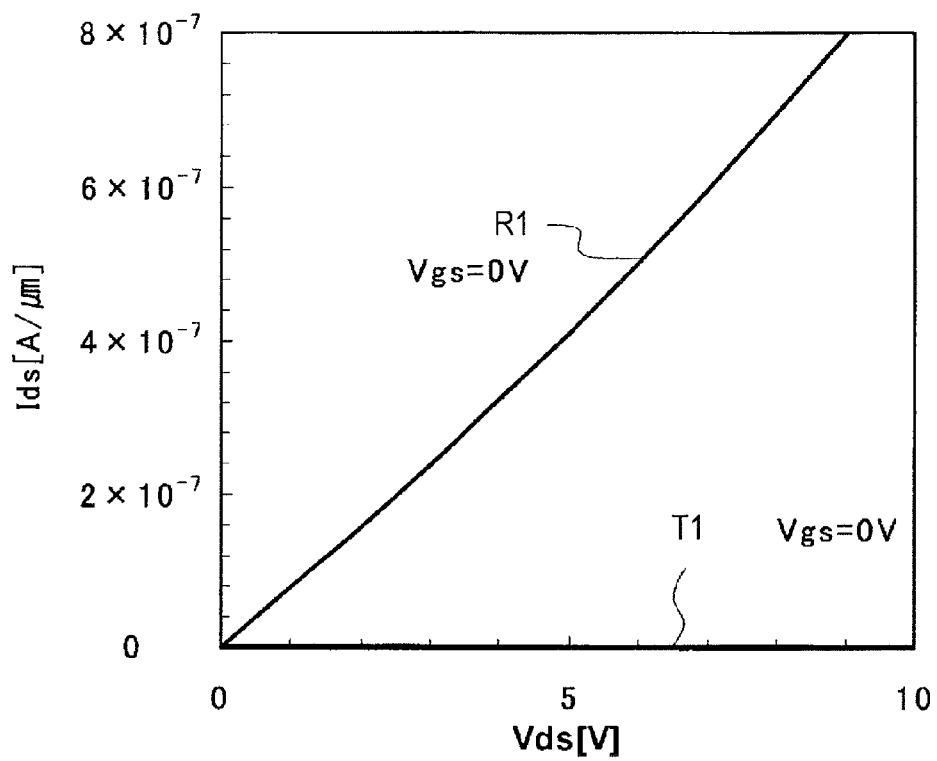
FIG. 16 A graph enlargedly showing the Ids-Vds characteristic near the origin in the memory transistor 10A immediately before and after writing in the case where Vgs=0 V.

FIG. 16 is a graph enlargedly showing the Ids-Vds characteristic near the origin in the case where Vgs=0 V, in the memory transistor 10A before writing (initial state) and after writing, for the sake of comparison of the electric characteristics exhibited before and after the writing. Line R1 represents the Ids-Vds characteristic before the writing. Line T1 represents the Ids-Vds characteristic after the writing.

Figure 17:
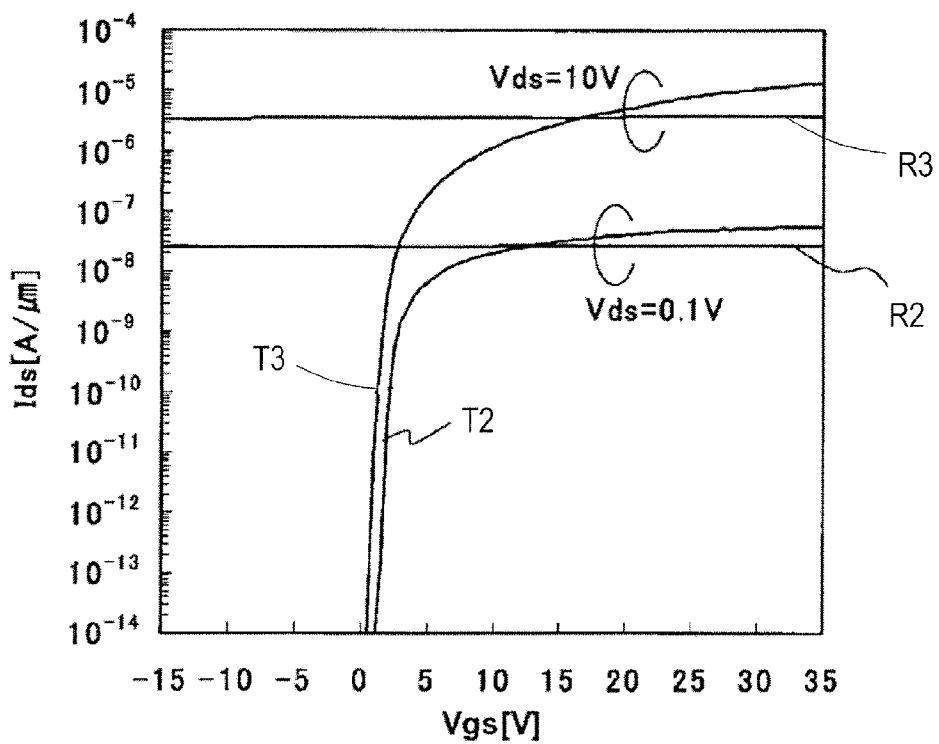
FIG. 17 A graph superposedly showing the Ids-Vgs characteristics of the memory transistor 10A before and after writing.

FIG. 17 is a graph superposedly showing the Ids-Vgs characteristics of the memory transistor 10A before and after writing. Lines T2 and T3 represent the Ids-Vgs characteristics before writing when Vds was 0.1 V and 10 V, respectively. Lines R2 and R3 represent the Ids-Vgs characteristics after writing when Vds was 0.1 V and 10 V, respectively.

Figure 18:
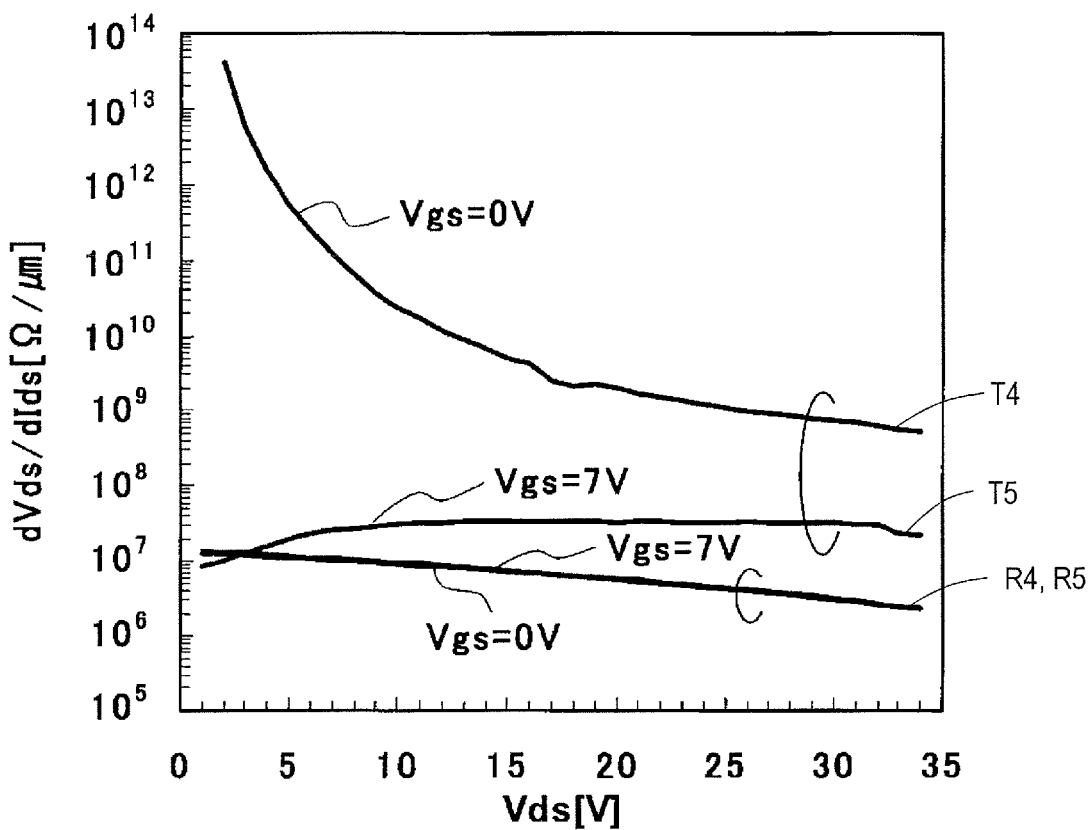
FIG. 18 A graph showing the relationship between the differential resistivity (dVds/dIds, unit: Ωμm) and drain voltage Vds of the memory transistor 10A before and after writing.

FIG. 18 is a graph showing the relationship between the differential resistivity (dVds/dIds, unit: Ωμm) and drain voltage Vds of the memory transistor 10A before and after writing. Lines T4 and T5 represent the relationship between dVds/dIds and Vds before writing when gate voltage Vgs was 0 V and 7 V, respectively. Lines R4 and R5 represent the relationship between dVds/dIds and Vds after writing when gate voltage Vgs was 0 V and 7 V, respectively.

As clearly seen from FIGS. 15(*a*) and 15(*b*), in the memory transistor 10A after writing, drain current Ids rarely depends on gate voltage Vgs but varies mainly depending on drain voltage Vds. When drain voltage Vds is constant, drain current Ids has a generally constant value. The IV curve in each gate voltage Vgs of the Ids-Vds characteristic is generally linear irrespective of gate voltage Vgs and passes through the origin (Ids=0 A/μm, Vds=0 V). That is, it can be seen that the memory transistor 10A after writing is a resistor which exhibits an ohmic resistance characteristic. The differential resistivity (dVds/dIds) at the origin has a finite value which is not equal to the infinity or zero (0).

In the memory transistor 10A which is in the initial state, drain current Ids varies largely depending on gate voltage Vgs when drain voltage Vds is constant. When gate voltage Vgs is within the specific voltage range (e.g., not more than about 0.5 V), drain current Ids scarcely flows, so that the memory transistor 10A is substantially in an OFF state. On the other hand, after writing, when drain voltage Vds is constant, a constant drain current Ids flows irrespective of gate voltage Vgs. When gate voltage Vgs is within the specific voltage range, the unit drain current is not less than $1 \times 10^{-11}$ A/μm so long as the drain voltage is within a range of not less than 0.1 V and not more than 10 V, for example.

Thus, in the memory transistor 10A, when it is in a semiconductor state, while the absolute value of the drain voltage is in a range of not less than 0.1 V and not more than 10 V, there is a voltage range for the gate voltage in which the absolute value of the drain current per unit channel width Ids/W1 falls in a very small electric current state of, for example, not more than $1 \times 10^{-14}$ A/μm. After transition to a resistor state, even when the gate voltage is set within the above-described voltage range while the absolute value of the drain voltage is in a range of not less than 0.1 V and not more than 10 V, the absolute value of the drain current per unit channel width Ids/W1 falls in an electric current state of, for example, not less than $1 \times 10^{-11}$ A/μm according to the drain voltage.

Further, as seen from FIG. 18, the differential resistivity dVds/dIds in the initial state varies depending on gate voltage Vgs. On the other hand, the differential resistivity dVds/dIds after writing does not vary depending on gate voltage Vgs.

Next, additional description of the writing operation of the memory transistor 10A is provided. The writing operation of the memory transistor 10A is realized by allowing drain current Ids of a high current density to flow through the channel region 7*c*A for a predetermined writing duration. The flowing drain current Ids of a high current density is in a higher bias state than the voltage ranges of gate voltage Vgs and drain voltage Vds which are applied to the memory transistor 10A in a circuit operation other than the writing operation. Since drain current Ids of a predetermined high current density flows for a predetermined writing duration, Joule heat and electromigration occur in the channel region 7*c*A. Accordingly, it is estimated that, the composition of a metal oxide which is a constituent of the channel region 7*c* (metal oxide layer 7) changes, so that decrease of the resistance is induced. Note that, if the thickness of the metal oxide layer 7 is constant, the unit drain current (unit: A/μm) is proportional to the current density of the drain current (unit: A/m$^2$). By increasing the unit drain current (unit: A/μm), the current density of the drain current (unit: A/m$^2$) increases. In the present embodiment, the unit drain current during the writing operation is, for example, about 1 μA/μm to 1 mA/μm, and the writing duration is, for example, about 10 μsec to 100 seconds. Gate voltage Vgs applied during writing is set so as to be, for example, more than 0 V and not more than 200 V, preferably not less than 20 V and not more than 100 V. Drain voltage Vds applied during writing is set so as to be, for example, more than 0 V and not more than 200 V, preferably not less than 20 V and not more than 100 V. Note that, however, voltages Vgs and Vds applied during writing are not limited to the above-described numerical ranges but can be appropriately set such that a desired unit drain current flows. The unit drain current during the writing operation and the writing duration are also not limited to the above-described numerical ranges. The unit drain current and the writing duration can vary depending on the type and thickness of the metal oxide semiconductor used for the metal oxide layer 7A and the device structure of the memory transistor 10A.

The electric characteristics of the memory transistor 10A are more likely to vary as the Joule heat produced in the memory transistor 10A is larger. For example, as the unit drain current Ids during writing increases, a larger amount of Joule heat can be produced.

Figure 19:
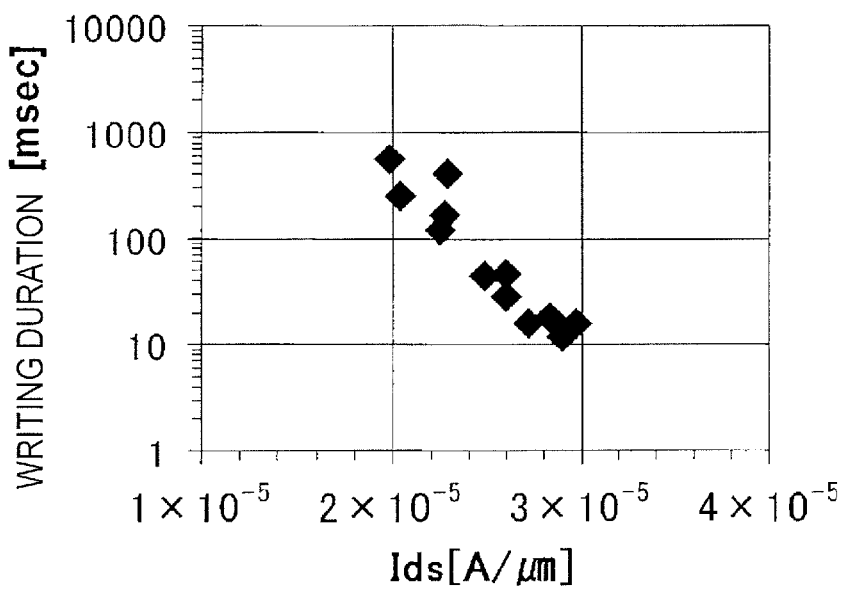
FIG. 19 A graph showing an example of the relationship between the writing duration (unit: msec) and the unit drain current (unit: A/μm) of the memory transistor 10A.

FIG. 19 shows an example of the relationship between the writing duration (unit: msec) and the unit drain current (unit: A/μm). As seen from FIG. 19, as the unit drain current increases, the Joule heat increases, and the writing duration can be shortened.

The unit drain current during writing can be increased by increasing gate voltage Vgs applied during writing or increasing the capacitance of the gate insulating film 5. Note that, however, gate voltage Vgs applied during writing is set to a value lower than the dielectric breakdown voltage of the gate insulating film 5. Therefore, in order to further increase gate voltage Vgs applied during writing, increasing the dielectric breakdown voltage of the gate insulating film 5 is preferred. From such a viewpoint, in the present embodiment, a material of high relative permittivity is used for the gate insulating film 5 in order to secure a large electric capacitance. As an insulative material of high relative permittivity, for example, a silicon nitride film (SiN) or a silicon nitroxide film (SiNO) may be used. The relative permittivities of these films are higher than that of a silicon oxide film ($SiO_2$). The intensity of the electric field imposed on the gate insulating film 5 may be kept at a low level by increasing the thickness of the gate insulating film 5 separately from or together with selection of a high permittivity material. This enables reduction of the dielectric breakdown voltage of the gate insulating film 5. Note that when a silicon nitride film (SiN) or a silicon oxynitride film (SiON) is formed by CVD as an insulative film of high relative permittivity, hydrogen is included in these films. Therefore, when the SiN film or SiON film is in contact with the metal oxide layer that is the metal oxide layer 7A, hydrogen causes a reaction with oxygen of the oxide semiconductor, and as a result, there is a probability that the metal oxide layer 7A becomes closer to a conductor. In view of such, in order to prevent direct contact between the metal oxide layer 7A and the silicon nitride film (SiN) or silicon nitroxide film (SiNO), a silicon oxide film ($SiO_2$) or silicon oxynitride film (SiON) in which the hydrogen concentration is low may be interposed therebetween.

When the memory transistor of the present embodiment has a configuration which readily produces Joule heat or a configuration in which the produced Joule heat is unlikely to diffuse, it can realize higher writing characteristics. For example, the planar shape of the channel region is designed so as to more efficiently utilize the Joule heat, whereby the writing duration can be further shortened. Specifically, when the planar shape of the channel region is a U-shape, for example, the duration required for writing can be shortened as compared with a rectangular channel region.

Figure 20:
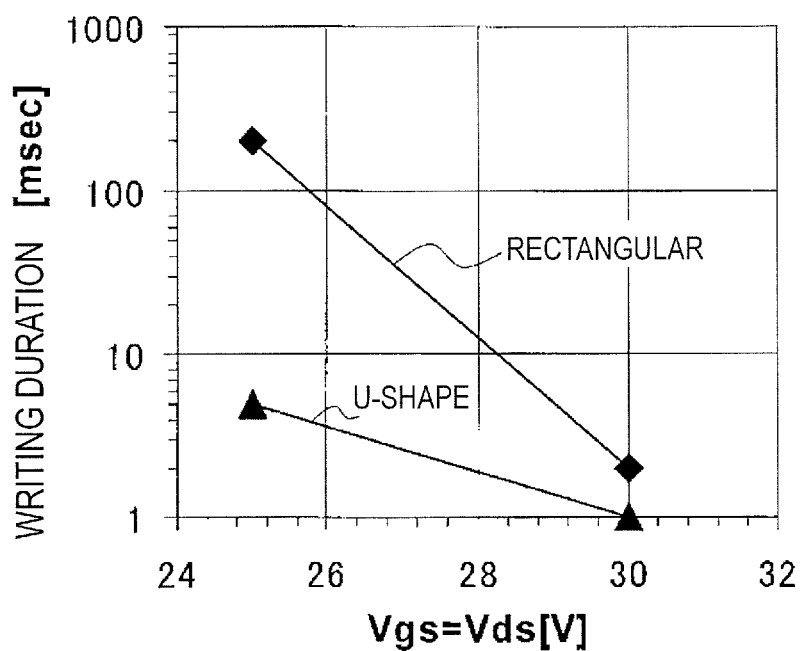
FIG. 20 A graph showing the relationship between the planar shape of the channel region of the memory transistor and the writing duration.

FIG. 20 is a graph showing the relationship between the planar shape of the channel region and the writing duration. The horizontal axis represents gate voltage Vgs and writing voltage Vds (where Vgs=Vds). The vertical axis represents the writing duration. Here, a memory transistor in which the planar shape of the channel region is rectangular and a memory transistor in which the planar shape of the channel region is a U-shape were examined as to the writing duration. Note that the channel width and the channel length of these memory transistors are equal, and the dimensions other than the planar shape of the channel region (the thickness of the active layer, the material and thickness of the gate insulating film, etc.) are also equal.

It can be seen from the results shown in FIG. 20 that when the channel region has a U-shape, Joule heat produced from the writing current can be more efficiently utilized for writing than in a case where the channel region has a rectangular shape. The reasons for this are as follows. In the case where the channel region has a U-shape, one of the drain electrode and the source electrode is surrounded by the other when viewed in a direction normal to the substrate. Thus, the current density is higher at the surrounded electrode so that produced Joule heat is greater than that produced at the other electrode. As a result, the resistance of the oxide semiconductor decreases due to the Joule heat, and the writing operation is enhanced. Particularly when the surrounded electrode is the drain electrode, i.e., when the source electrode is provided outside the U-shape of the channel region while the drain electrode is provided inside the U-shape, the amount of heat produced on the drain side of the metal oxide layer can be increased, and therefore, the writing speed can be further increased. Thus, when the electrode configuration of the present embodiment is applied to a memory transistor which has a U-shape channel region, greater effects are achieved. Note that the planar shape of the channel region is not limited to a U-shape. The same effects are produced so long as the channel region has such a shape that the current density locally increases.

<Configuration Example of Memory Transistor>

To further increase drain current Ids during a writing operation of the memory transistor, another gate electrode 18 may be provided on the opposite side to the gate electrode 3 in the metal oxide layer 7.

Figure 21:
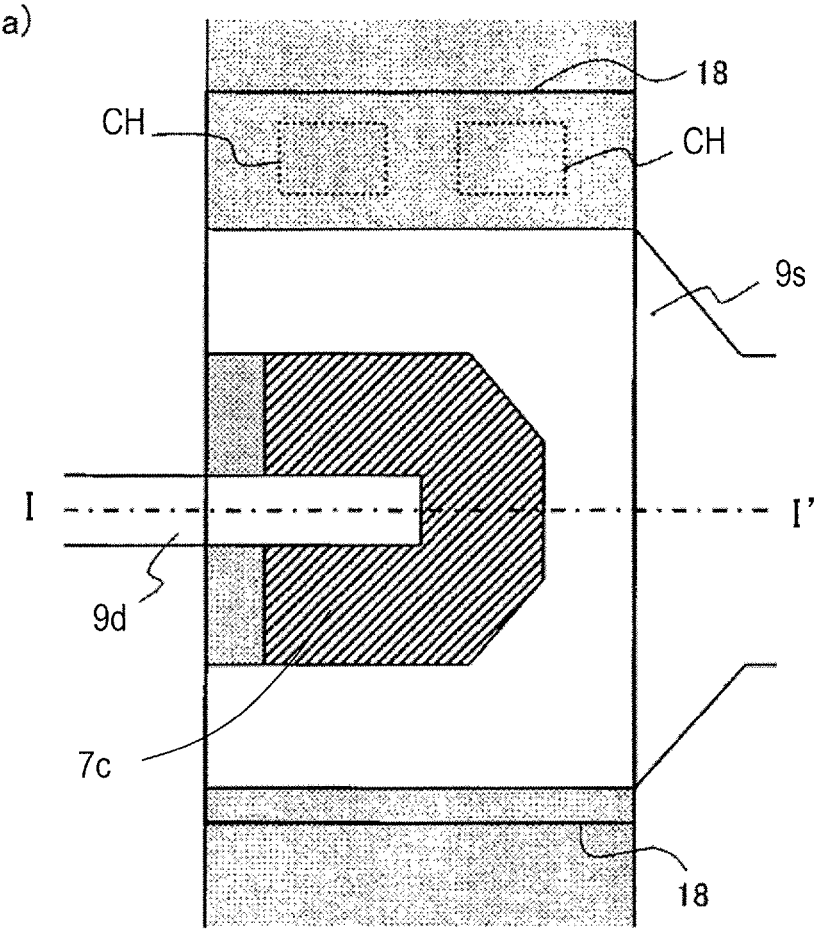
FIGS. 21(*a*) and (*b*) are a plan view and cross-sectional view illustrating the configuration of another memory transistor in the first embodiment.
Figure 21:
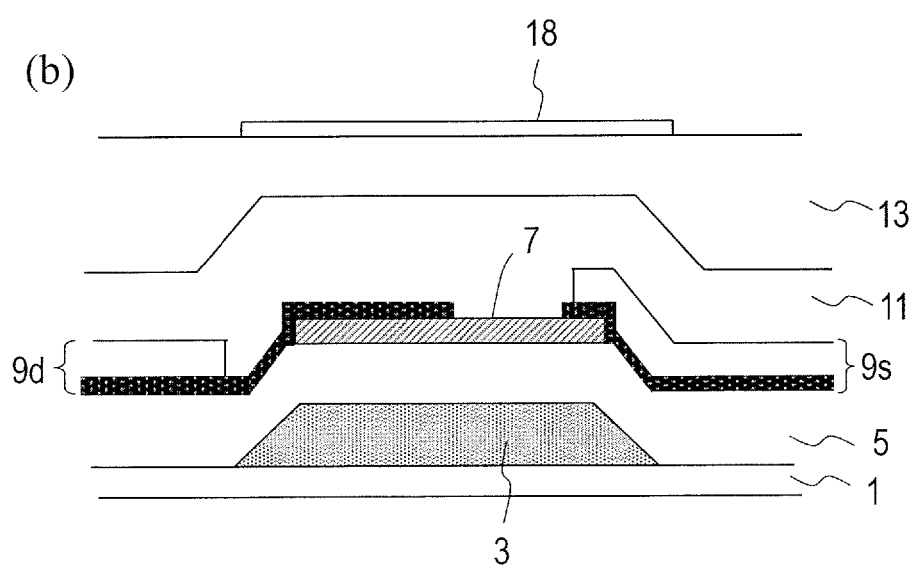

FIGS. 21(a) and 21(b) are a plan view and cross-sectional view illustrating the configuration of another memory transistor in the present embodiment. In this example, an upper gate electrode 18 is provided above the metal oxide layer 7 with interlayer insulating layers (here, the passivation film 11 and the organic insulating film 13) interposed therebetween. The upper gate electrode 18 is arranges so as to extend over at least the channel region 7c of the metal oxide layer 7 when viewed in a direction normal to the substrate 1. The upper gate electrode 18 may be a transparent electrode formed by a same transparent electrically-conductive film as that of the pixel electrode, for example. The upper gate electrode 18 may be connected to the gate electrode (gate wire) 3, which is on the substrate 1 side of the metal oxide layer 7, via a contact hole CH. Due to this arrangement, the another gate electrode 18 and the gate electrode 3 are at the same potential, and therefore, drain current Ids can be further increased due to the backgating effect. Providing the upper gate electrode 18 in the memory transistor in this way enables to increase the Joule heat and shorten the writing duration without greatly increasing gate voltage Vgs. Although in the example shown in FIG. 21 the upper gate electrode 18 is shown as a transparent electrode, it does not need to be a transparent electrode. Although the planar shape of the channel region 7c is a U-shape, it may be a rectangular shape or any other shape.

The memory transistor of the present embodiment may have an etch stop structure in which an etch stop layer is provided so as to be in contact with the surface of the channel region 7c as will be described later. Alternatively, the memory transistor may have a bottom contact structure in which the metal oxide layer 7 is provided on the source and drain electrodes and the lower surface of the metal oxide layer 7 is in contact with these electrodes.

Second Embodiment

Hereinafter, the second embodiment of the semiconductor device of the present invention is described. The semiconductor device of the present embodiment is different from the semiconductor device of the first embodiment in that it includes a memory transistor which has a protection layer as the etch stop on the metal oxide layer. The other components are the same.

Figure 22:
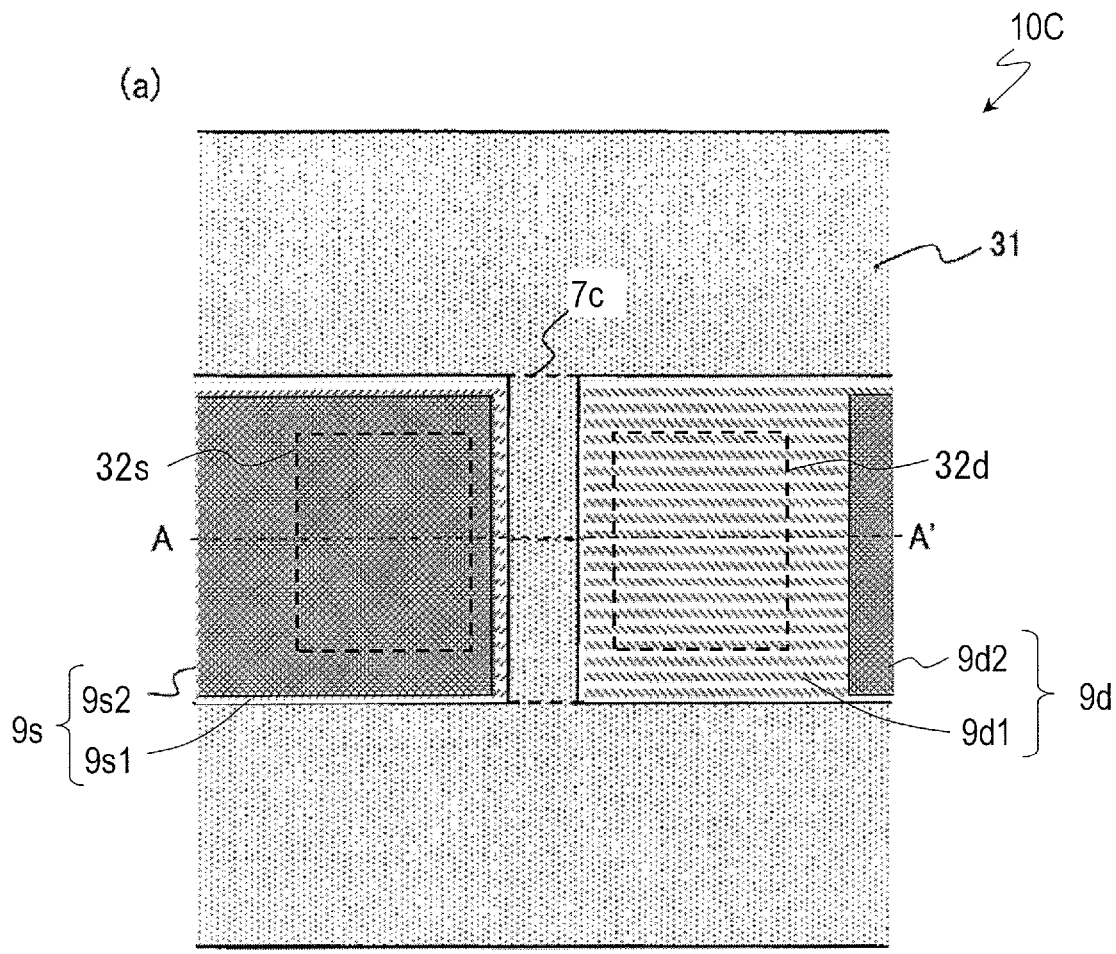
FIGS. 22(*a*) and (*b*) are a plan view and cross-sectional view showing a memory transistor 10C in a semiconductor device of the second embodiment.
Figure 22:
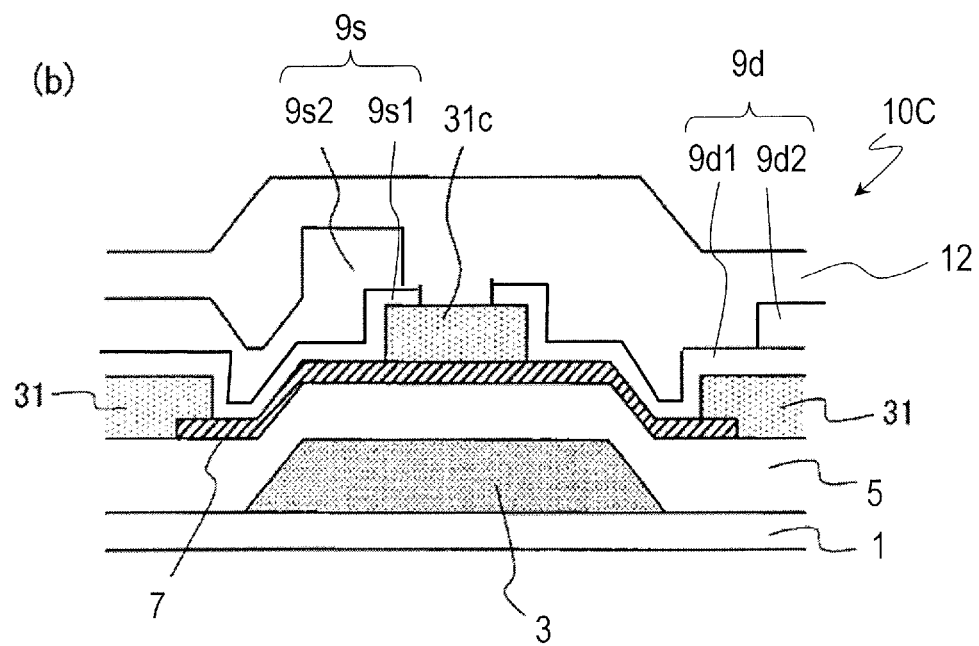
Figure 23:
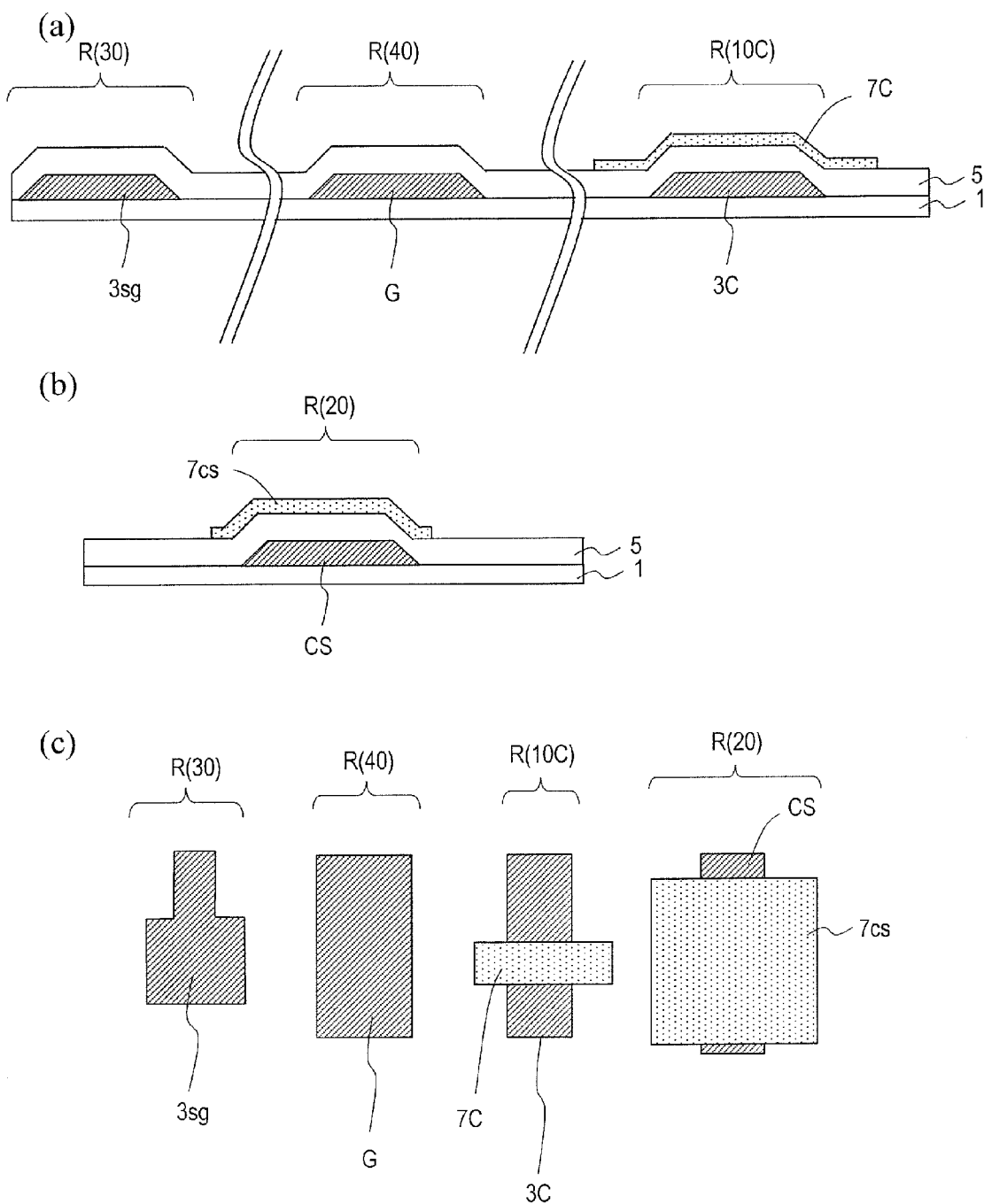
FIG. 23 Process diagrams for illustrating a manufacturing method of a semiconductor device (active matrix substrate 1003) of the second embodiment. (*a*) and (*b*) are cross-sectional views. (*c*) is a top view.
Figure 24:
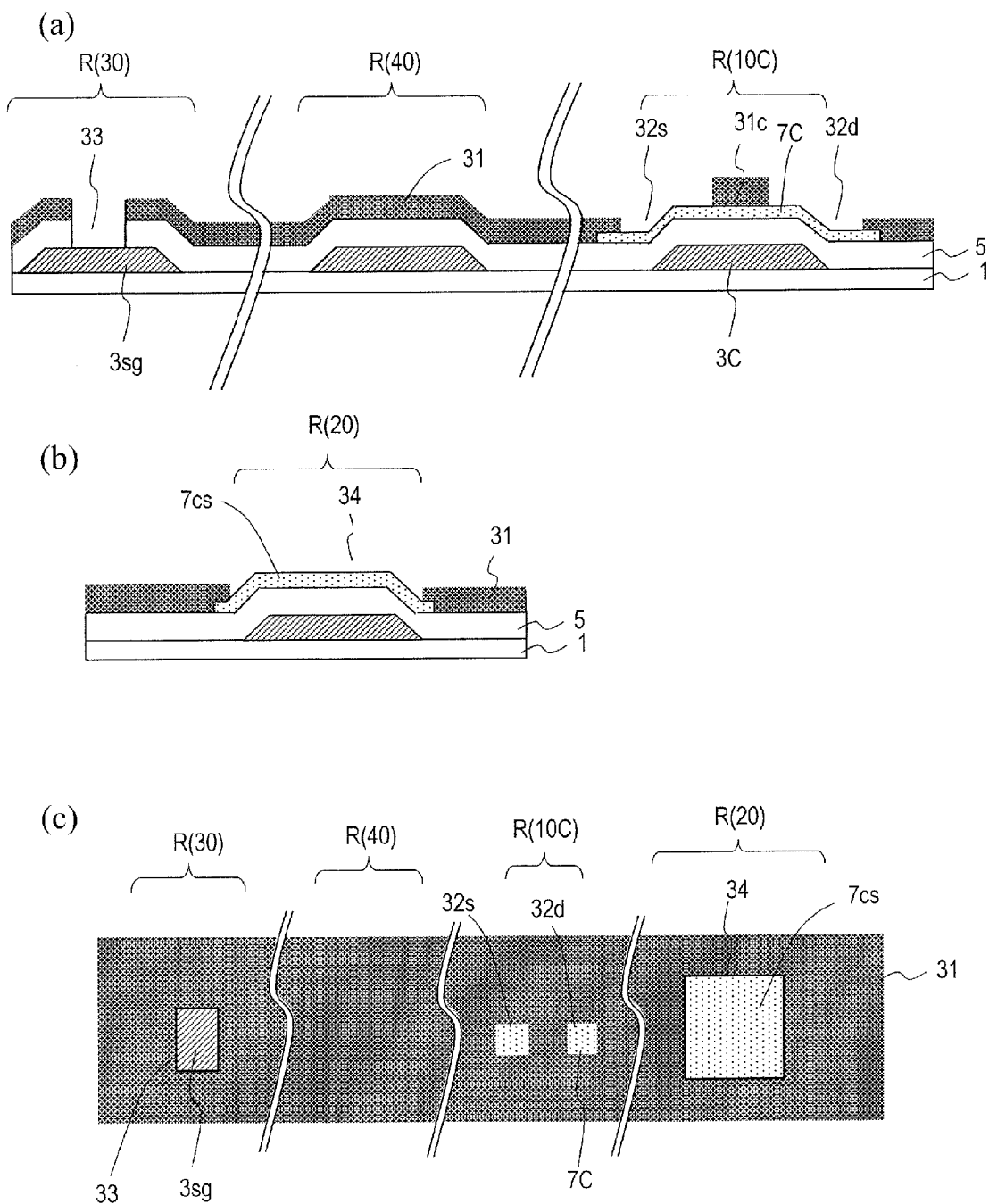
FIG. 24 Process diagrams for illustrating a manufacturing method of a semiconductor device (active matrix substrate 1003) of the second embodiment. (*a*) and (*b*) are cross-sectional views. (*c*) is a top view.
Figure 25:
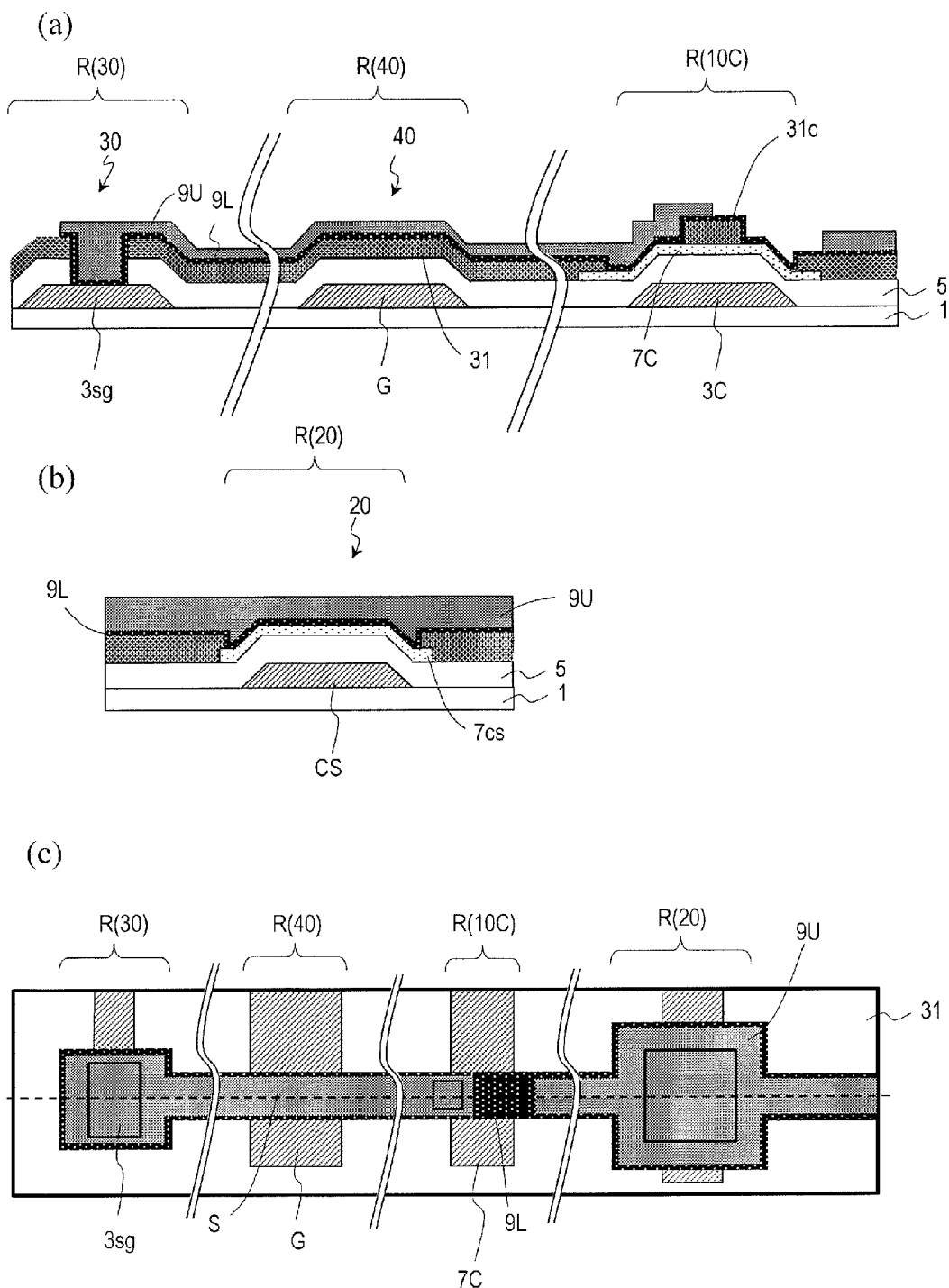
FIG. 25 Process diagrams for illustrating a manufacturing method of a semiconductor device (active matrix substrate 1003) of the second embodiment. (*a*) and (*b*) are cross-sectional views. (*c*) is a top view.
Figure 26:
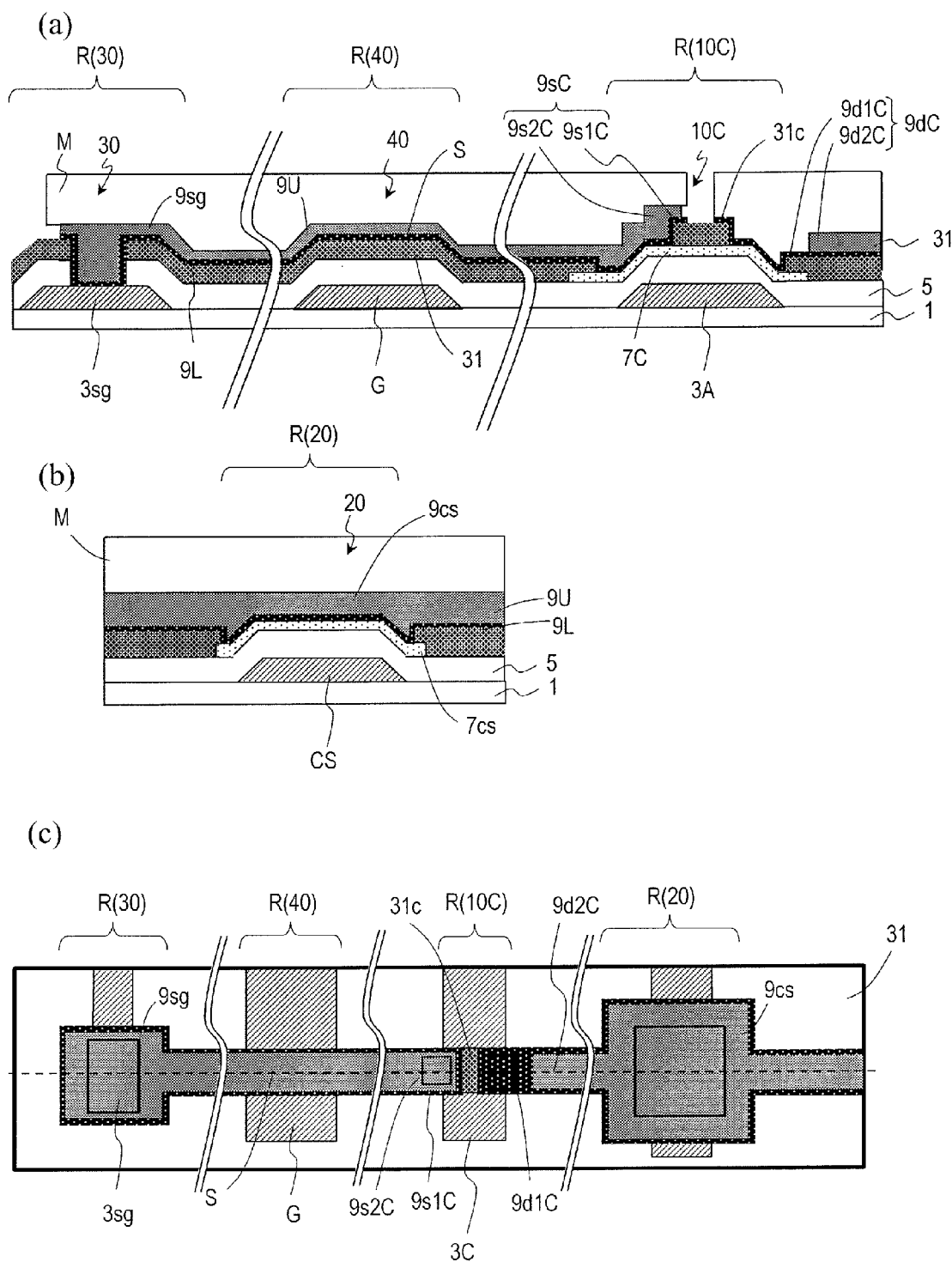
FIG. 26 Process diagrams for illustrating a manufacturing method of a semiconductor device (active matrix substrate 1003) of the second embodiment. (*a*) and (*b*) are cross-sectional views. (*c*) is a top view.
Figure 27:
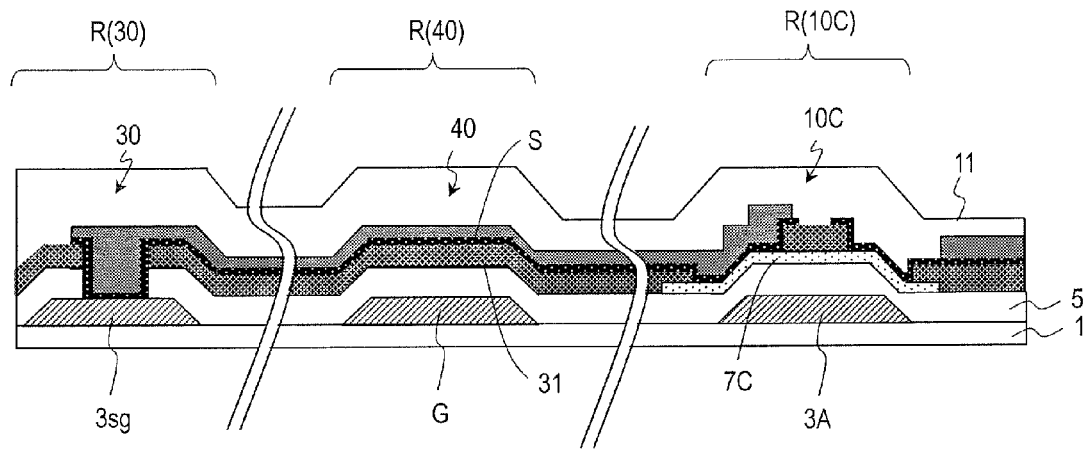
FIG. 27 Process diagrams for illustrating a manufacturing method of a semiconductor device (active matrix substrate 1003) of the second embodiment. (*a*) and (*b*) are cross-sectional views. (*c*) is a top view.
Figure 27:
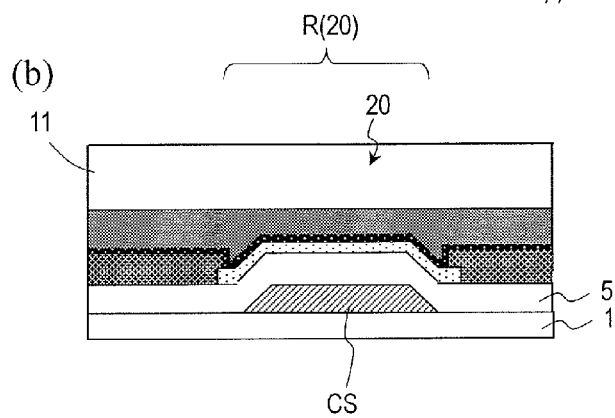
Figure 27:
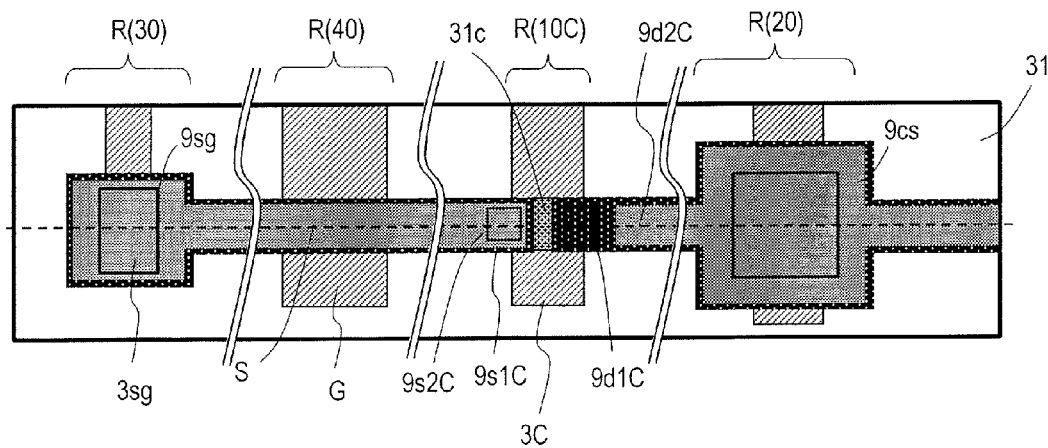
Figure 28:
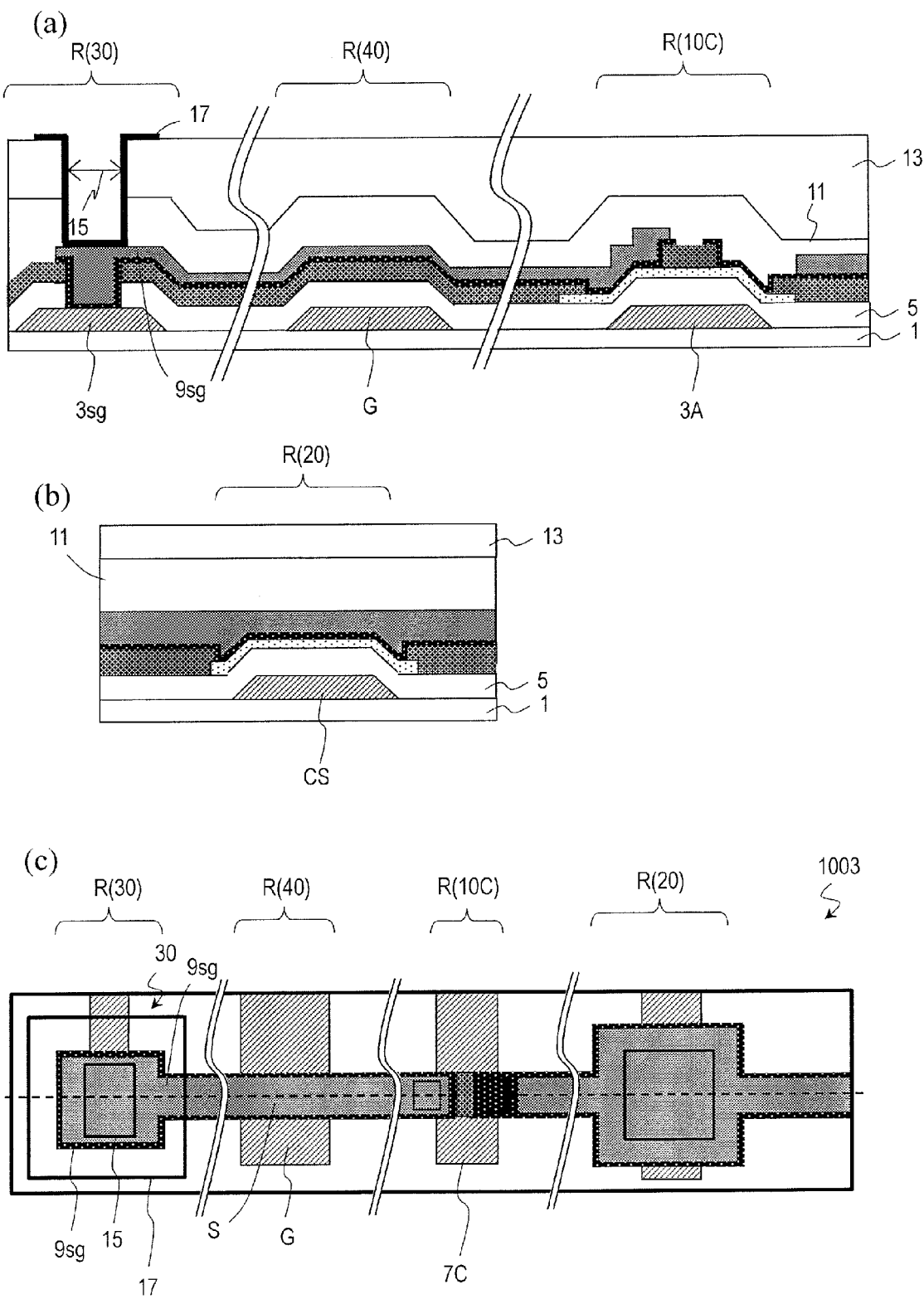
FIG. 28 Process diagrams for illustrating a manufacturing method of a semiconductor device (active matrix substrate 1003) of the second embodiment. (*a*) and (*b*) are cross-sectional views. (*c*) is a top view.

FIGS. 22(a) and 22(b) are a plan view and cross-sectional view showing an example of the configuration of a memory transistor 10C in the second embodiment. The cross section shown in FIG. 22(b) is a cross section taken along line A-A' of FIG. 22(a). In FIG. 22, elements which are equivalent to those of FIG. 1 are designated by the same reference numerals, and descriptions thereof are herein omitted.

The memory transistor 10C includes a protection layer 31 provided between the metal oxide layer 7 and the source wire layer. The protection layer 31 is in contact with at least the channel region 7c of the metal oxide layer 7. Part of the protection layer 31 which is in contact with the channel region 7c is referred to as "channel protection layer 31c". The width in the channel direction of the metal oxide layer 7 is greater than the width in the channel direction of the gate electrode 3. In this example, the protection layer 31 is arranged so as to cover the metal oxide layer 7. The protection layer 31 has openings 32s, 32d through which parts of the metal oxide layer 7 on both sides of the channel region 7c are exposed. The source electrode 9s and the drain electrode 9d are provided on the protection layer 31 and in the openings 32s, 32d, respectively, and are in contact with the metal oxide layer 7 in the openings 32s, 32d. As a result, a region of the metal oxide layer 7 which is in contact with the source electrode 9s forms a source contact region, and a region of the metal oxide layer 7 which is in contact with the drain electrode 9d forms a drain contact region.

In the memory transistor 10C, as in the first embodiment, part of the drain electrode 9d which extends over both the metal oxide layer 7 and the gate electrode 3 when viewed in a direction normal to the substrate 1 is formed by the first drain metal layer 9d1 and does not include the second drain metal layer 9d2. For example, as shown in the drawings, only the first drain metal layer 9d1 is provided in the opening 32d, and the second drain metal layer 9d2 does not need to be provided therein. In this case, the same effects as those of the first embodiment are obtained. Although the configuration of the source electrode 9s is not particularly limited, for example, both the first and second source metal layers 9s1, 9s2 may be provided in the opening 32s and overlap both the metal oxide layer 7 and the gate electrode 3 when viewed in a direction normal to the substrate 1. Although in FIG. 22 the planar shape of the channel region 7c is rectangular, it may be a U-shape such as shown in FIG. 1(b).

Next, a manufacturing method of the semiconductor device of the present embodiment is described with an example of an active matrix substrate with reference to the drawings.

FIG. 23 to FIG. 28 are process diagrams for illustrating an example of the manufacturing method of an active matrix substrate 1003. In respective drawings, (a) and (b) are cross-sectional views, and (c) is a top view. Here, the process of forming the memory transistor 10C, the capacitance portion 20, the gate-source contact portion 30 and the gate-source intersection 40 in the active matrix substrate 1003 is described.

First, as shown in FIGS. 23(a) to 23(c), an electrically-conductive film for the gate is formed on the substrate 1 and then patterned so as to form a gate wire layer which includes a gate connecting portion 3sg, a gate wire G, a gate electrode 3C, and a capacitance wire CS. Thereafter, a gate insulating film 5 is formed so as to cover the gate wire layer. Then, an oxide semiconductor film is formed on the gate insulating film 5 and patterned such that a metal oxide layer 7C is formed in the memory transistor formation region R(10C). Meanwhile, a semiconductor layer 7cs is formed in the capacitance portion formation region R(20) so as to extend over the capacitance wire CS with the gate insulating film 5 interposed therebetween. This embodiment is different from the previously-described embodiment in that the semiconductor layer 7cs is left in the capacitance portion formation region R(20). The material and thickness and the formation method of the respective layers are the same as those described in the first embodiment.

Then, as shown in FIGS. 24(a) to 24(c), an insulative protection film is formed on the gate insulating film 5, the metal oxide layer 7C, and the semiconductor layer 7cs and then patterned so as to obtain a protection layer 31. The protection layer 31 is provided at least on a region which is to be the channel region of the metal oxide layer 7C. Part of the protection layer 31 which is located on the channel region is referred to as "channel protection layer 31c".

In the patterning of the insulative protection film, the gate insulating film 5 underlying the insulative protection film is also etched away together. In this step, the metal oxide layer 7C and the semiconductor layer 7cs function as the etch stop, and therefore, parts of the gate insulating film 5 which are covered with these layers are not etched away. Here, by patterning, in the gate-source contact portion formation region R(30), an opening 33 through which the gate connecting portion 3sg is exposed is formed in the protection layer 31 and the gate insulating film 5. In the capacitance portion formation region R(20), an opening 34 through which the semiconductor layer 7cs is exposed is formed in the protection layer 31. Further, in the memory transistor formation region R(10C), on both sides of part of the metal oxide layer 7C which is to be the channel region 7cC, openings 32s, 32d are formed through which the metal oxide layer 7C is exposed.

The insulative protection film can be formed by, for example, plasma CVD or sputtering and patterned by a known dry etching method. After formation of the insulative protection film, annealing is performed in air at 200-450° C. for about 30 minutes to 4 hours, for example. As the insulative protection film, for example, a single layer film, or a multilayer film consisting of two or more layers, selected from a silicon oxide film ($SiO_2$), a silicon nitride film (SiN), a silicon nitroxide film (SiNO), a silicon oxynitride film (SiON), aluminum oxide ($Al_2O_3$), and tantalum oxide ($Ta_2O_5$) may be used. In the present embodiment, as an example, a $SiO_2$ film which has a thickness of 10 nm to 500 nm is used.

Then, as shown in FIGS. 25(a) to 25(c), an electrically-conductive film for the source is formed on the protection layer 31 and in the openings of the protection layer 31 and then subjected to the first patterning. As the electrically-conductive film for the source, a multilayer film is formed which includes a first metal film 9L as the lower layer and a second metal film 9U as the upper layer.

Figure 10:
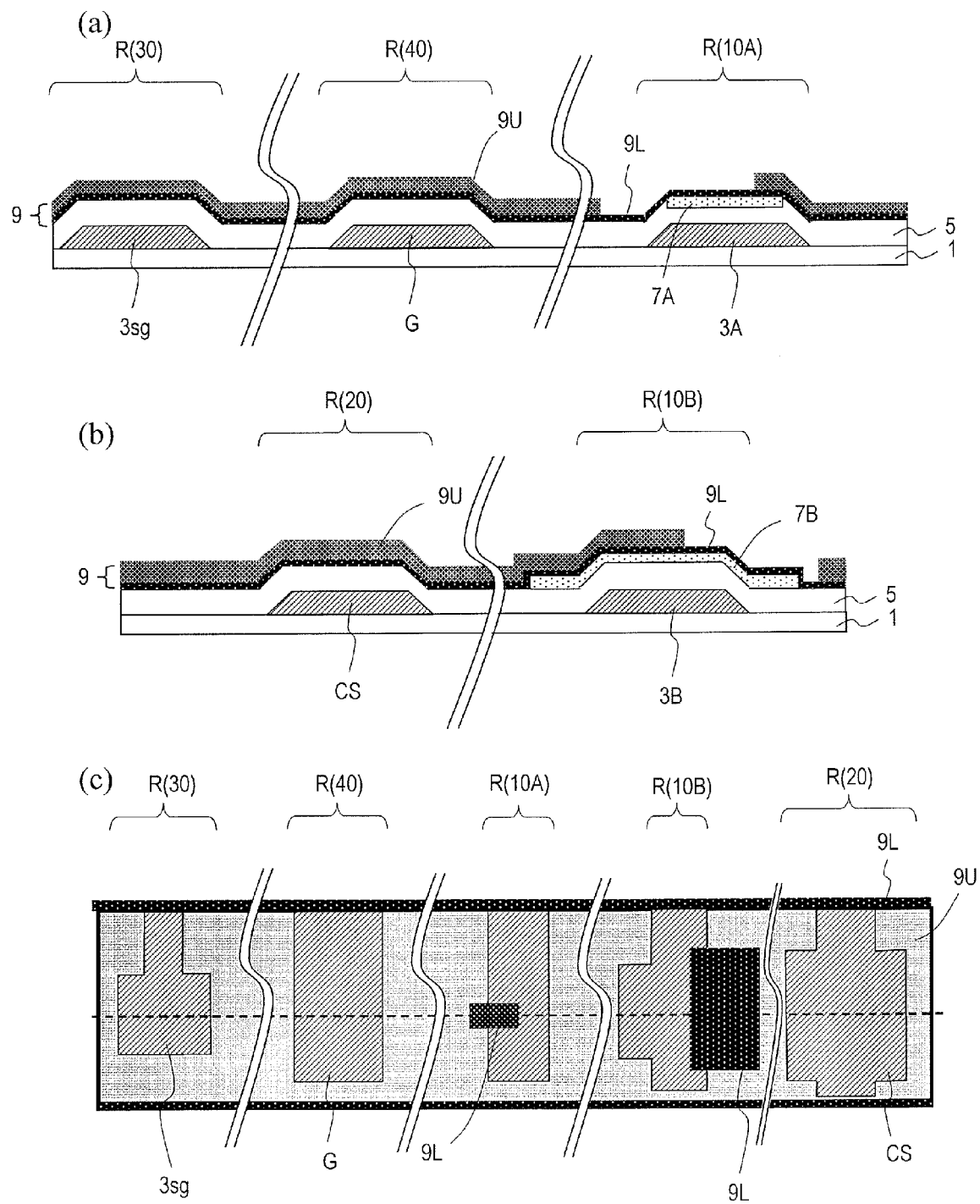
FIG. 10 Process diagrams for illustrating a manufacturing method of a semiconductor device (active matrix substrate 1002) of the first embodiment. (a) and (b) are cross-sectional views. (c) is a top view.
Figure 11:
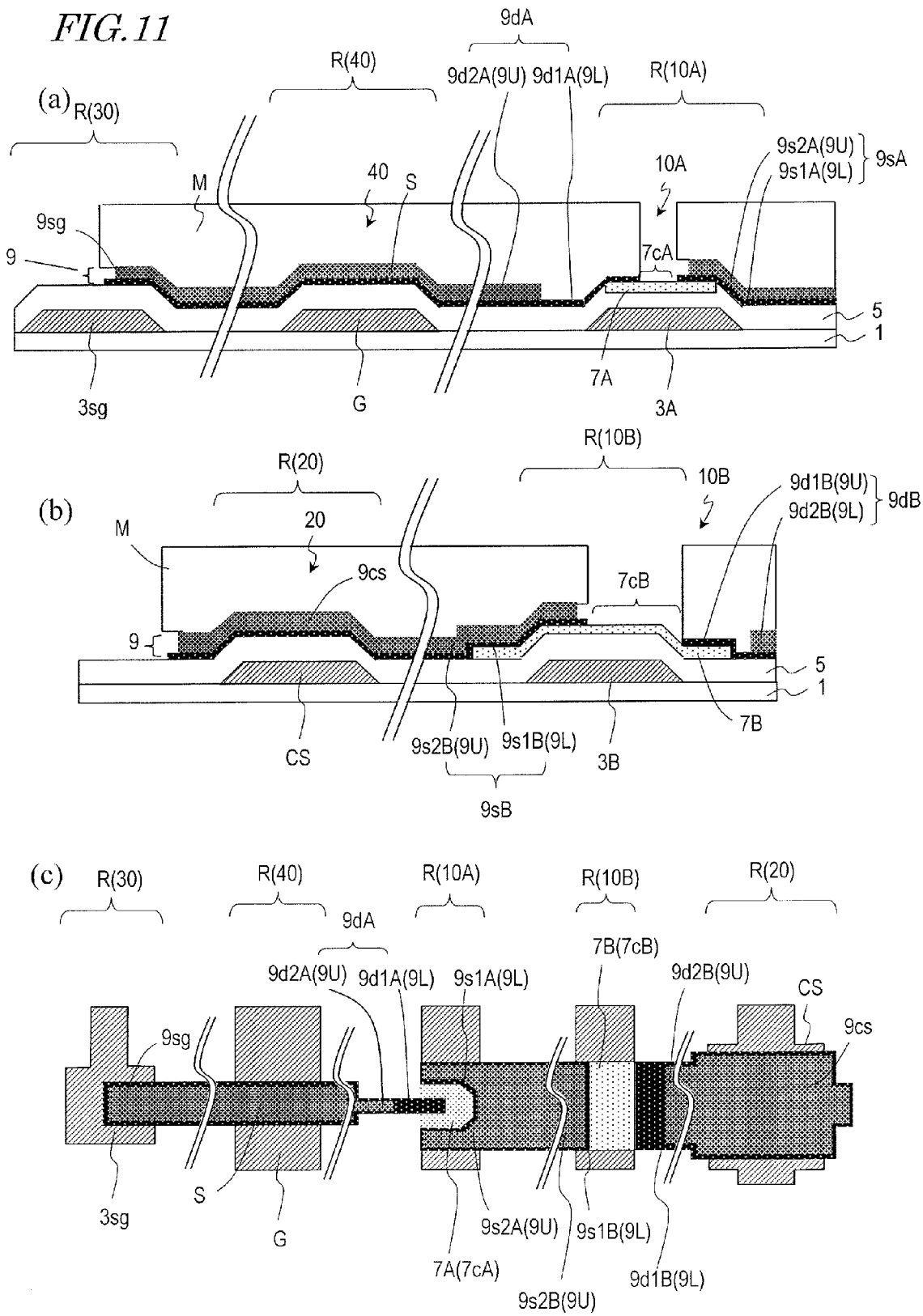
FIG. 11 Process diagrams for illustrating a manufacturing method of a semiconductor device (active matrix substrate 1002) of the first embodiment. (a) and (b) are cross-sectional views. (c) is a top view.
Figure 12:
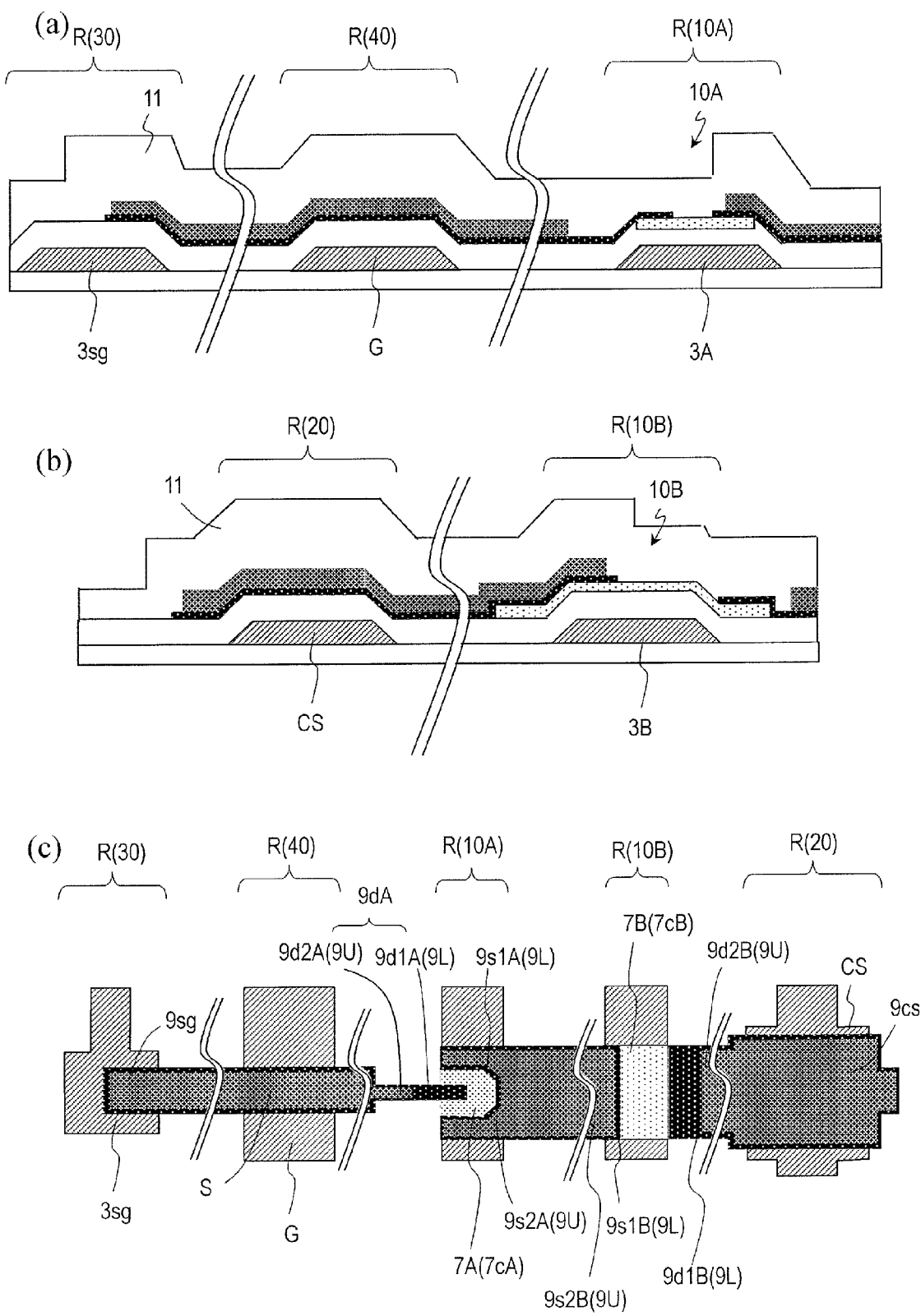
FIG. 12 Process diagrams for illustrating a manufacturing method of a semiconductor device (active matrix substrate 1002) of the first embodiment. (a) and (b) are cross-sectional views. (c) is a top view.
Figure 13:
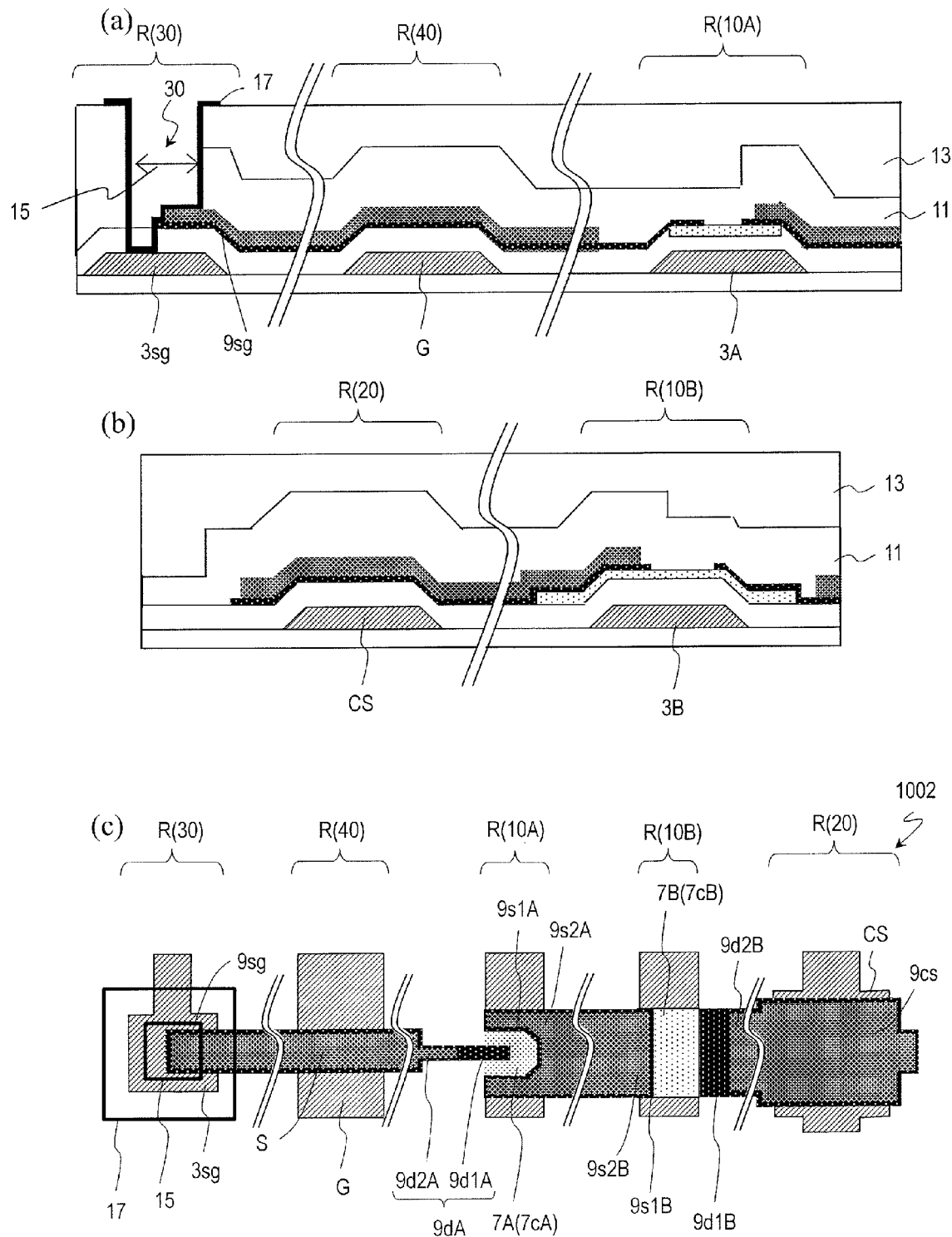
FIG. 13 Process diagrams for illustrating a manufacturing method of a semiconductor device (active matrix substrate 1002) of the first embodiment. (a) and (b) are cross-sectional views. (c) is a top view.

The materials of the first metal film 9L and the second metal film 9L are the same as those previously described with reference to FIG. 10. Here, a Ti film (thickness: 10-100 nm) as the first metal film 9L and an Al film (thickness: 50-400 nm) as the second metal film 9U are formed in succession by, for example, sputtering. As a result, an electrically-conductive film for the source which has a two-layer structure of Ti film-Al film is obtained.

The first patterning is performed on this electrically-conductive film for the source by wet etching, for example. The wet etching is performed under conditions such that only the second metal film 9U is etched while the first metal film 9L is not etched. Thereby, openings are formed in the second metal film 9U so as to be present over part of the metal oxide layer 7C of the memory transistor 10C. The openings are provided over a portion including the entirety of a region which is to be the drain contact region in the metal oxide layer 7C and a part of a region which is to be the channel region. Through these openings, the first metal film 9L is exposed.

Then, a resist layer M is formed on the electrically-conductive film for the source. Thereafter, the second patterning is performed on the electrically-conductive film for the source. In the second patterning, for example, with the use of the resist layer M as the mask, the second metal film 9U is removed by wet etching, and then, the first metal film 9L is removed by dry etching. Thereby, parts of the first and second metal films 9L, 9U which are present over regions which are to be the channel region of the metal oxide layer 7C are removed (source-drain separation).

Through the above-described process, as shown in FIGS. 26(a) to 26(c), a source electrode 9sC and a drain electrode 9dC are formed in the memory transistor formation region R(10C), a source connecting portion 9sg is formed in the gate-source contact portion formation region R(30), a source wire S is formed in the gate-source intersection formation region R(40), and a capacitance electrode 9cs is formed in the capacitance portion formation region R(20). A layer which includes these wires and electrodes formed by the electrically-conductive film for the source is referred to as "source wire layer".

Here, the second metal film 9U is patterned by wet etching, and therefore, the edge of the second metal film 9U in the source wire layer is at an inner position relative to the edge of the resist layer M when viewed in a direction normal to the substrate 1. Meanwhile, the first metal film 9L is patterned by dry etching, and therefore, the edge of the first metal film 9L and the edge of the resist layer M are coincident with each other when viewed in a direction normal to the substrate 1. Therefore, when the source wire layer is viewed in a direction normal to the substrate 1, the second metal film 9U is present inside the contour of the first metal film 9L. In a cross section, the edge of the second metal film 9U is present on the first metal film 9L. In the first patterning, part of the second metal film 9U extending over a region which is to be the drain contact region is removed, and therefore, only the first metal film 9L remains over the drain contact region of the metal oxide layer 7C. A region of the metal oxide layer 7C which overlaps the corresponding gate electrode 3C and which are present between the source electrode 9sC and the drain electrode 9dC is a channel region 7cC. In the present embodiment, for example, in the memory transistor formation region R(10A), the source electrode 9sC and the drain electrode 9dC are arranged such that the channel region 7cA has a rectangular shape when viewed in a direction normal to the substrate 1.

In this way, the memory transistor 10C is formed. In the memory transistor 10C, as in the first embodiment, part of the drain electrode 9d which extends over both the metal oxide layer 7C and the gate electrode C is formed only by the first metal film 9L and does not include the second metal film 9U. Meanwhile, part of the source electrode 9sC which extends over both the metal oxide layer 7C and the gate electrode 3C has a multilayer structure which includes the first metal film 9L and the second metal film 9U.

In the gate-source contact formation region R(30), a source connecting portion 9sg is obtained which is in contact with the gate connecting portion 3sg in the opening 33. Meanwhile, a source wire S is formed in the gate-source intersection formation region R(40). In the capacitance portion formation region R(20), a capacitance electrode 9cs is formed so as to be in contact with the semiconductor layer 7cs in the opening 34. In this way, the gate-source contact portion 30 is formed in the gate-source contact portion formation region R(30), the gate-source intersection 40 is formed in the gate-source intersection formation region R(40), the capacitance portion 20 is formed in the capacitance portion formation region R(20), and the memory transistors 10A, 10B are formed in the memory transistor formation regions R(10A, 10B).

Note that, although not shown, the pixel transistor 10T (see FIGS. 5(a) and 5(b)) can also be manufactured through a common process together with the memory transistor 10C. In the pixel transistor 10T, the second metal film 9U of the drain electrode may also be provided on the metal oxide layer 7.

Then, as shown in FIG. 27 and FIGS. 28(a) to 28(c), a protection layer (passivation film) 11, an organic insulating film 13 of a photosensitive resin or the like, and an upper electrically-conductive layer 17 are formed. First, the protection film 11 and the organic insulating film 13 are formed in this order in the same way as that previously described in the first embodiment. Then, an opening is formed in part of the organic insulating film 13 extending over the gate-source contact portion formation region R(30). Thereafter, etching is performed on the passivation film 11 using the organic insulating film 13 as a mask. Thereby, a contact hole 15 is obtained through which the source connecting portion 9sg is exposed. Then, an electrically-conductive film is formed in the contact hole 15 and on the organic insulating film 13 and then patterned. Thereby, in the gate-source contact portion formation region R(30), an upper electrically-conductive layer 17 is obtained which is in contact with the source connecting portion 9sg in the contact hole 15. The material, thickness, and formation method of the protection film 11, the organic insulating film 13 and the electrically-conductive film are the same as those of these films which have been described in the first embodiment. In this way, the active matrix substrate 1003 is obtained.

The memory transistor 10C of the present embodiment has the etch stop layer (etch stop structure) and therefore has the following advantages over a transistor which does not have an etch stop layer (channel-etch structure).

In the present embodiment, an etching step of the electrically-conductive film for the source is performed for separation of the source and the drain with the channel region 7cC being covered with the channel protection layer 31c. Therefore, damage to the channel region 7cC which is caused by the etching can be reduced as compared with a thin film transistor which has a channel-etch structure. Thus, variation of the electric characteristics of the memory transistor 10C can be improved. Further, the magnitude of the variation of the electric characteristics which is attributed to the electrical stress can be reduced. Further, in the gate-source contact portion 30, it is possible that the gate connecting portion 3sg and the source connecting portion 9sg are in direct contact with each other. Thus, the size of the gate-source contact portion 30 can be reduced, and accordingly, the circuit area can also be reduced.

Third Embodiment

Hereinafter, the third embodiment of the semiconductor device of the present invention is described. The semiconductor device of the present embodiment is different from the semiconductor device of the first embodiment in that it includes a memory transistor 10D of a bottom contact structure which has an active layer on source and drain electrodes. The other components are the same.

Figure 29:
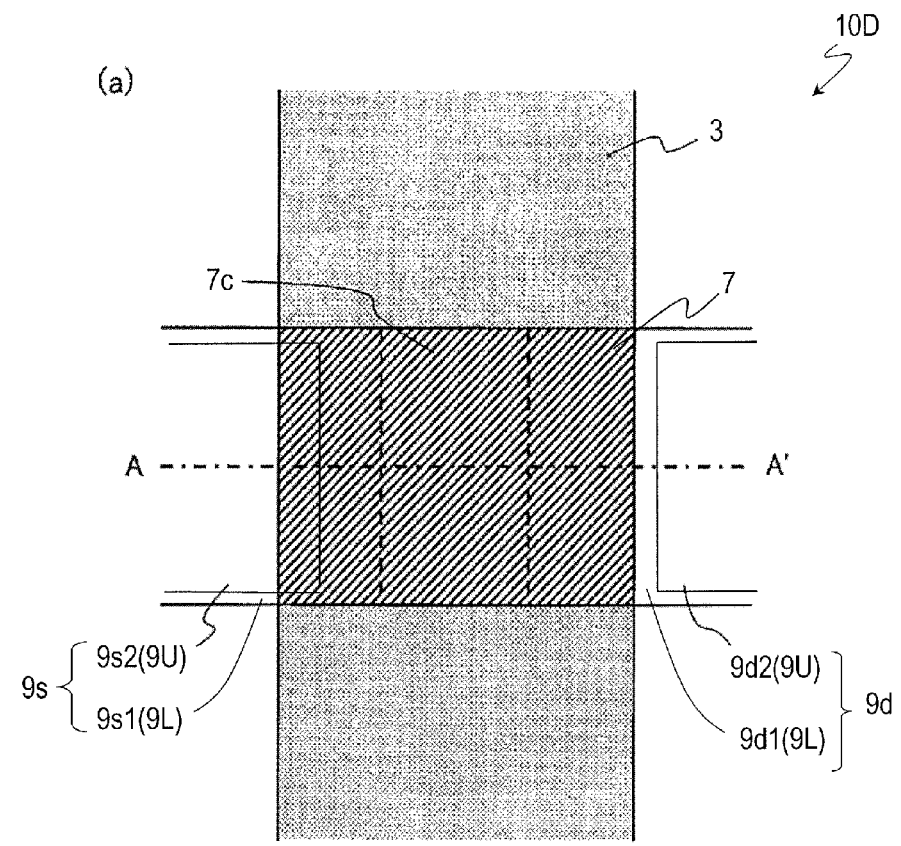
FIGS. 29(*a*) and (*b*) are a plan view and cross-sectional view showing a memory transistor 10D in a semiconductor device of the third embodiment.
Figure 29:
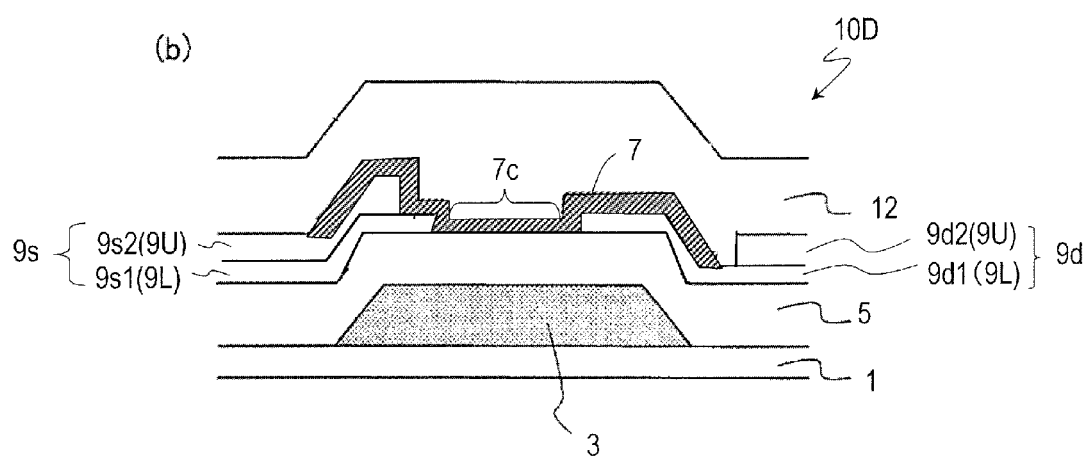
Figure 30:
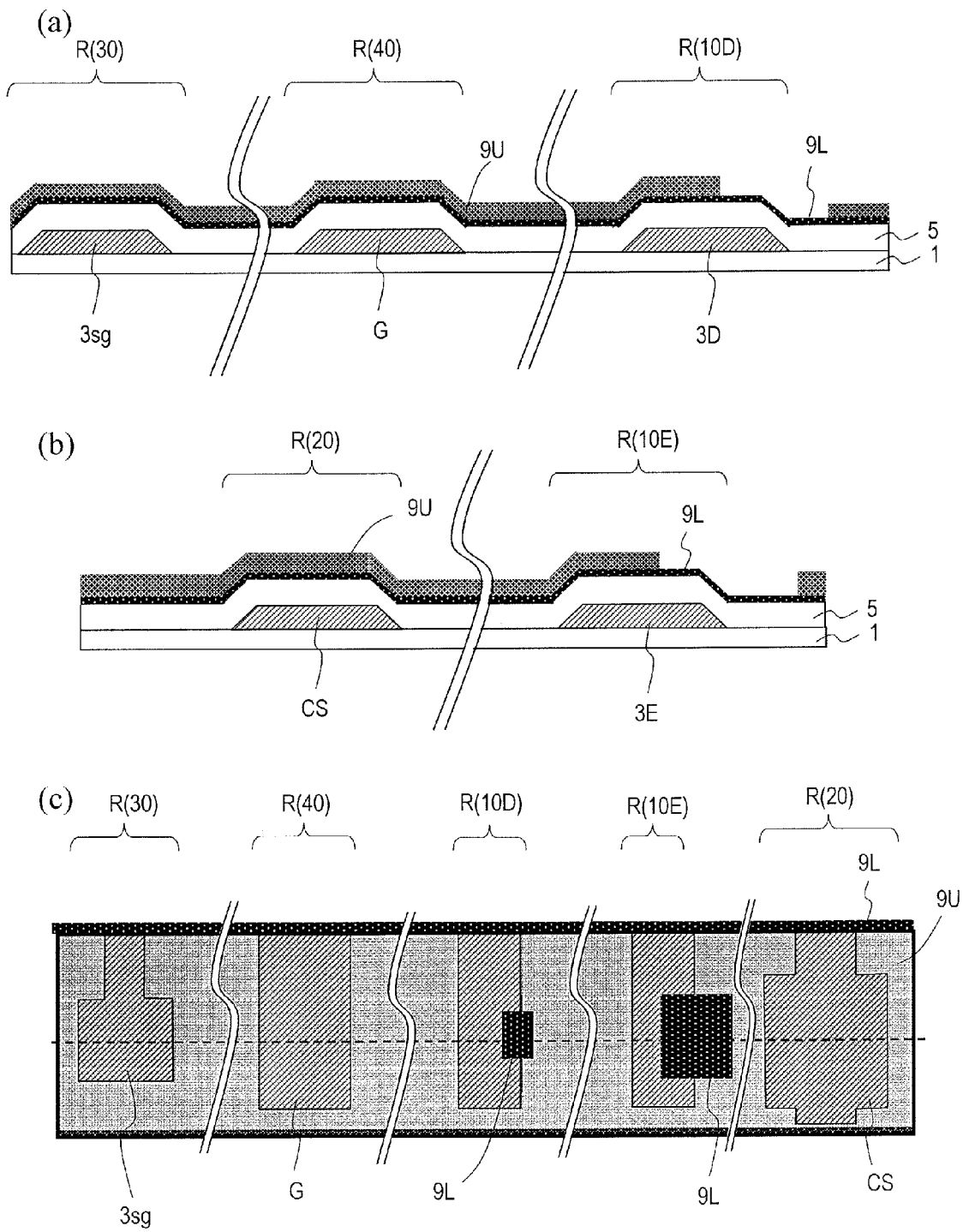
FIG. 30 Process diagrams for illustrating a manufacturing method of a semiconductor device (active matrix substrate 1004) of the third embodiment. (*a*) and (*b*) are cross-sectional views. (*c*) is a top view.
Figure 31:
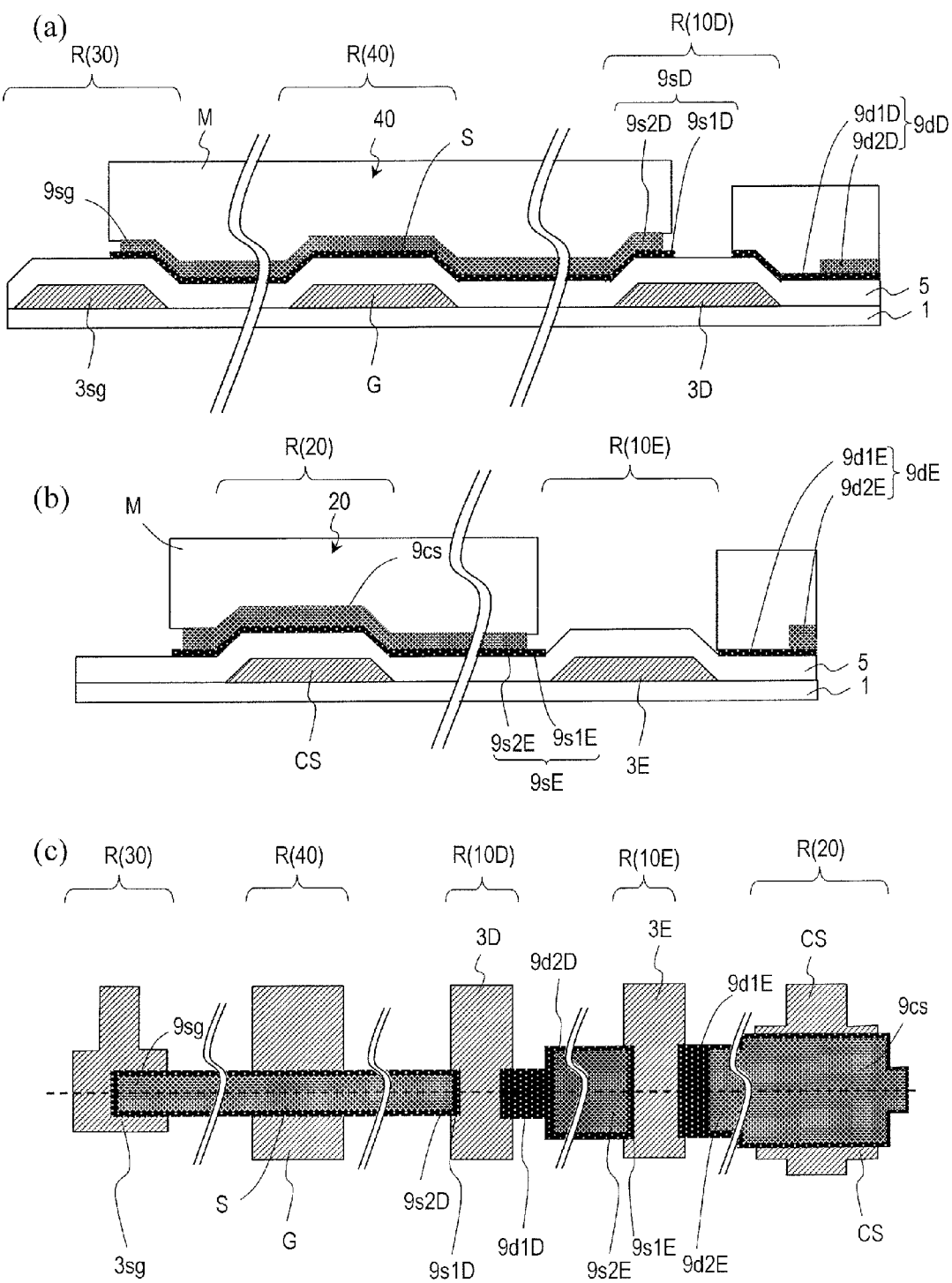
FIG. 31 Process diagrams for illustrating a manufacturing method of a semiconductor device (active matrix substrate 1004) of the third embodiment. (*a*) and (*b*) are cross-sectional views. (*c*) is a top view.
Figure 32:
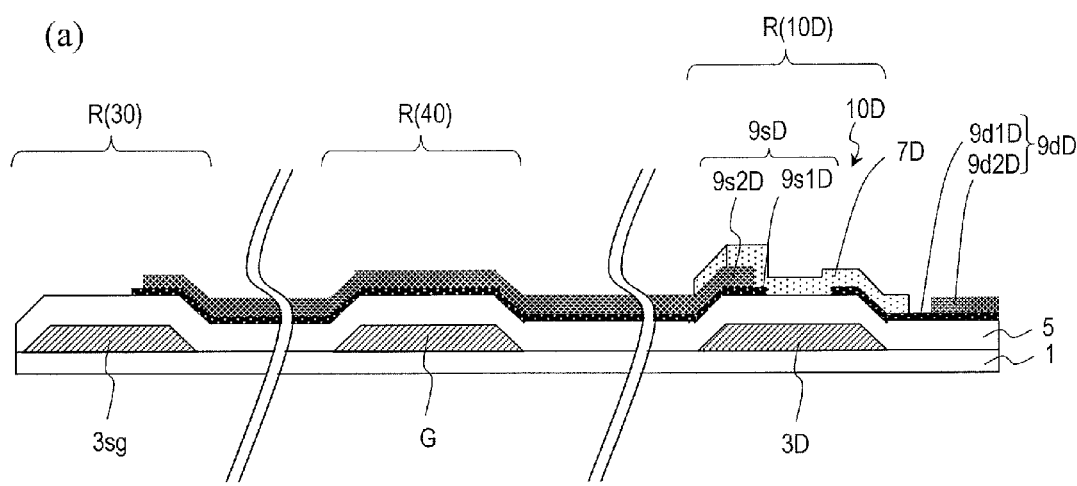
FIG. 32 Process diagrams for illustrating a manufacturing method of a semiconductor device (active matrix substrate 1004) of the third embodiment. (*a*) and (*b*) are cross-sectional views. (*c*) is a top view.
Figure 32:
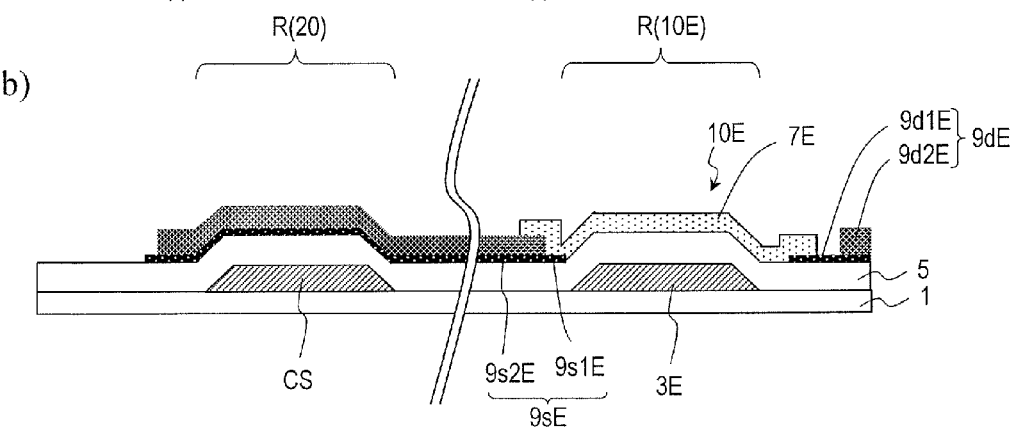
Figure 32:
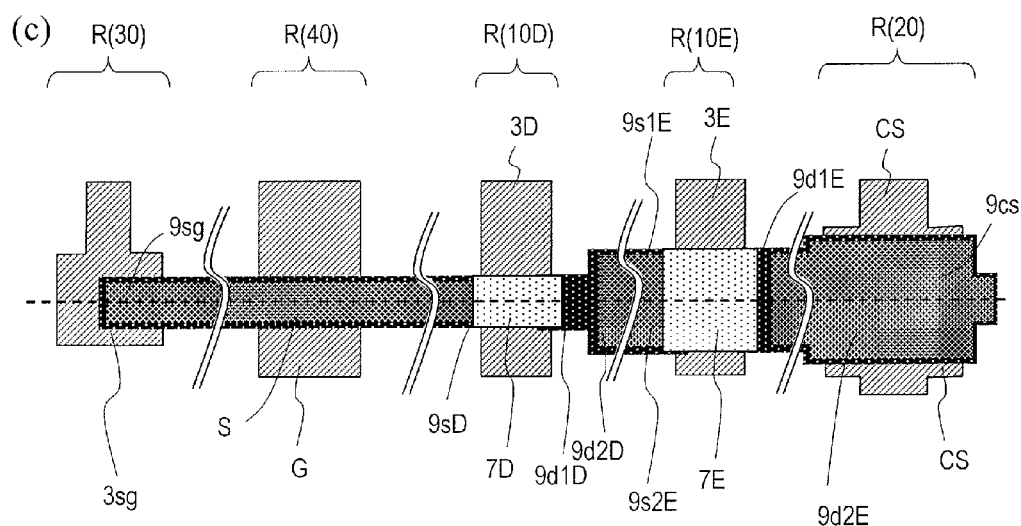
Figure 33:
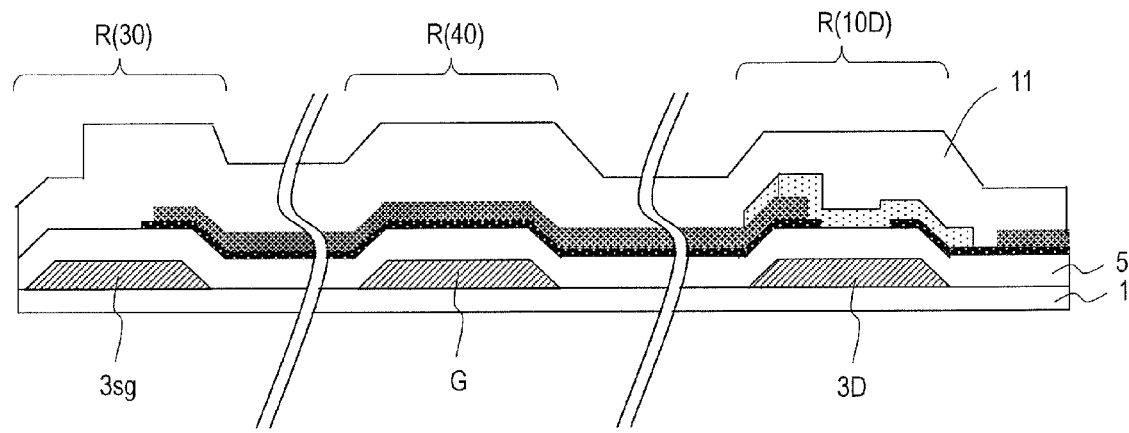
FIG. 33 Process diagrams for illustrating a manufacturing method of a semiconductor device (active matrix substrate 1004) of the third embodiment. (*a*) and (*b*) are cross-sectional views. (*c*) is a top view.
Figure 33:
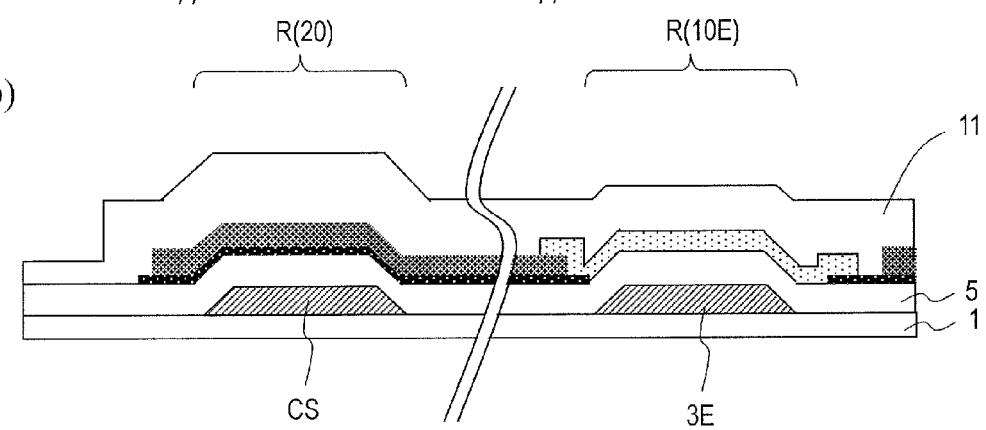
Figure 33:
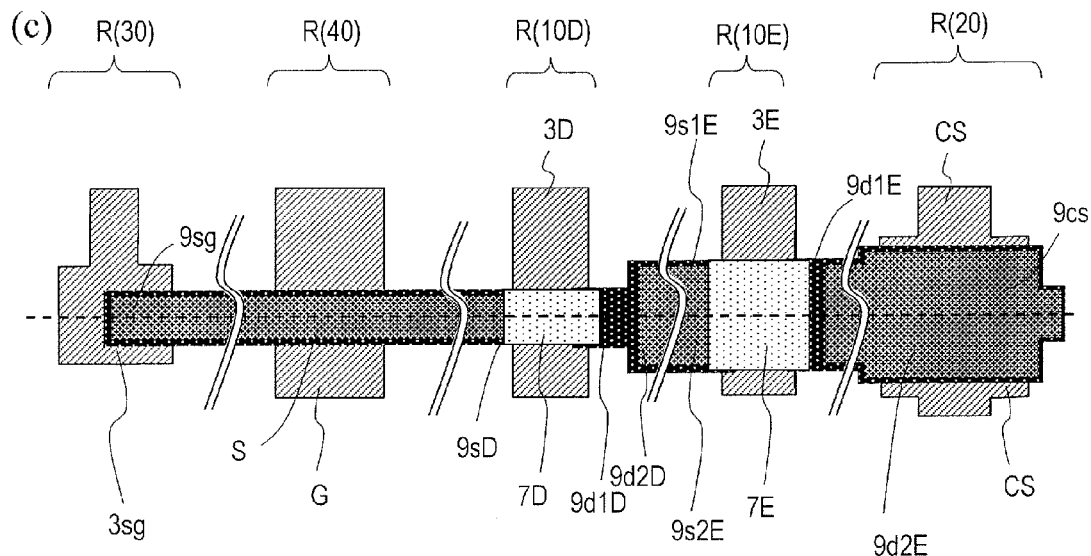
Figure 34:
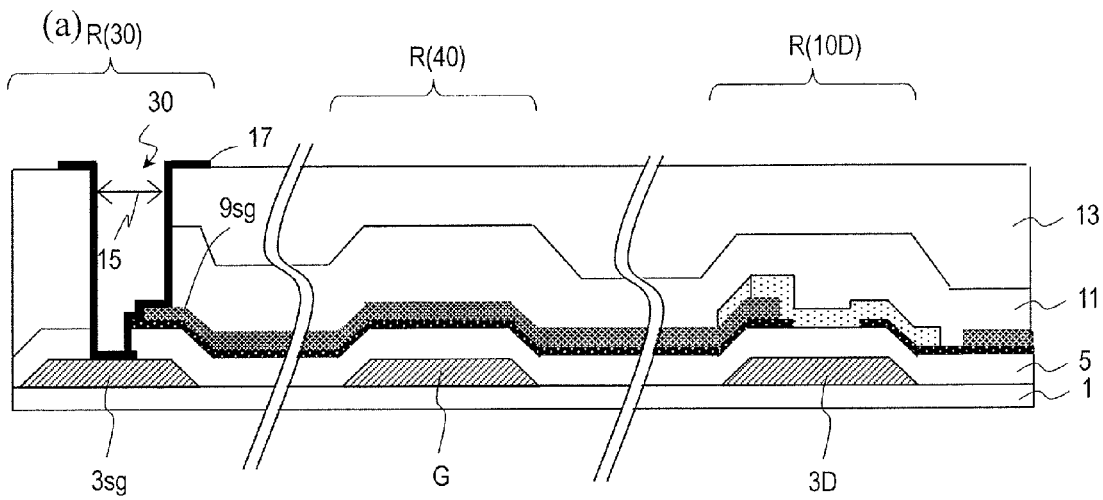
FIG. 34 Process diagrams for illustrating a manufacturing method of a semiconductor device (active matrix substrate 1004) of the third embodiment. (*a*) and (*b*) are cross-sectional views. (*c*) is a top view.
Figure 34:
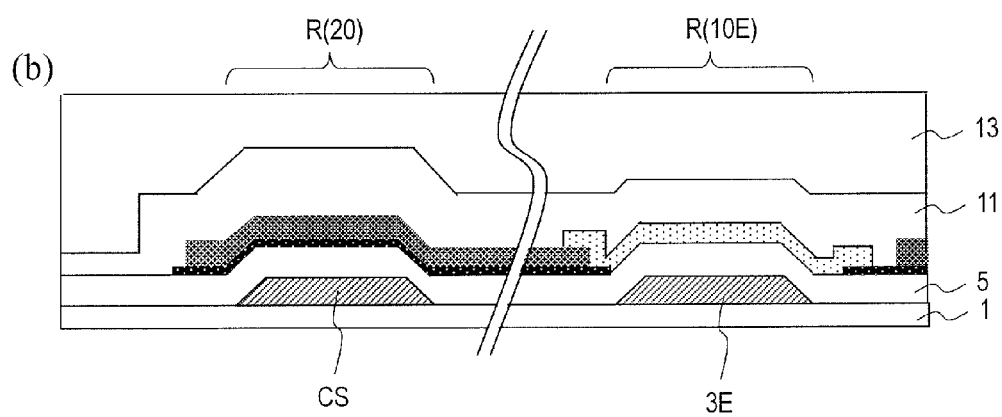
Figure 34:
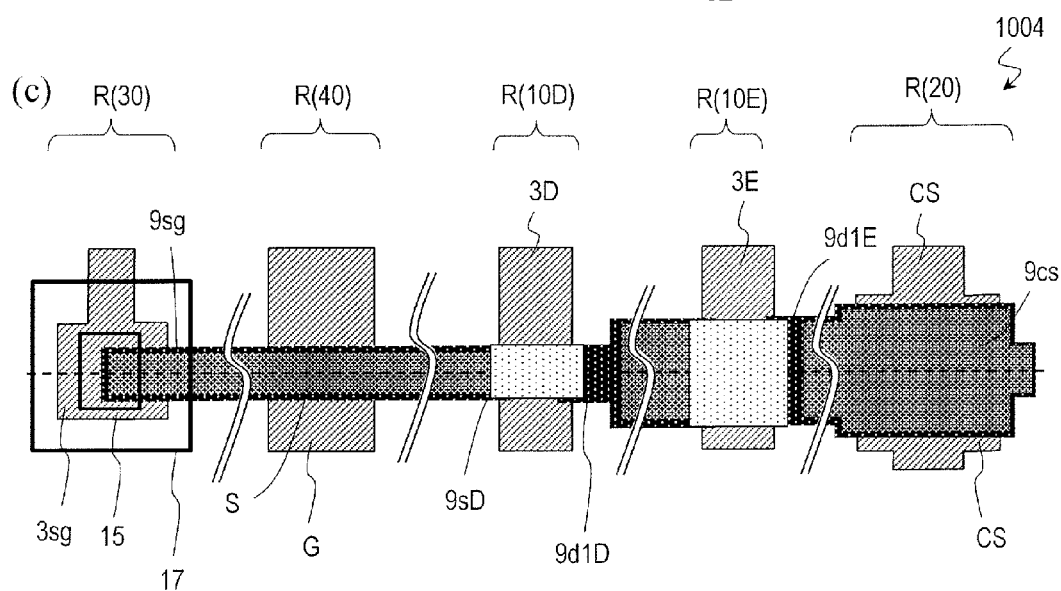

FIGS. 29(a) and 29(b) are a plan view and cross-sectional view showing an example of the configuration of a memory transistor 10D in the third embodiment. The cross section shown in FIG. 29(b) is a cross section taken along line A-A' of FIG. 29(a). In FIG. 29, elements which are equivalent to those of FIG. 1 are designated by the same reference numerals, and descriptions thereof are herein omitted.

In the memory transistor 10D, a source electrode 9s and a drain electrode 9d are provided on a gate insulating film 5 that covers a gate electrode 3 such that the source electrode 9s and the drain electrode 9d are spaced away from each other. On the source electrode 9s and the drain electrode 9d, a metal oxide layer 7 is provided. The metal oxide layer 7 is arranged so as to be in contact with the gate insulating film 5 which is present between the source electrode 9s and the drain electrode 9d and with the upper surfaces and lateral surfaces of the source electrode 9s and the drain electrode 9d. Part of the metal oxide layer 7 which extends over the gate electrode 3 and which is present between the source electrode 9s and the drain electrode 9d when viewed in a direction normal to the substrate 1 forms a channel region 7c. Although in FIG. 29 the planar shape of the channel region 7c is rectangular, it may be a U-shape such as shown in FIG. 1(b).

In the present embodiment, part of the drain electrode 9d which extends over both the metal oxide layer 7 and the gate electrode 3 when viewed in a direction normal to the substrate 1 is formed by the first drain metal layer 9d1 and does not include the second drain metal layer 9d2. Meanwhile, part of the source electrode 9s which extends over both the metal oxide layer 7 and the gate electrode 3 includes the first and second source metal layers 9s1, 9s2. Due to such a configuration, the same effects as those of the first embodiment are obtained.

As shown in the drawings, the first drain metal layer 9d1, the first source metal layer 9s1, and the second source metal layer 9s2 may be in contact with the lower surface of the metal oxide layer 7 (bottom contact structure). However, it is preferred that the second drain metal layer 9d2 is not in contact with the lower surface of the metal oxide layer 7.

Next, a manufacturing method of the semiconductor device of the present embodiment is described with an example of an active matrix substrate with reference to the drawings.

FIG. 30 to FIG. 34 are process diagrams for illustrating an example of the manufacturing method of an active matrix substrate. In respective drawings, (a) and (b) are cross-sectional views, and (c) is a top view. Here, the process of forming the memory transistors 10D and 10E, the capacitance portion 20, the gate-source contact portion 30 and the gate-source intersection 40 in the active matrix substrate is described. Note that the active matrix substrate of the present embodiment only needs to include either one of the two types of memory transistors 10D and 10E and does not need to include both of them.

First, as shown in FIGS. 30(a) to 30(c), an electrically-conductive film for the gate is formed on the substrate 1 and then patterned so as to form a gate wire layer which includes a gate connecting portion 3sg, a gate wire G, gate electrodes 3D and 3E, and a capacitance wire CS. Thereafter, a gate insulating film 5 is formed so as to cover the gate wire layer.

Then, a multilayer film which includes a first metal film 9L as the lower layer and a second metal film 9U as the upper layer is formed as the electrically-conductive film for the source on the gate insulating film 5 and then subjected to the first patterning.

The materials of the first metal film 9L and the second metal film 9U are the same as those previously described with reference to FIG. 10. Here, a Ti film (thickness: 10-100 nm) as the first metal film 9L and an Al film (thickness: 50-400 nm) as the second metal film 9U are formed in succession by, for example, sputtering. As a result, an electrically-conductive film for the source which has a two-layer structure of Ti film-Al film is obtained.

The first patterning is performed on this electrically-conductive film for the source by wet etching, for example. The wet etching is performed under conditions such that only the second metal film 9U is etched while the first metal film 9L is not etched. Thereby, openings are formed in parts of the second metal film 9U which are present above the gate electrodes 3D, 3E. The openings are arranged so as to correspond to a portion including the entirety of a region which is to be the drain contact region of a metal oxide layer which is to be formed in a subsequent step and a part of a region which is to be the channel region. Through these openings, the first metal film 9L is exposed.

Then, on the electrically-conductive film for the source, a resist layer M which has openings over the gate electrodes 3D, 3E of the memory transistors 10D, 10E is formed. Thereafter, the second patterning is performed on the electrically-conductive film for the source. In the second patterning, for example, with the use of the resist layer M as the mask, the second metal film 9U is removed by wet etching, and then, the first metal film 9L is removed by dry etching. Thereby, in the memory transistor formation regions R(10D), R(10E), source electrodes 9sA, 9sB and drain electrodes 9dA, 9dB are formed of the electrically-conductive film for the source such that the source electrodes 9sA, 9sB and drain electrodes 9dA, 9dB are spaced away from each other (source-drain separation). Meanwhile, a source connecting portion 9sg is formed in the gate-source contact portion formation region R(30), a source wire S is formed in the gate-source intersection formation region R(40), and a capacitance electrode 9cs is formed in the capacitance portion formation region R(20). A layer which includes these wires and electrodes formed by the electrically-conductive film for the source is referred to as "source wire layer".

Then, as shown in FIGS. 32(a) to 32(c), an oxide semiconductor film is formed on the gate insulating film 5 and the source wire layer and then patterned. Thereby, metal oxide layers 7D, 7E are formed in the memory transistor formation regions R(10D), R(10E), respectively. The material, thickness, and formation method of the oxide semiconductor film are the same as those of the previously-described embodiments.

The metal oxide layers 7D, 7E are arranged so as to be in contact with the gate insulating film 5 which is present between the source electrodes 9sA, 7sB and the drain electrodes 9dA, 7dB and with the upper surfaces and lateral surfaces of the source electrodes 9sA, 7sB and the drain electrodes 9dA, 7dB. In this example, the metal oxide layer 7D is patterned so as to be in contact with the first drain metal layer 9d1D of the drain electrode 9dD and so as not to be in contact with the second drain metal layer 9d2D. It may be in contact with the second source metal layer 9s2D of the source electrode 9sD. The same applies to the metal oxide layer 7E. Thus, when viewed in a direction normal to the substrate 1, parts of the drain electrodes 9dD, 9dE which extend over both the gate electrodes 3D, 3E and the metal oxide layers 7D, 7E do not include the second drain metal layer 9d2D, 9d2E, and therefore, the same effects as those of the previously-described embodiments are achieved. In this way, the memory transistors 10D, 10E are formed.

In the present embodiment, the metal oxide layers 7D, 7E are formed after the etching step of the electrically-conductive film for the source. Therefore, damage to the metal oxide layers 7D, 7E which is attributed to the etching step can be suppressed.

Then, as shown in FIG. 33 and FIGS. 34(a) to 34(c), a protection film (passivation film) 11, an organic insulating film 13 of a photosensitive resin or the like, and an upper electrically-conductive layer 17 are formed on the source wire layer and the metal oxide layers 7D, 7E. First, the protection film 11 and the organic insulating film 13 are formed in this order in the same way as that of the previously-described embodiments. Then, an opening is formed in part of the organic insulating film 13 extending over the gate-source contact portion formation region R(30). Thereafter, etching is performed on the passivation film 11 using the organic insulating film 13 as a mask. Thereby, a contact hole 15 is obtained through which the gate connecting portion 3sg and the source connecting portion 9sg are exposed. Then, an electrically-conductive film is formed in the contact hole 15 and on the organic insulating film 13 and then patterned. Thereby, an upper electrically-conductive layer 17 is obtained which is electrically connected with the source connecting portion 9sg in the contact hole 15. The material, thickness, and formation method of the protection film 11, the organic insulating film 13 and the electrically-conductive film are the same as those of the previously-described embodiments. In this way, an active matrix substrate 1004 is obtained.

The memory transistors 10D, 10E of the present embodiment have a bottom contact structure which is configured to be in contact with the source and drain electrodes at the lower surfaces of the active layers 7A, 7B. Such a structure has the following advantages over a transistor which has a channel-etch structure.

In the present embodiment, the metal oxide layers 7D, 7E are formed after the etching step of the electrically-conductive film for the source for separation of the source and the drain. Therefore, damage to the channel regions 7cD, 7cE which is caused by the etching can be reduced as compared with a thin film transistor which has a channel-etch structure. Thus, variation of the electric characteristics of the memory transistors 10D, 10E can be improved. Further, the magnitude of the variation of the electric characteristics which is attributed to the electrical stress can be reduced.

Further, in the present embodiment, the manufacturing process is simplified as compared with an example of the second embodiment which has the etch stop structure. Therefore, advantageously, the manufacturing cost can be reduced, and the yield can be improved.

Note that the operation and the electric characteristics of the memory transistors 10C to 10E in the second and third embodiments are the same as those described in the first embodiment. These embodiments are also widely applicable not only to active matrix substrates but also to electronic devices which include a memory circuit, such as an integrated circuit, as is the first embodiment.

Although in the previously-described embodiments bottom gate type thin film transistors are used as the memory transistors 10A to 10E, they may be top gate type thin film transistors.

FIGS. 36(b) and 36(c) are cross-sectional views illustrating the configuration of top gate type memory transistors. In the example shown in FIG. 36(b), the memory transistor has the same configuration as that of the memory transistors 10D, 10E shown in FIG. 34 except that the gate electrode 3 is provided above the metal oxide layer 7. In the example shown in FIG. 36(c), the memory transistor has the same configuration as that of the memory transistor shown in FIG. 36(a) except that the order of stacking the first metal film 9L and the second metal film 9U is changed.

In the semiconductor device of the present embodiment, a writing operation in the memory transistor 10A is realized by Joule heat produced in the metal oxide layer 7A. The temperature of the channel region 7cA during the writing operation is, for example, not less than 200° C. There is a probability that the temperature is still higher on the drain side of the channel region 7cA (for example, not less than 250° C., or not less than 300° C.). Therefore, it is preferred that a layer of a low heat resistance material (softening temperature: less than 200° C., preferably less than 300° C.), for example, an organic insulating film, is not provided above the metal oxide layer 7A of the memory transistor 10A. Hereinafter, more specific description is provided with an example of an active matrix substrate.

In the active matrix substrates 1002 to 1004, the memory transistors 10A to 10E are covered with the passivation film 11 and the organic insulating film 13. If this organic insulating film 13 has low heat resistance, there is a probability that, in some writing conditions, part of the organic insulating film 13 lying above the metal oxide layer peels off from the passivation film 11 or deforms. Particularly, peeling or deformation can occur on an edge of the organic insulating film 13 on the drain side of the metal oxide layer. If peeling or deformation of the organic insulating film 13 occurs, for example, in the case where a memory array is formed using a plurality of memory transistors, there is a probability that a written memory transistor RT and an unwritten memory transistor ST are distinguished by the position of peeling or deformation of the organic insulating film 13.

Figure 35:
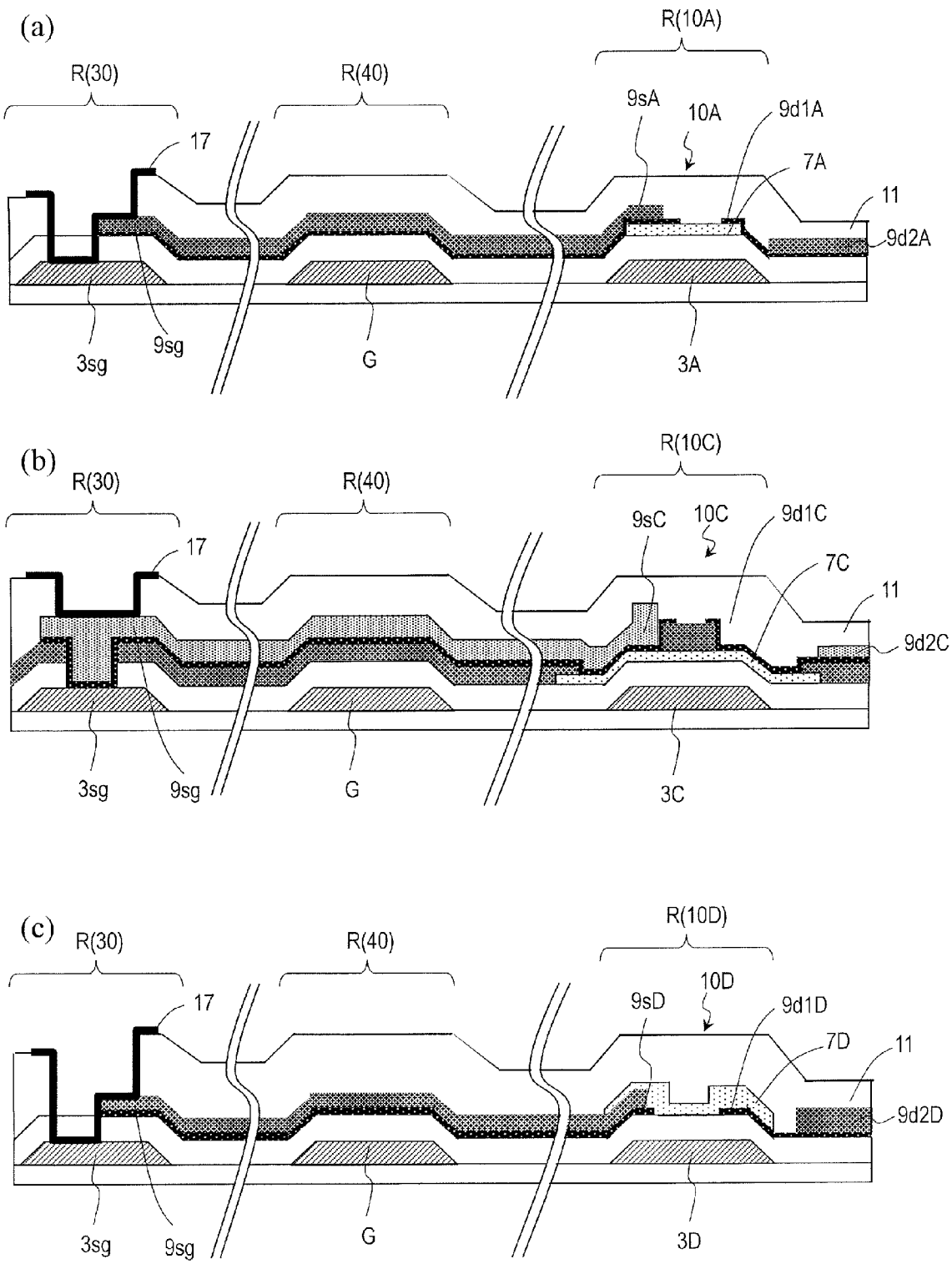
FIG. 35(*a*) to (*c*) are a plan view and cross-sectional views illustrating the configuration of another memory transistor in an embodiment of the present invention.

In view of such, as illustrated in FIGS. 35(a) to 35(c), an inorganic insulating film of relatively high heat resistance (the silicon oxide film listed above or the like) may be provided as the passivation film 11 above the metal oxide layer 7A, and the organic insulating film 13 may not be provided on the passivation film 11. Due to this arrangement, the above-described problem which is attributed to the heat produced during writing would not arise, and therefore, the reliability and security of the device can be improved.

An active matrix substrate illustrated in FIGS. 35(a) to 35(c) may not include an organic insulating film as the flattening film. Alternatively, the active matrix substrate may include the organic insulating film 13 only in part of the substrate 1. In this case, it is only necessary that the organic insulating film 13 is not provided at least above the metal oxide layer 7A, 7C, 7D of the memory transistor 10A, 10C, 10D. For example, the organic insulating film 13 may be provided above the metal oxide layer of the pixel transistor and the circuit constituent transistor.

Figure 5:
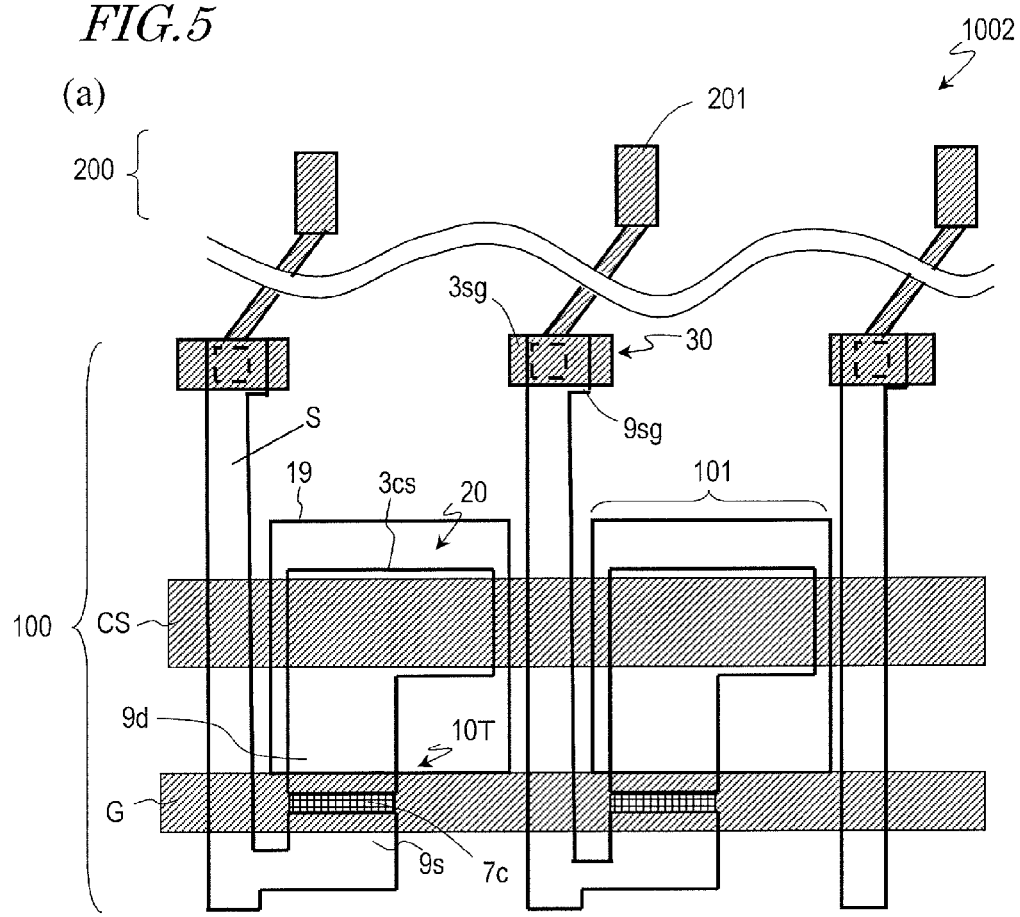
FIG. 5(a) is a plan view illustrating an active matrix substrate 1002 of the first embodiment. (b) is a cross-sectional view illustrating a pixel transistor 10T in the active matrix substrate 1002. (c) is a cross-sectional view illustrating a display device 2001 in which the active matrix substrate 1002 is used.
Figure 5:
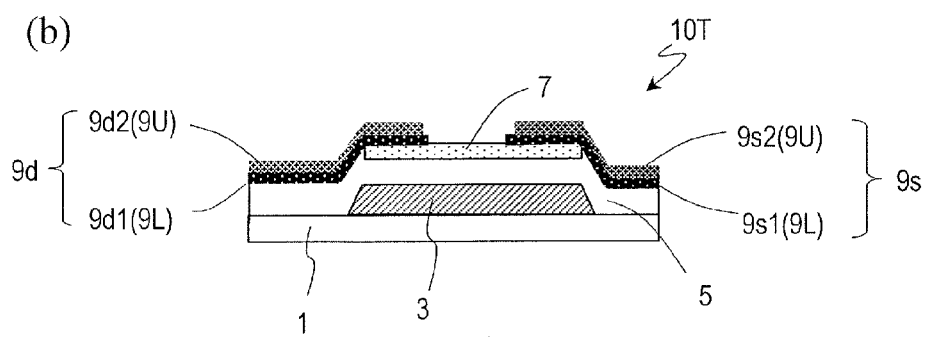
Figure 5:
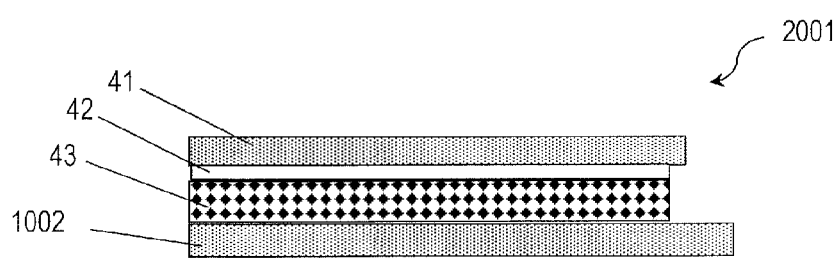

In the active matrix substrate 1002 illustrated in FIG. 5, the organic insulating film 13 is provided above a plurality of pixel transistors 10T and may not be provided above the memory transistor 10A inside the memory circuit. For example, the organic insulating film 13 is provided in the display region 100 and may not be provided in the peripheral region 200 (at least part of the peripheral region 200 overlying the memory circuit).

Note that, in the active matrix substrates 1002 to 1004, the above-described problem which is attributed to the heat produced during writing can be suppressed even when a flattening film of a high heat resistance material (for example, softening temperature: not less than 200° C., preferably not less than 300° C.) is used instead of the organic insulating film 13. For example, an inorganic insulating film, such as an inorganic SOG (spin on glass) film, may be used as the flattening film.

Although in each of the above-described embodiments the memory transistors 10A, 10B are thin film transistors, they may be MOS type transistors. Even in MOS type transistors, transition to the resistor state can be realized by allowing a drain current of a high current density to flow through the channel region. The MOS type transistor has a configuration where, for example, a metal oxide semiconductor film is provided on a silicon substrate with an insulating film interposed therebetween. In such a configuration, a silicon substrate of high heat radiation is used, but the silicon substrate and the oxide semiconductor film are separated by the insulating film, and therefore, transfer of the Joule heat produced by the writing current to the silicon substrate can be suppressed. Thus, the resistance of the oxide semiconductor film can be reduced by the Joule heat.

The material, configuration, thickness, transistor characteristics, and writing characteristics of the electrically-conductive films and insulating films which are constituents of the memory transistors 10A to 10E are not limited to those described in the above-described embodiments.

Although the above embodiments are described with examples of semiconductor devices which include n-channel type memory transistors 10A to 10E, the conductivity type of the memory transistors is not limited to the n-channel type but may be the p-channel type. In the case of a p-channel type memory transistor, drain current Ids flows from the source to the drain. Even in the case of a p-channel type memory transistor, damage which is caused by heat produced during writing can be suppressed by applying the electrode configurations of the above-described embodiments.

INDUSTRIAL APPLICABILITY

The present invention is applicable to a wide variety of semiconductor devices and electronic devices which include a memory circuit. For example, it is applicable to nonvolatile semiconductor storage devices, integrated circuits (IC, LSI), various display devices, such as liquid crystal display devices and organic EL display devices, and active matrix substrates for use in various display devices.

REFERENCE SIGNS LIST 1 substrate
3 gate electrode
3sg gate connecting portion
5 gate insulating film
7 metal oxide layer
7c channel region
9d drain electrode
9d1, 9d2 drain metal layer
9s source electrode
9s1, 9s2 source metal layer
9L first metal film
9U second metal film
9cs capacitance electrode
9sg source connecting portion
10A-10E memory transistor
10T pixel transistor
11 protection film (passivation film)
13 organic insulating film
15 contact hole
17 upper electrically-conductive layer
18 upper gate electrode
19 pixel electrode
20 capacitance portion
30 source contact portion
31 protection layer
40 source intersection
100 display region
101 pixel
200 peripheral region
201 terminal portion
1001 semiconductor device
1002, 1003, 1004 active matrix substrate
CS capacitance wire
G gate wire
S source wire

The invention claimed is:

1. A semiconductor device comprising a substrate and at least one memory transistor supported on the substrate, wherein
the at least one memory transistor is a memory transistor which is capable of being irreversibly changed from a semiconductor state where a drain current Ids depends on a gate voltage Vg to a resistor state where the drain current Ids does not depend on the gate voltage Vg,
the at least one memory transistor includes a gate electrode, a metal oxide layer, a gate insulating film provided between the gate electrode and the metal oxide layer, and a source electrode and a drain electrode which are electrically connected with the metal oxide layer,
the drain electrode has a multilayer structure which includes a first drain metal layer and a second drain metal layer, the first drain metal layer being made of a first metal whose melting point is not less than 1200° C., the second drain metal layer being made of a second metal whose melting point is lower than that of the first metal,
when viewed in a direction normal to a surface of the substrate, a part of the drain electrode extends over both the metal oxide layer and the gate electrode, and
the part of the drain electrode includes the first drain metal layer and does not include the second drain metal layer.

2. The semiconductor device of claim 1, wherein
the source electrode has a multilayer structure which includes a first source metal layer and a second source metal layer, the first source metal layer including the first metal, the second source metal layer including the second metal, and
a part of the source electrode extends over both the metal oxide layer and the gate electrode when viewed in a direction normal to a surface of the substrate, and the part of the source electrode includes the first source metal layer and the second source metal layer.

3. The semiconductor device of claim 1, wherein
the source electrode has a multilayer structure which includes a first source metal layer and a second source metal layer, the first source metal layer including the first metal, the second source metal layer including the second metal, and
a part of the source electrode extends over both the metal oxide layer and the gate electrode when viewed in a direction normal to a surface of the substrate, and the part of the source electrode includes the first source metal layer and does not include the second source metal layer.

4. The semiconductor device of any of claim 1, wherein the first drain metal layer is in direct contact with an upper surface of the metal oxide layer.

5. The semiconductor device of any of claim 1, wherein the first drain metal layer is in direct contact with a lower surface of the metal oxide layer.

6. The semiconductor device of claim 1, wherein the gate electrode is located on the substrate side of the metal oxide layer.

7. The semiconductor device of claim 1, wherein the first drain metal layer and the second drain metal layer are stacked in this order from the substrate side.

8. The semiconductor device of claim 1, wherein, when viewed in a direction normal to the substrate, a part of the metal oxide layer which extends over the gate electrode with the gate insulating film interposed therebetween and which is present between the source electrode and the drain electrode has a U-shape.

9. The semiconductor device of claim 1, wherein the first metal is a metal selected from the group consisting of W, Ta, Ti, Mo and Cr or an alloy thereof.

10. The semiconductor device of claim 1, wherein the melting point of the second metal is less than 1200° C.

11. The semiconductor device of claim 1, wherein the second metal is a metal selected from the group consisting of Al and Cu.

12. The semiconductor device of claim 1, wherein the metal oxide layer includes In, Ga and Zn.

13. The semiconductor device of claim 12, wherein the metal oxide layer includes a crystalline portion.

14. The semiconductor device of claim 1, wherein the at least one memory transistor is a plurality of memory transistors, the plurality of memory transistors including a memory transistor ST which is in the semiconductor state and a memory transistor RT which is in the resistor state.

15. The semiconductor device of claim 1, further comprising another transistor supported on the substrate, the another transistor including a semiconductor layer which includes a metal oxide, wherein
the semiconductor layer of the another transistor and the metal oxide layer of the memory transistor are formed by a same oxide semiconductor film,
a source electrode and a drain electrode of the another transistor has a multilayer structure which includes a first metal layer and a second metal layer, the first metal layer including the first metal, the second metal layer including the second metal, and
a part of the drain electrode of the another transistor extends over both a gate electrode of the another transistor and the metal oxide layer when viewed in a direction normal to a surface of the substrate, and the part of the drain electrode of the another transistor includes the first metal layer and the second metal layer.

16. The semiconductor device of claim 1, wherein
the semiconductor device is an active matrix substrate, the active matrix substrate including
a display region including a plurality of pixel electrodes and pixel transistors electrically connected with corresponding ones of the plurality of pixel electrodes, and
a peripheral region provided in a region which is exclusive of the display region, the peripheral region including a plurality of circuits,
the plurality of circuits includes a memory circuit which includes the at least one memory transistor, and
the pixel transistor and at least one of a plurality of transistors which are constituents of the plurality of circuits in the peripheral region include a semiconductor layer formed using a same oxide semiconductor film as that of the metal oxide layer of the at least one memory transistor.

* * * * *